United States Patent [19]

Wong et al.

[11] Patent Number: 5,687,115
[45] Date of Patent: Nov. 11, 1997

[54] WRITE CIRCUITS FOR ANALOG MEMORY

[75] Inventors: Sau C. Wong, Hillsborough; Hock C. So, Redwood City, both of Calif.

[73] Assignee: inVoice Technology, Inc., Sunnyvale, Calif.

[21] Appl. No.: 583,905

[22] Filed: Jan. 11, 1996

Related U.S. Application Data

[62] Division of Ser. No. 333,381, Nov. 2, 1994.

[51] Int. Cl.$^6$ .................................................. G11C 16/06
[52] U.S. Cl. ..................... 365/185.03; 365/185.22; 365/185.11; 365/185.23; 365/185.21
[58] Field of Search ..................... 365/185.03, 185.23, 365/185.22, 189.11, 185.21

[56] References Cited

U.S. PATENT DOCUMENTS

| | | | |
|---|---|---|---|
| H1035 | 3/1992 | Haviland et al. | 365/185.03 |
| 4,054,864 | 10/1977 | Audaire et al. | 340/173 |
| 4,057,788 | 11/1977 | Sage | 365/185.03 |
| 4,181,980 | 1/1980 | McCoy | 365/45 |
| 4,200,841 | 4/1980 | Nagata et al. | 365/185.19 |

(List continued on next page.)

OTHER PUBLICATIONS

Ajika et al, "A 5 Volt Only 16M Bit Flash EEProm Cell With a Simple Stacked Gate Structure", *IEDM Tech. Dig.*, 1990, pp. 115–118.

Chen et al, "Subbreakdown Drain Leakage Current in MOS-FET", IEEE, 1987, pp. 515–517.

Dov Frohman–Bentchkowsky, "A Fully Decoded 2048–Bit Electrically Programmable FAMOS Read–Only Memory", 1971, *IEEE J. of Solid-State Circuits*, vol. SC–6, No. 5, pp. 63–68.

Lenzinger et al, "Fowler–Nordheim Tunneling into Thermally Grown SiO$_2$," Journal of Applied Physics, 1969, vol. 40, No. 1, pp. 278–283.

(List continued on next page.)

*Primary Examiner*—Joseph E. Clawson, Jr.
*Attorney, Agent, or Firm*—Skjerven, Morrill, MacPherson, Franklin & Friel; David T. Millers

[57] ABSTRACT

Circuits and processes write and read analog signals in non-volatile memory cells such as EPROM and flash EPROM cells. One write circuit to a control gate of a memory cell a voltage which after a long write time would saturate the threshold voltage of the memory cell near a target threshold voltage being written. One such write circuit includes a voltage shifter which generates the voltage to be applied to the control gate of the memory cell from an analog voltage representing a value to be written in the memory cell. A verify feedback circuit terminates the write when the target threshold voltage is reached. The write circuit uses variable write pulse widths, voltages, and load-line resistances to reduce write time and further improve control of writing. The fast write time of EPROM and flash EPROM cells simplifies control of write processes and therefore reduces chip size and cost in applications such as sound recording. Reading a memory cell's threshold voltage uses substantially the same circuit as used in the verify feedback during a write. One read process determines a memory cell's threshold voltage by slowly ramping the control gate voltage and sensing when the cell conducts. Read and write processes disclosed also apply to binary memory cells, multi-level digital memory cells, and other applications which require precise reading or writing of threshold voltages.

19 Claims, 63 Drawing Sheets

U.S. PATENT DOCUMENTS

| | | | |
|---|---|---|---|
| 4,318,188 | 3/1982 | Hoffman | 360/32 |
| 4,627,027 | 12/1986 | Rai et al. | 365/45 |
| 4,852,063 | 7/1989 | McNutt | 35/185.03 |
| 4,890,259 | 12/1989 | Simko | 365/45 |
| 4,935,702 | 6/1990 | Mead et al. | 365/185.03 |
| 4,989,179 | 1/1991 | Simko | 365/45 |
| 5,028,810 | 7/1991 | Castro et al. | |
| 5,055,897 | 10/1991 | Canepa et al. | 365/185.03 |
| 5,095,344 | 3/1992 | Harari | 365/185.03 |
| 5,126,967 | 6/1992 | Simko | 365/45 |
| 5,163,021 | 11/1992 | Mehrotra et al. | 365/185 |
| 5,164,915 | 11/1992 | Blyth | 365/45 |
| 5,168,465 | 12/1992 | Harari | 365/185.22 |
| 5,172,338 | 12/1992 | Mehrotra et al. | 365/185 |
| 5,218,569 | 6/1993 | Banks | 365/189 |
| 5,220,531 | 6/1993 | Blyth et al. | 365/189 |
| 5,239,500 | 8/1993 | Oguey | 365/185.21 |
| 5,241,494 | 8/1993 | Blyth et al. | 365/45 |
| 5,243,239 | 9/1993 | Khan et al. | 307/521 |
| 5,262,984 | 11/1993 | Noguchi et al. | 365/185.21 |
| 5,272,669 | 12/1993 | Samachisa et al. | 365/185.03 |
| 5,294,819 | 3/1994 | Simko | 257/314 |
| 5,339,270 | 8/1994 | Jiang | 365/185.22 |
| 5,394,362 | 2/1995 | Banks | 365/185.22 |
| 5,430,670 | 7/1995 | Rosenthal | 365/185.21 |
| 5,499,209 | 3/1996 | Oowaki et al. | 365/189.11 |

OTHER PUBLICATIONS

Haddad et al, "Degradations Due to Hole Trapping in Flash Memory Cells", 1989, IEEE Electron Device Lett., vol. 10, No. 3, pp. 117–119.

Hoe et al, "Cell and Circuit Design for Single–Poly EPROM", IEEE Journal of Solid–State Circuits, vol. 24, No. 4, Aug. 1989, pp. 1153–1157.

Johnson et al, "A 16Kb Electrically Erasable Nonvolatile Memory", IEEE ISSCC, Dig. Tech. Pap. 1980, pp. 125–127.

Kamiya et al, "EPROM Cell with High Gate Injection Efficiency", IEDM Tech. Dig. 1982 (reprint) pp. 741–744.

Kazerounian et al, "A 5 Volt High Density Poly–Poly Erase Flash EPROM Cell", IEDM Tech. Dig., 1988 (reprint) pp. 202–205.

Kynett et al, "An In–System Reprogrammable 32Kx8 CMOS Flash Memory", IEEE J. Solid–State Circuits, vol. 23, No. 5. Oct. 1988 (reprint), pp. 170–175.

Naruke et al, "A New Flash–Erase EEPROM Cell With a Sidewall Select–Gate on Its Source Side", IEDM Tech. Dig., 1989 (reprint) pp. 183–186.

Perlegos et al, "A 64K EPROM Using Scaled MOS Technology", IEEE ISSCC Dig. Tech. Pap., 1980 (reprint) pp. 69–71.

Wu et al, "A Novel High–Speed, 5–Volt Programming EPROM Structure with Source–Side Injection", IEDM Tech. Dig., 1986 (reprint) pp. 108–111.

Press Release: Intel Announces Multilevel Cell Flash Technology, Intel Corporation, 1994, 3 pages.

"Solutions OEM," A Publication of Intel Corporation, vol. 2, No. 2, (Autumn) Sep., 1994, pp. 1–8.

Multiple Short Write Pulses

Long Write Pulse with Equivalent Write Time

WRITE CIRCUITS FOR ANALOG MEMORY

This application is a division of application Ser. No. 08/333,381, filed Nov. 2, 1994.

BACKGROUND OF THE INVENTION

1. Field of the Invention

This invention relates to systems and processes for writing and reading analog or multilevel digital signals in a non-volatile semiconductor memory cell.

2. Description of Related Art

Common types of non-volatile memory, such as EPROM (Electrically Programmable Read Only Memory), EEPROM (Electrically Erasable Programmable Read Only Memory), and flash memory use charge on a memory cell's floating gate to control the threshold voltage of the memory cell and indicate the state of the cell. Typically, binary memory cells have two states, one indicated by a high threshold voltage and one indicated by a low threshold voltage. Gathering electrons on a memory cell's floating gate increases the cell's threshold voltage and is referred to as writing or programming the memory cell. Erasing a memory cell removes electrons from the floating gate and reduces the threshold voltage.

EPROM is more than 20 years old and is popular for program storage because EPROM is inexpensive, is non-volatile, and allows code updates using an EPROM programmer system. FIG. 1a shows a conventional stacked-gate EPROM cell 150 which stores charge on a polysilicon floating gate 156 which is buried between an oxide layer 154 and an interpoly oxide layer 157. A control gate 158 capacitively couples to floating gate 156, and changing the voltage on control gate 158 changes the voltage on floating gate 156 which in turn controls current in a channel 160 between a source 162 and a drain 164 in a substrate 152.

Channel Hot Electron (CHE) injection injects energetic (or "hot") electrons from channel 160 into floating gate 156 during writing of EPROM cell 150. CHE injection requires a high voltage at drain 164 to produce hot electrons in channel 160 and a high voltage at control gate 158 to attract electrons into floating gate 156. Typically, an EPROM cell such as memory cell 150 starts with a threshold voltage at an erased or "virgin" level of about 1.5 volts and writing raises the cell's threshold voltage to over 5 volts. EPROM cell 150 is erased by exposure to ultraviolet light for an extended time (typically thirty minutes or longer) which removes electrons from floating gate 156 and returns the threshold voltage of EPROM cell 150 to the virgin level.

EEPROM is electrically erased. FIG. 1b shows a typical EEPROM cell 170 which consists of a floating gate transistor 172 and a separately defined tunneling diode area 174. EEPROM cell 170 also includes a select transistor 175. Writing and erasing of EEPROM rely on Fowler-Nordheim tunneling (FNT) mechanism to add or remove electrons from a floating gate 176.

The terminology "flash" comes from the ability to simultaneously electrically erase an entire memory array or a large portion of the memory array in a flash. Flash memories include flash EPROM and flash EEPROM and typically are erased by FNT. Flash EPROM, like EPROM, uses CHE injection for writing. In contrast, flash EEPROM, like conventional EEPROM, relies on FNT for writing.

FIG. 1c shows a conventional N-channel stacked gate flash EPROM cell 100. Flash EPROM cell 100 includes a polysilicon control gate or word line 102 overlying a polysilicon floating gate 101. A high-integrity gate oxide 106, typically less than 100 Å thick, isolates floating gate 101 from an N+ source 103, an N+ drain 104, and a channel 105 formed in a P-type substrate 108. A thin insulator 107 separates control gate 102 and floating gate 101 to provide a high capacitive coupling ratio between control gate 102 and floating gate 101. During a conventional write of flash EPROM cell 100, control gate 102 is raised to about 12 volts, drain 104 is raised to about 5 volts or higher, and source 103 is grounded. At these voltages, hot electrons from current in a portion of channel 105 near drain 104 pass through gate oxide 106 into floating gate 101.

A typical source-side erase of memory cell 100 raises source 103 to a voltage of about 12 volts, grounds control gate 102, and permits drain 104 to float. Electrons from floating gate 101 tunnel through gate oxide 106 into source 103. When a large block of flash EPROM cells are simultaneously source-side erased, a combined band-to-band tunneling current can add up to more than 10 mA, which is beyond the capability of a typical on-chip high-voltage charge-pump circuit that provides 12 volts at source 103. To reduce the band-to-band tunneling current, to increase the gate-aided junction breakdown voltage at the source junction, and to provide a direct tunneling area between the source 103 and the floating gate 101, source 103 is typically deeper in substrate 108 than is drain 104. A deeper source 103 reduces the electric field at the curvature of the junction between source 103 and channel 105, which allows a higher voltage at source 103 during an erase. For certain applications such as audio recording, the band-to-band tunneling current can be further reduced by limiting the number of memory cells within each block to be simultaneously erased.

An alternative erase operation referred to as negative-gate erase, typically requires a negative 12 volts on control gate 102 while source 103 is grounded or at a 5-volt potential. A negative-gate erase allows a power supply, instead of an on-chip high-voltage charge-pump, to provide the band-to-band tunneling current during the erase.

FIG. 1d shows a split gate flash EPROM cell where a control gate 111 overlaps a floating gate 112 and effectively forms the gate of a pass transistor in series with a stacked gate transistor. Split gate cell 110 is typically not self-aligned and is larger than a stacked gate cell such as shown in FIG. 1c. However, the pass transistor makes cell 110 less susceptible to over-erasure. FIG. 1e shows a top view of split gate cell 110 which has a separate erase gate 113 (not shown in FIG. 1d). Erasing memory cell 110 typically relies on floating gate to erase gate tunneling or field emission due to asperities.

FIG. 1f shows a sectional view of what is commonly referred to as a high injection efficiency flash EPROM cell 120. For source-side injection, a polysilicon select gate 121 modulates an enhancement transistor having a channel 124 near source 103 and in series with a stacked gate transistor having a channel 126 modulated by floating gate 123 and control gate 122. Biasing select gate 121 near the enhancement transistor's threshold voltage and control gate 122 at about 12 volts, creates a large surface potential in a weak gate-controlled channel region 125 located between the two transistors. The large surface potential provides a high injection efficiency of hot electrons near source 103. A key advantage of this scheme is a substantial reduction in write current which allows the use of an on-chip high-voltage charge-pump for writing. Erasure relies on either drain-side injection using FNT or a polysilicon-to-polysilicon erase similar to the split gate cell as described in connection with FIG. 1d.

FIG. 1g shows a perspective view of a flash EPROM cell 130 having a single polysilicon layer which forms a floating gate 131. Diffusion or buried diffusion forms a source 133, a drain 134, and a channel 135 in a substrate 108 and a control gate 132 in substrate 108 underlying floating gate 131. Source 133 and drain 134 are separated from control gate 132 by a field oxide region 136. The single polysilicon process for fabricating memory cell 130 is simpler than double or triple polysilicon processes used for memory cells 100, 110, and 120 and is compatible to other ASIC technologies. A disadvantage of memory cell 130 is a large cell size. Memory cell 130 is attractive for applications requiring a small number of memory cells and a single polysilicon layer.

The above-described prior art memory cells are typically used in applications where the threshold voltage of a memory cell indicates one of two binary states of the cell (i.e. a single bit of information). Storing more information in each cell would increase storage capacity of an array. However, writing more than two distinguishable levels in a memory cell requires precise control of writing threshold voltage. Most schemes for writing multi-level threshold voltages in non-volatile memory have used EEPROM and relied on the long write times required for FNT to allow control of writing of threshold voltages. For flash EPROMD which use the much faster CHE injection for writing, the prior art has not provided adequate control to permit accurate writing of analog signals. Reading the threshold voltage also requires precision not provided or required by memory arrays containing binary memory cells.

SUMMARY OF THE INVENTION

In accordance with this invention, non-volatile memory such as EPROMs, flash EPROMs, and EEPROMs store analog signals. An analog signal is written using circuits and processes which precisely set the threshold voltage of a non-volatile memory cell to a target level which indicates the analog signal. Selecting either or both of the control gate voltage and the drain voltage of a memory cell to depend on an analog signal, using short write pulses, and using verify cycles which monitor the threshold voltage between write pulses allow precise control of the threshold voltage written. In particular, selecting the control gate voltage during CHE injection determines a saturation value for the threshold voltage of the memory cell, and the saturation value can be set near a target level to be written. This provides a write time that is nearly independent of the analog signal written and is sufficient to precisely control CHE injection in EPROM and flash EPROM. Precise read circuits and techniques allow accurate measurement of the threshold voltage of a memory cell (or any field effect transistor), and the threshold voltage measurement can then be converted into an output voltage that reproduces the analog signal stored.

Analog signals stored include but are not limited to sampled sound, voice, music, video, light intensity, pressure, vibration, speed, calibration data, and precision trimming voltages for analog circuits. Conventional multi-bit digital information can also be converted to an analog signal and then stored in a single memory cell. Each memory cell in an analog memory in accordance with this invention stores the equivalent of many bits of information. Accordingly, memories in accordance with this invention are substantially smaller than conventional digital memories of the same storage capacity. For example, an analog memory cell having a 5-volt range of threshold voltages with a threshold voltage resolution of 1 mV provides about 5,000 distinguishable levels, enough to store the equivalent of more than twelve bits of digital information. A threshold voltage resolution of 10 mV provides about 500 distinguishable levels and stores the equivalent of more than eight bits of information. Accordingly, one analog memory cell can replace many conventional binary memory cells, and greatly reduce the size and cost of memory.

In audio systems, memories in accordance with this invention have further advantages over digital memories which require analog-to-digital converters (ADCs) and digital-to-analog converters (DACs) for input and output of analog signals. Analog EPROM and flash EPROM eliminate the need (and cost) of ADCs and DACs and eliminate the distortion caused by analog-to-digital and digital-to-analog conversions.

The precision control of threshold voltages provided by this invention is also suitable for applications other than analog signal storage. For example, precisely controlled writing in a conventional digital memory can prevent over-writing which degrades the reliability and endurance of the memory. Precise control is also important in writing a desired target threshold voltage in a multi-level digital memory cell, although multi-level digital memory does not usually require as fine a resolution as analog memory. Read and write processes in accordance with this invention can also increase the number of states of a memory cell beyond the number that can be consistently distinguished to provide maximum information storage in an error-tolerant application.

One write circuit in accordance with an embodiment of this invention provides a control gate write voltage which depends upon an analog signal being written to a selected memory. For conventional floating gate memory cells written by CHE injection, the rate of change in the threshold voltage drops substantially when, during a write, the threshold voltage of the memory cell nears a saturation threshold voltage. The saturation threshold voltage depends on the control gate voltage during the write. In accordance with an embodiment of this invention, the control gate voltage for the write is selected so that the saturation threshold voltage is near a target threshold voltage which corresponds to the analog signal being written. Accordingly, the rate of change in the threshold voltage is slow near the target threshold voltage, and the threshold voltage can be precisely controlled. This solves the problem of the write speed of CHE injection in EPROM and flash EPROM being too fast for precise writing of threshold voltages.

The drain voltage applied to the selected memory cell during a write can also be selected to depend on the analog signal being written or on the control gate voltage. The drain voltage can be controlled by a variable loadline pull-up device coupled to the drain of the memory cell being written. The drain voltage can also be asserted as write pulses.

Additionally, write pulses and verify cycles can be interwoven during a write of a selected memory cell. The write pulses apply voltages which increase the threshold voltage of the selected memory cell. In one embodiment, the target threshold voltage equals the analog signal being written, and the verify cycles assert the analog signal to the control gate of the selected memory cell and then determine if the selected memory cell conducts. Alternatively, verify cycles are used to read the selected memory cell and determine if the threshold voltage indicates the analog signal being written. When the threshold voltage reaches the target, writing is terminated by stopping further write pulses or stopping channel current.

A read circuit in accordance with an embodiment of this invention slowly changes or ramps a control gate voltage asserted to a selected memory cell and then samples and holds the control gate voltage when the selected memory cell first conducts. The sampled control gate voltage equals the threshold voltage of the selected memory cell and either equals or can be converted to a voltage which equals the analog signal stored in the selected memory cell.

Another read circuit in accordance with an embodiment of the invention employs a source follower technique which biases the source and the control gate of a selected memory cell high during a read. The drain of the selected cell is connected to ground through a high impedance load. Slowly ramping the source voltage keeps current through the selected cell low and prevents a threshold voltage disturb during the read. The voltage on the drain of the selected cell follows the source voltage until reaching the control gate voltage minus the threshold voltage of the selected cell, and then the selected cell stops conducting which prevents the voltage on the drain from rising further. Accordingly, after a fixed time, the drain voltage indicates the threshold voltage of the selected cell. The high impedance load bleeds off any excess charge that may accumulate on the drain as a result of a fluctuation in the supply voltage.

In accordance with another embodiment of this invention, a selected memory cell is read and compared to a value read from a reference cell. The reference cell is structurally identical to the memory cell and stores a predetermined value. A difference signal generated from the values read from the selected memory cell and the reference cell indicates the threshold voltage of the selected cell and is less dependent upon temperature, supply voltage fluctuations, cell features, and other common mode variations. Reference cells can also control the read and write currents to further reduce the effects that common mode variations such as variations in temperature, supply voltage, and cell features have on stored analog values.

The read circuits in accordance with the above embodiments are applicable to reading the threshold voltages of conventional floating gate memory cells such as EPROM, EEPROM, flash EPROM, and flash EEPROM cells, conventional non-floating gate memory cells such as ROM cells, and conventional MOS transistors.

BRIEF DESCRIPTION OF THE DRAWINGS

FIG. 6b is a plot relating input analog signals to saturation threshold voltages produced by voltages from the voltage shifter of FIG. 6a.

FIG. 7b is a plot relating input analog signals to saturation threshold voltages produced by voltages from the voltage shifter of FIG. 7a.

FIG. 7c is a schematic drawing of a control circuit and a high-voltage charge-pump which track the intrinsic memory cell current and supplies power to the voltage shifters of FIGS. 6a and 7a.

FIG. 16b shows waveforms for the embodiment of FIG. 16a.

FIG. 19b shows plots of current versus output voltage for the memory cell and resistor of FIG. 19a.

FIG. 20b is a timing diagram of a read process for the read circuit of FIG. 20a.

FIG. 21b illustrates an example of a read path in the embodiment of FIG. 21a.

Use of the same reference symbols in different figures indicates similar or identical elements.

DETAILED DESCRIPTION OF THE PREFERRED EMBODIMENTS

In accordance with an embodiment of this invention, an analog signal is accurately written and stored into an EPROM or flash EPROM cell by precisely monitoring and controlling the injection of electrons into the memory cell's floating gate. Precise control of the number of electrons on the floating gate precisely controls the threshold voltage and conductivity of the memory cell. During a read, of the memory cell, a read circuit reproduces the stored analog signal from the cell's conductivity or threshold voltage.

Figure 1A:
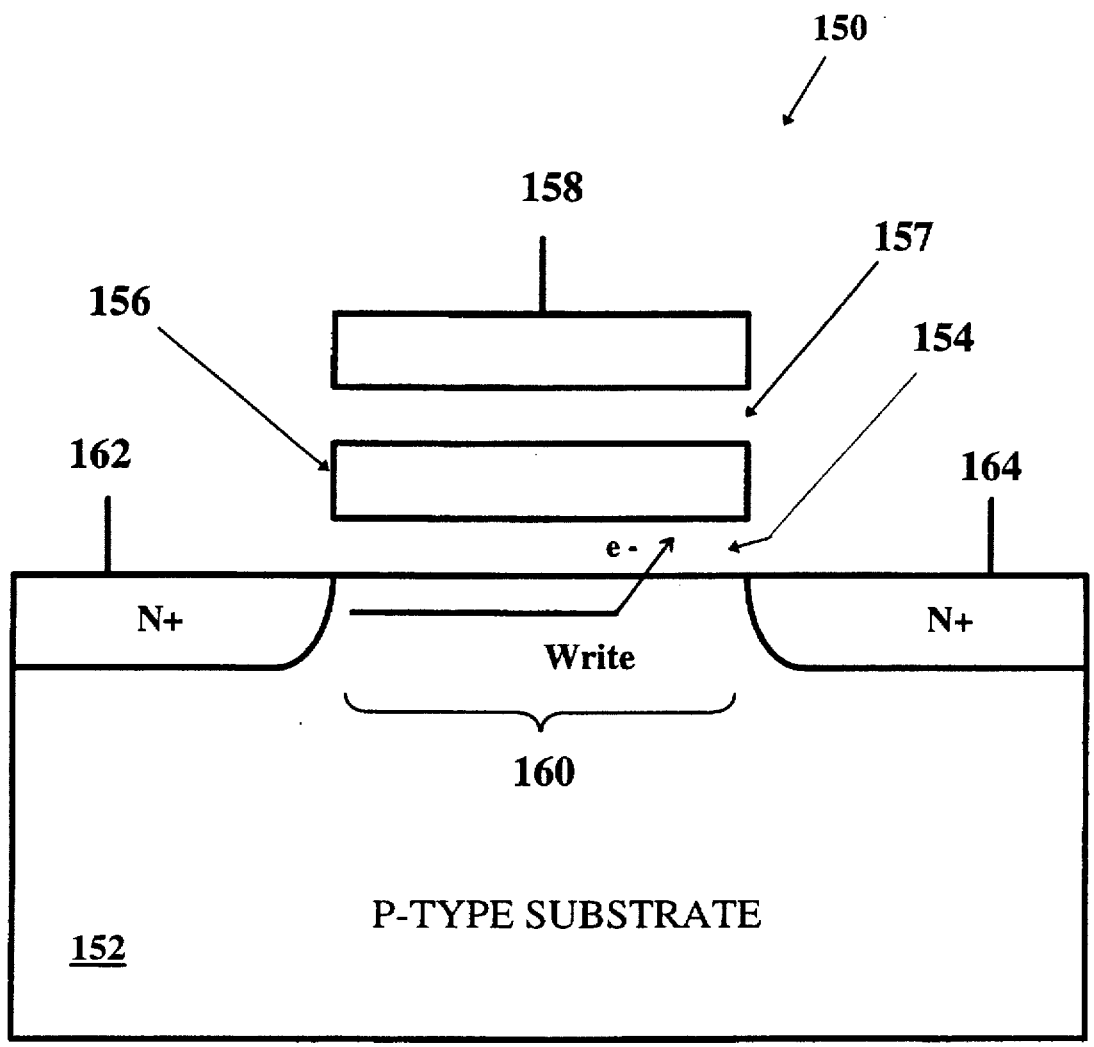
FIG. 1a shows a cross-sectional view of a prior art EPROM cell.
Figure 1B:
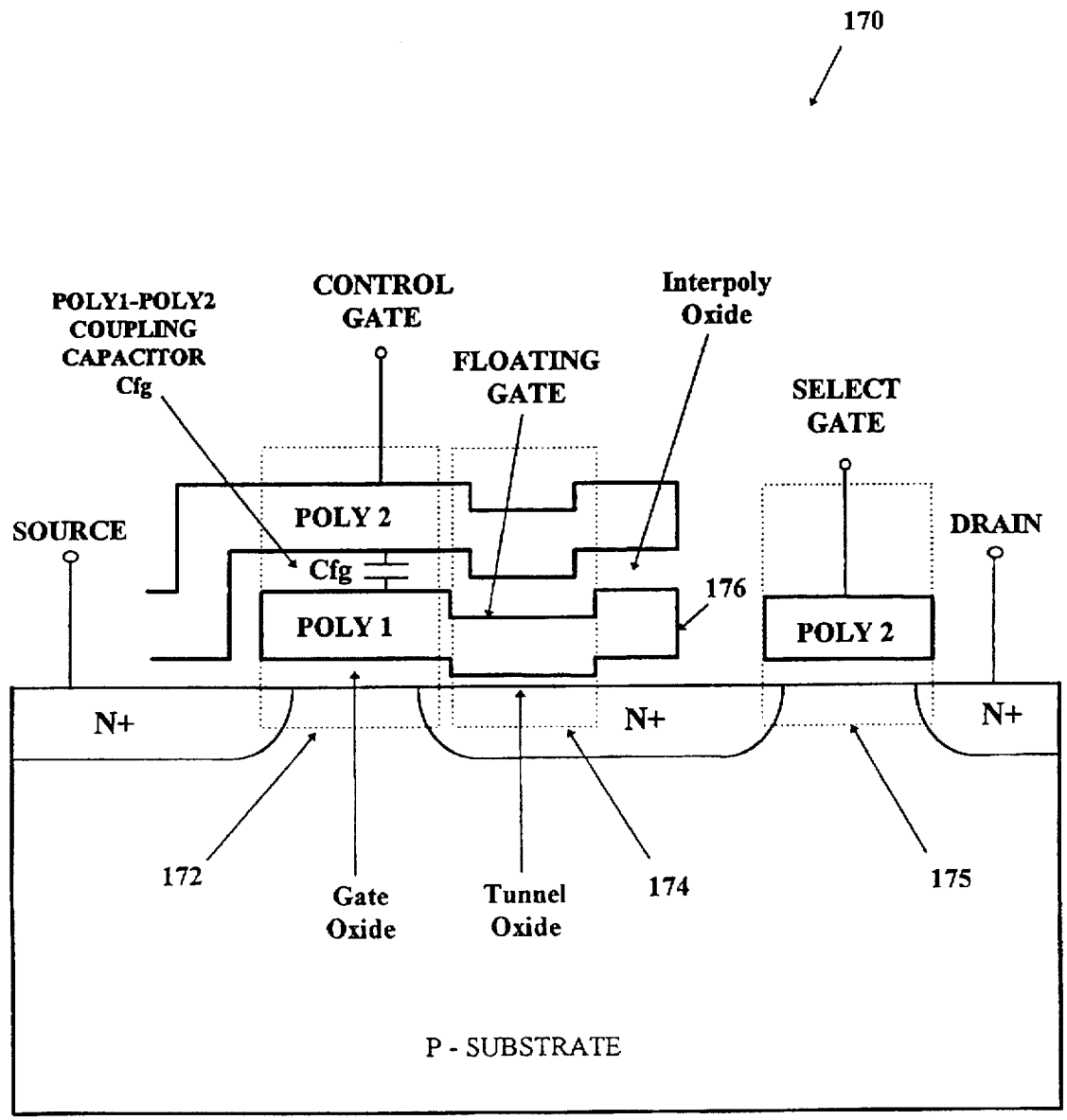
FIG. 1b shows a cross-sectional view of a prior art EEPROM cell.
Figure 1C:
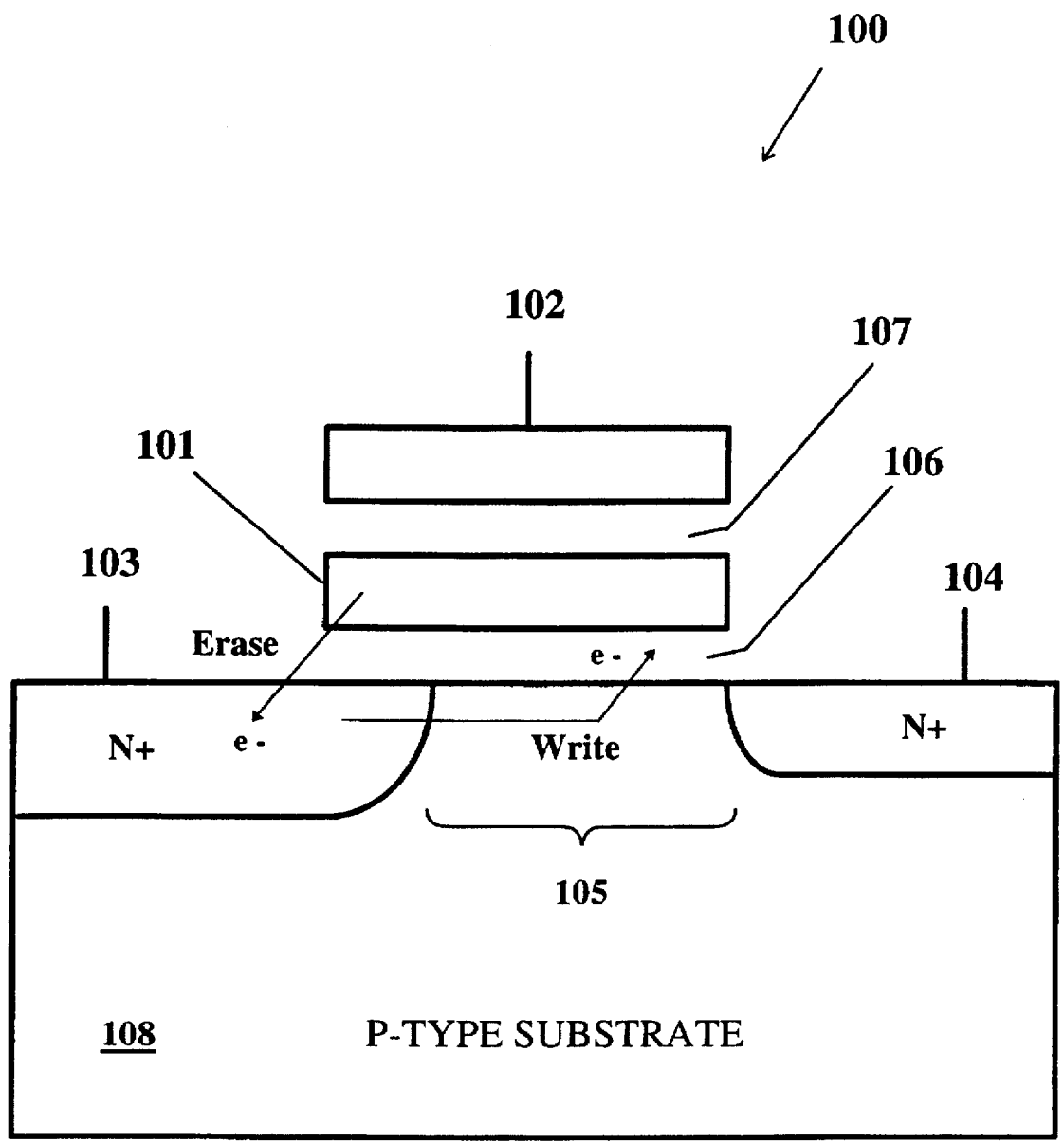
FIGS. 1c, 1d, 1e, 1f, and 1g show views of prior art flash EPROM cells.
Figure 1D:
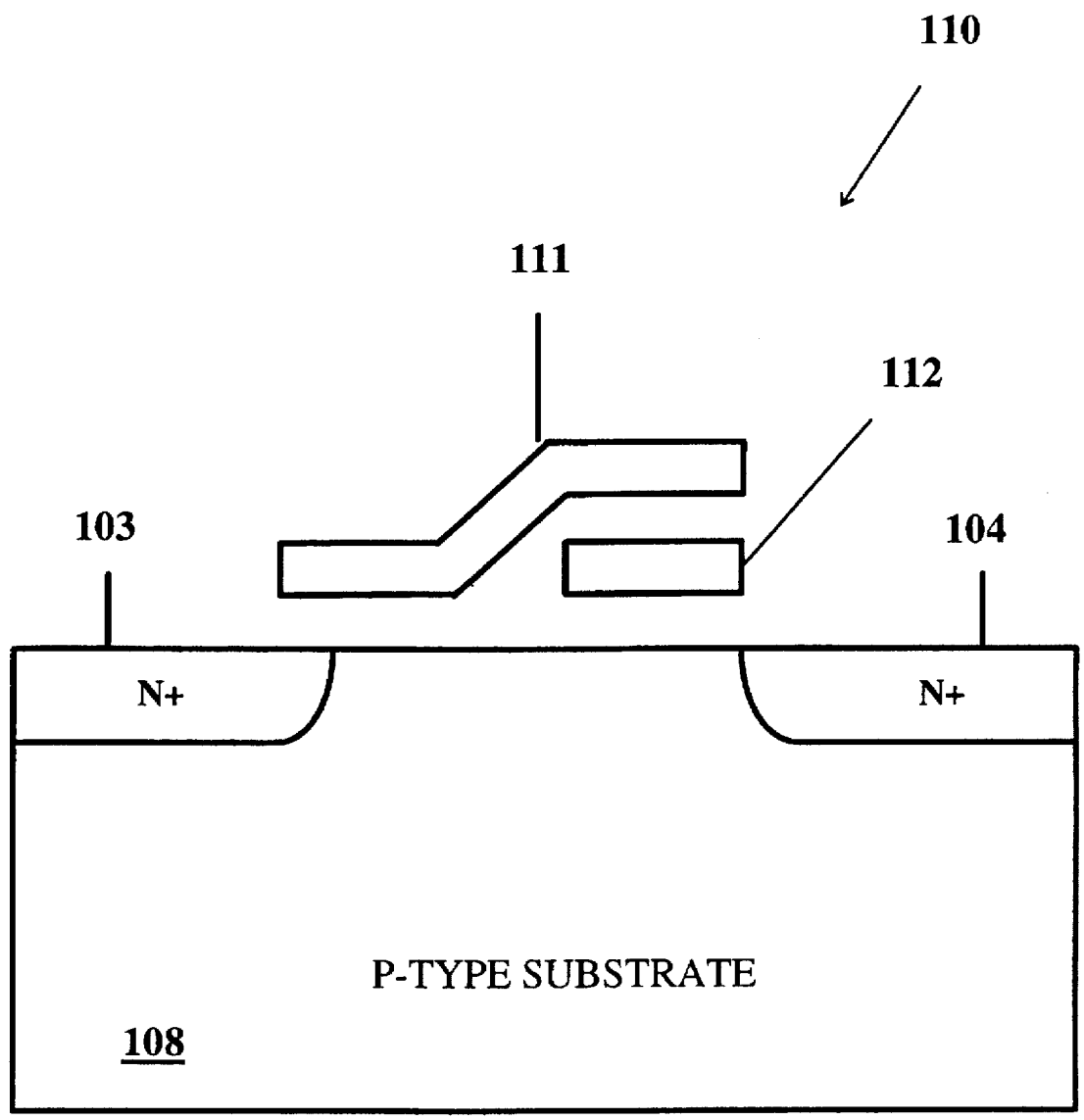
Figure 1E:
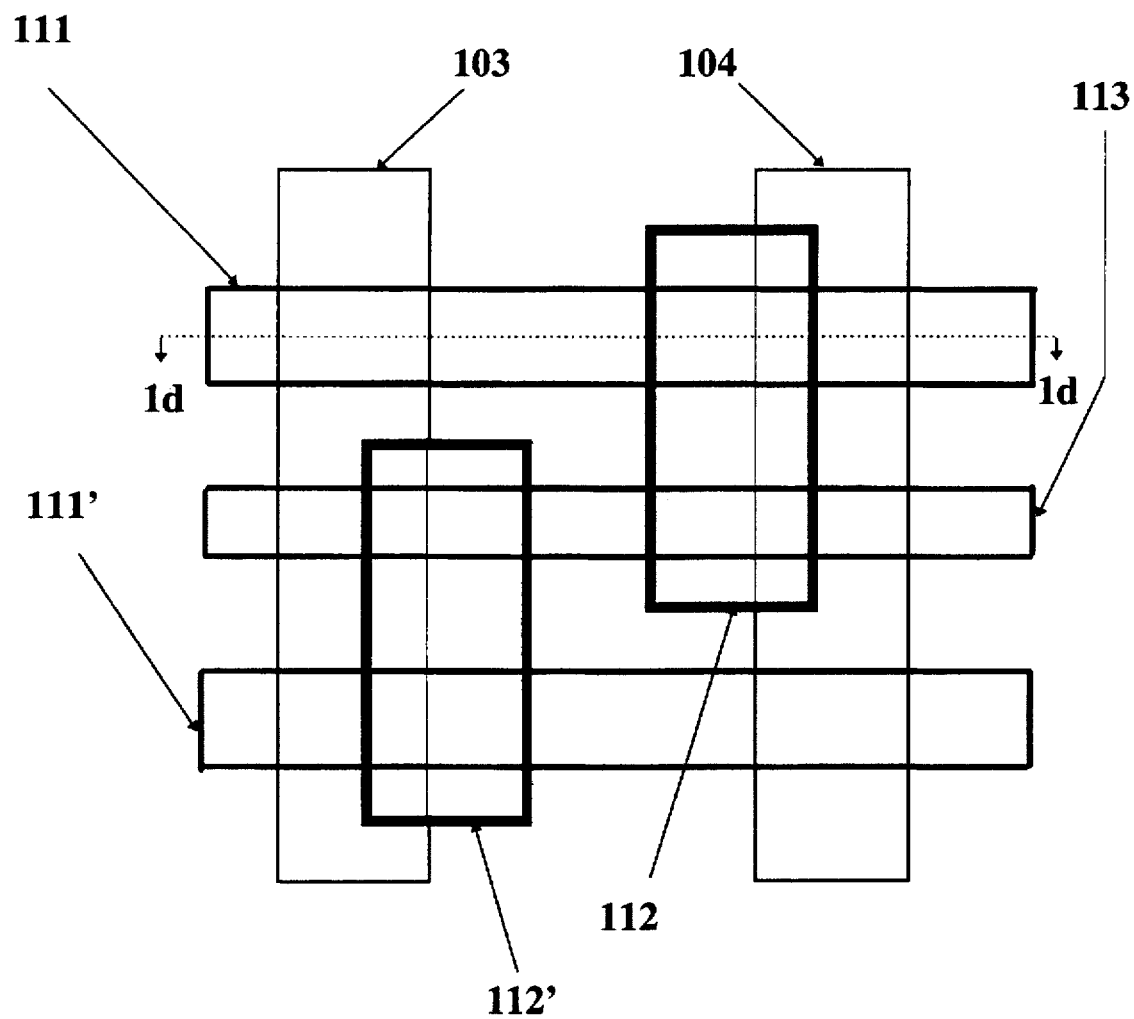
Figure 1F:
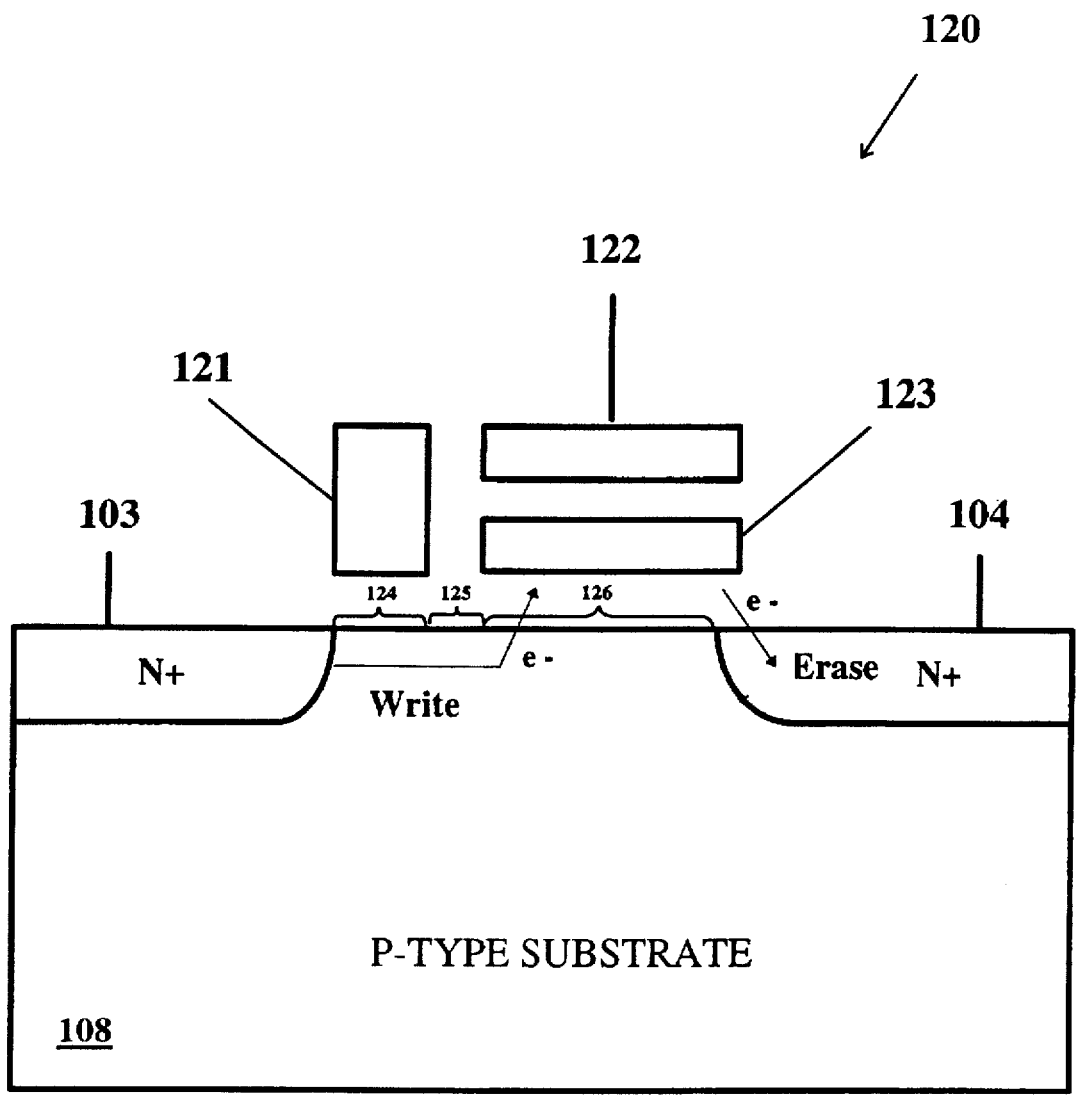
Figure 1G:
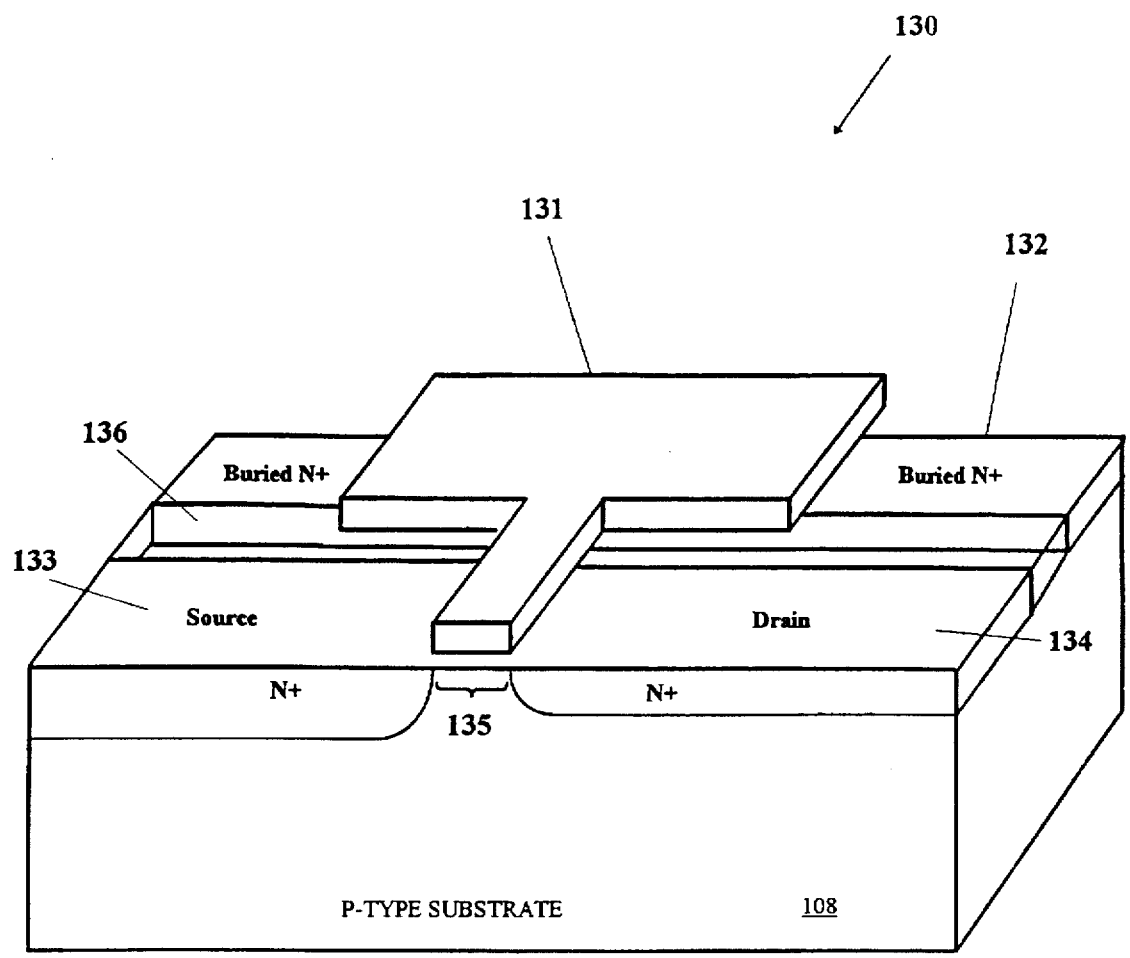

Example embodiments of this invention are described with regard to stacked gate flash EPROM cells such as shown in FIG. 1c. As will be apparent to those skilled in the art, write processes and circuits in accordance with this invention also apply to other varieties of memory cells including but not limited to the flash EPROM cells shown in FIGS. 1d, 1e, 1f, and 1g and to EPROM cells such as shown in FIG. 1a. Read techniques and circuits in accordance with this invention are generally applicable to all types of memory cells having variable threshold voltages including but not limited to EPROM cells, EEPROM cells, and flash memory cells.

While both flash EPROM and EEPROM can store analog signals, flash EPROM has advantages over EEPROM. For example, flash EPROM which is now the main-stream non-volatile memory technology has lower wafer cost, higher yield, greater availability, and wider user understanding and acceptance. Flash EPROM cells are also smaller, more scaleable, and written much faster than are EEPROM cells. Flash EPROM cells use channel hot electron (CHE) injection for writing and typically write three orders of magnitude faster than typical EEPROM cells because Fowler-Nordheim tunneling (FNT) which EEPROM cells use for writing is much slower than CHE injection.

Although memory in accordance with this invention can store all types of analog signals, the specific example of recording and retrieving sampled audio signals illustrates further advantages of flash EPROM over EEPROM. Applications to other analog systems will be apparent in view of this disclosure. In an audio recording system, the fast write time of flash EPROM (analog or digital) permits real-time recording of audio signals as sampled. The slower write time typical of EEPROM requires sequentially sampling and holding a large number of audio signals followed by parallel writing of the sampled signals into an EEPROM array. During one parallel write to the EEPROM array, more audio samples are sampled and held to prepare for the next opportunity to write. Accordingly, EEPROM requires substantially more supporting circuitry than does the flash EPROM for real-time recording of audio signals.

Both FNT and CHE injection require high voltages for proper operation. From a 5-volt supply voltage Vcc, an on-chip high-voltage charge-pump circuit easily supplies 12 volts for the control gates of memory cells because control gates are capacitive nodes and draw little current (typically in the nanoampere range). However, CHE injection for some memory cells such as stacked gate and split gate cells requires that the memory cells' drain voltages be higher than 5 volts, and the memory cells' channel currents are as high as 1 mA per cell. Simultaneously writing eight or more single bit memory cells in such flash EPROM requires a DC current of several mA at a voltage higher than the supply voltage Vcc, and implementation of an on-chip charge-pump sufficient for the required current is difficult. Accordingly, EEPROM appears to have an advantage over flash EPROM in low-voltage operation, such as 5-volt-only applications. One exception is the high injection efficiency flash EPROM cell 120 of FIG. 1f which even with a relatively large cell geometry requires a low channel current and is suitable for low voltage operation. Additionally, advances in semiconductor manufacturing technology have decreased flash EPROM feature size and reduced the drain voltage required to write to a memory cell. For example, a flash EPROM cell having 0.6-μm design rules typically requires a drain voltage of no more than 5 volts during a write, and an external 5-volt power supply can directly supply the necessary current. Furthermore, if flash EPROM cell geometry shrinks to below 0.5-μm in the future, a write operation with a 3.3-volt drain voltage may be possible. In accordance with this invention, since typically only one analog flash EPROM cell is written at a time, a high-voltage charge pump can be incorporated on-chip even if a voltage higher than 5 volts is required at the drain of a memory cell.

Figure 2A:
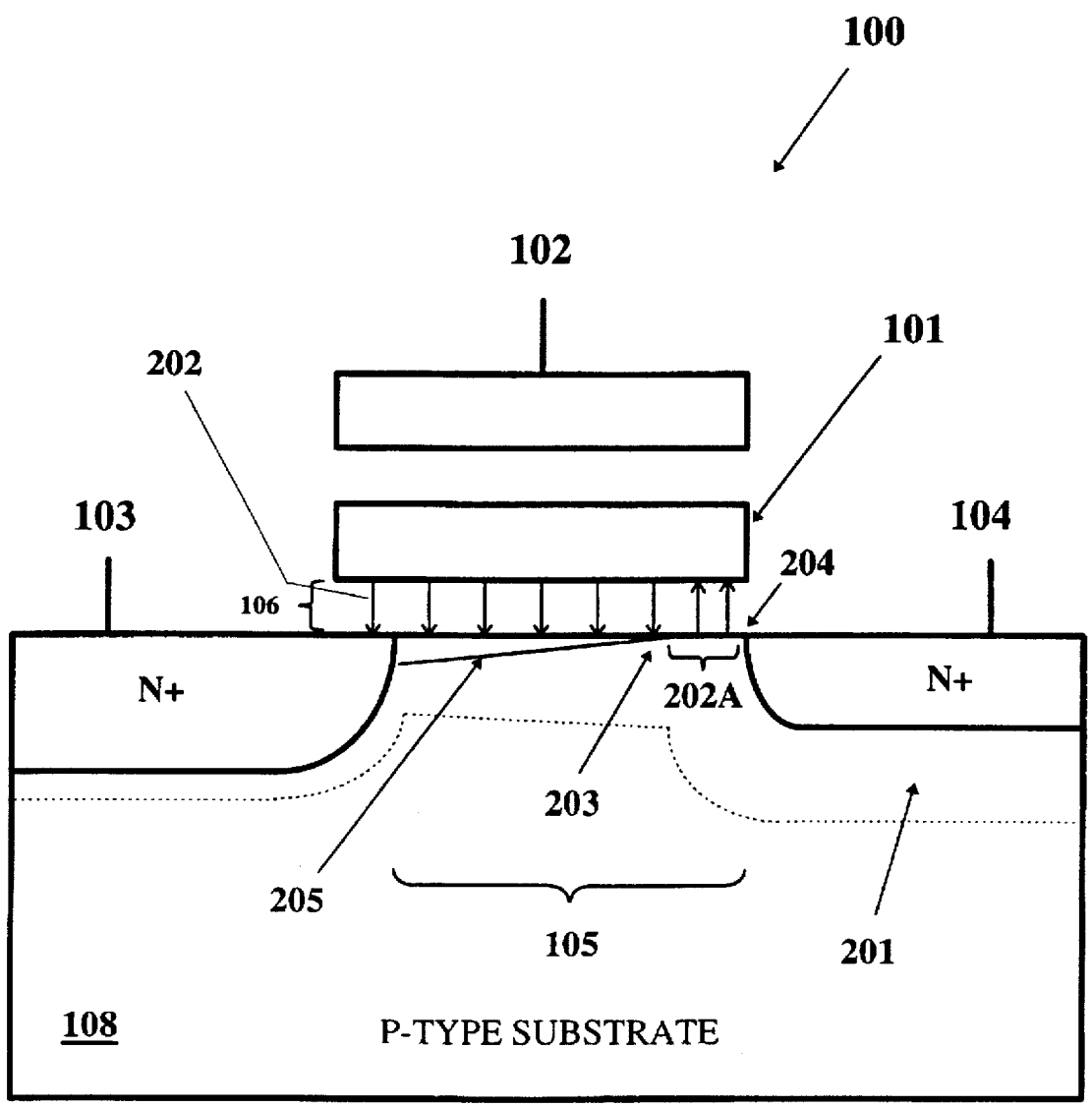
FIGS. 2a and 2b are cross-sectional views of a flash EPROM cell showing the electric field, the inversion layer, and the pinch-off point at the beginning and near the end of a write operation.

Initially, a flash EPROM cell 100 shown in FIG. 2a is erased and has a threshold voltage Vt at a virgin level of about 1.5 volts. Many well known techniques are available for erasing memory cell 100. The particular erase technique used is not critical to this invention. An analog signal Vanalog is written into flash EPROM cell 100 by precisely controlling an amount of charge injected into a floating gate 101 during CHE injection. The amount of charge on floating gate 101 sets the threshold voltage Vt of memory cell 100 at a target threshold voltage Vtt which represents analog signal Vanalog.

To precisely control the injection of channel hot electrons the mechanism of CHE injection must be understood. Two key requirements in CHE injection are: (1) availability of channel hot electrons with energy of 3.2 eV or higher; and (2) a vertical electric field 202 in gate oxide 106 that attracts the electrons into floating gate 101. At the beginning of a write operation, with a control gate 102 at about 12 volts and a drain 104 at about 5 volts or higher, the channel current in memory cell 100 is near saturation. Electrons in a channel 105 are accelerated by a voltage difference between drain 104 and source 103, and flow along channel 105 into a strong electric field surrounding a drain depletion region 201. Some electrons gain enough energy (typically about 3.2 eV) to overcome the energy barrier of gate oxide 106. In order for these "hot" electrons to reach floating gate 101, vertical electric field 202 between floating gate 101 and channel 105 must be favorable (i.e. in a direction which attracts electrons to the floating gate). Initially, the number of electrons on floating gate 101 is relatively low, and threshold voltage Vt of memory cell 100 is low. A charge inversion layer 205 extends from source 103 almost to drain 104, and except for a small portion 202A very near drain 104, vertical electric field 202 in gate oxide 106 attracts electrons toward floating gate 101. The area where the hot electrons are most energetic is somewhere between a pinch-off point 203 where inversion layer 205 ends and a drain junction 204. Maximum injection current density flows through gate oxide 106 at a point where the number of hot electrons is greatest and electric field 202 is most favorable. Accordingly, the optimum injection is in a small area around pinch-off point 203.

Figure 2B:
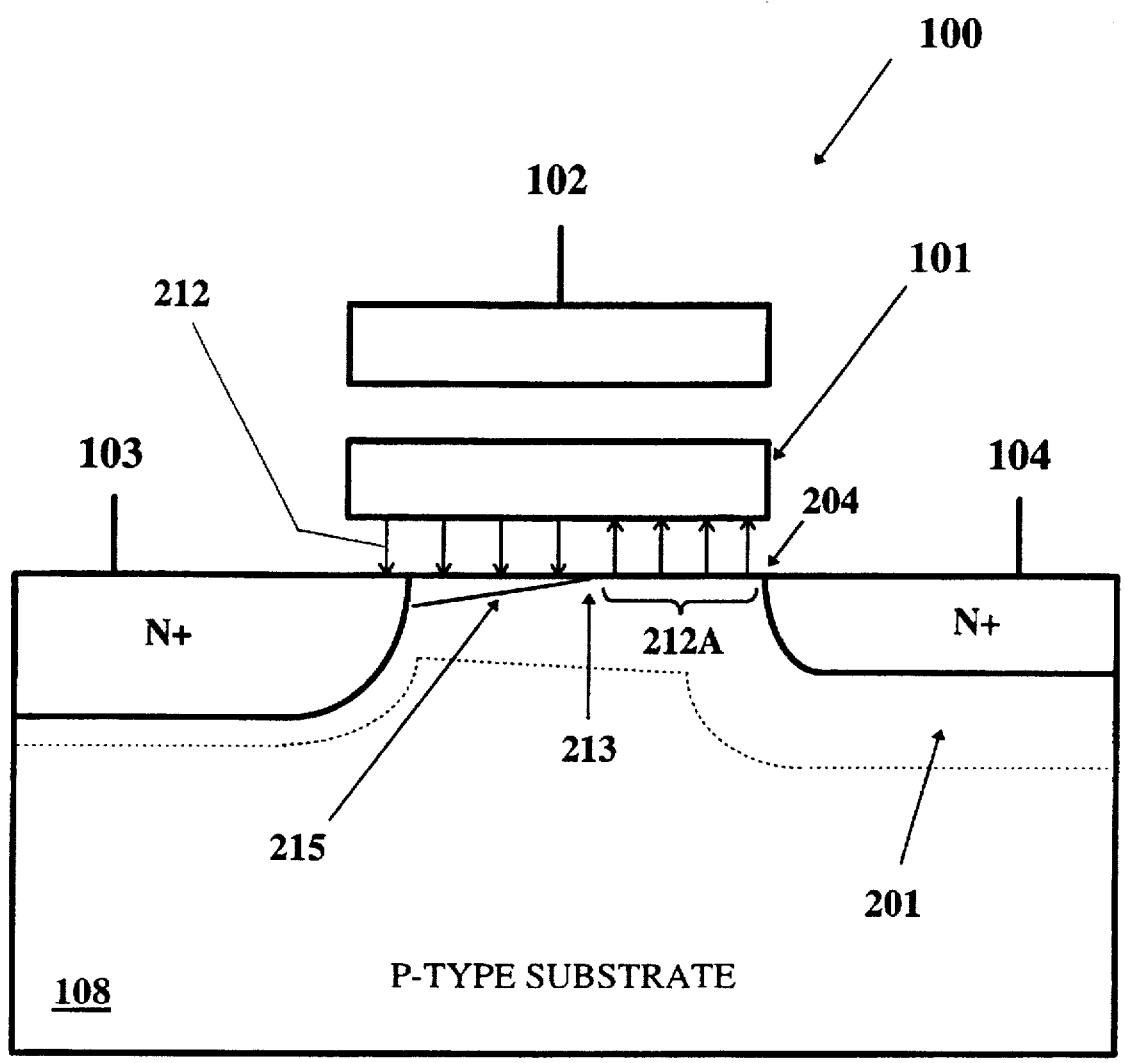

Referring to FIG. 2b, as the injection process continues, floating gate 101 charges up with electrons. The voltage difference between floating gate 101 and source 103 drops, and an inversion pinch-off point 213 is closer to source 103. As a result, the surface electric field near drain edge 204 in substrate 108 intensifies and produces more hot electrons, but in a region 212A where electrons are hottest, a vertical electric field 212 opposes injection to the floating gate 101. Accordingly, the injected-electron current subsides as floating gate 101 charges, and the injected current falls to almost zero as memory cell 100 approaches a saturation threshold voltage Vst. Vertical electric field 212 eventually repels further electrons from reaching floating gate 101 so that the threshold voltage of memory cell 100 stays at the saturation threshold voltage Vst.

A voltage Vpp on control gate 102 influences the voltage on floating gate 101 and vertical electric field 212 through capacitive coupling. Changing the control gate voltage Vpp used during a write operation changes the charge necessary on floating gate 101 to shut off the injection current and therefore changes the saturation threshold voltage Vst of memory cell 100. For CHE injection, a saturation threshold voltage change ΔVst is almost linearly proportional to a change ΔVpp in applied control gate voltage Vpp.

Figure 3A:
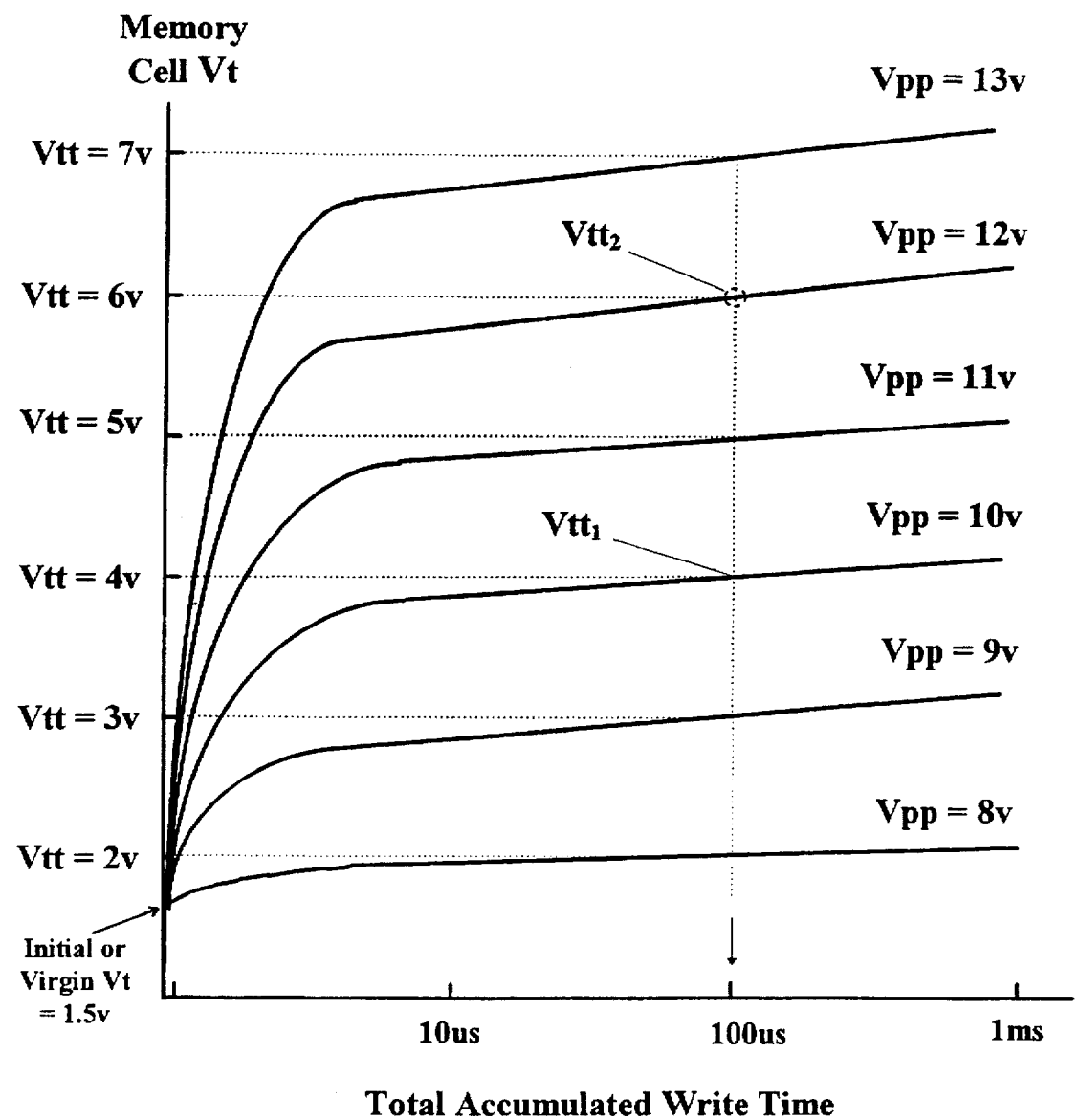
FIGS. 3a, 3b, and 3c show plots of threshold voltage versus time to illustrate a one-to-one correspondence between saturation threshold voltages of a flash EPROM cell and control gate voltages during a write operation, the independence of the saturation threshold voltage on the virgin threshold voltage of a flash EPROM cell, and the effect of drain voltage on the writing speed of a flash EPROM cell.

FIG. 3a shows plots of threshold voltage Vt versus time during writing of a memory cell using control gate voltages Vpp between 8 volts and 13 volts. After a long period of time (more than 1 ms), the threshold voltage Vt approaches the saturation threshold voltage Vst for the applied control gate voltage Vpp. To first order, saturation threshold voltage change ΔVst is proportional to control gate voltage change ΔVpp. Eqs. 1 and 2 relate a change ΔVfg in the floating gate potential Vfg to change ΔVst in saturation threshold voltage Vst in a flash EPROM cell.

$$\Delta Vfg = [Cfg \cdot \Delta Vgs + Cfd \cdot \Delta Vds]/Ct \qquad \text{(eq. 1)}$$

where the floating gate has capacitive couplings Cfg, Cfs, Cfc, and Cfd with the control gate, the source, the channel, and the drain, respectively, Ct is the sum Cfg+Cfd+Cfs+Cfc, ΔVgs is the change in the control gate to source voltage, and ΔVds is the change in the drain-to-source voltage.

$$\Delta Vst = \Delta Vfg \cdot [Ct/Cfg] = [Cfg \cdot \Delta Vgs + Cfd \cdot \Delta Vds]/Ct \times [Ct/Cfg] \qquad \text{(eq. 2)}$$

Accordingly, ΔVst=ΔVgs+[Cfd/Cfg]×ΔVds, and assuming the source voltage is constant and [Cfd/Cfg]·ΔVds is negligible, the saturation threshold voltage change ΔVst is proportional to ΔVgs (and the control gate voltage change ΔVpp).

For writing threshold voltages to a 1-mV resolution, second order effects which alter the saturation threshold voltage Vst need to be considered. These effects include uniformity of cell parameters across the memory array because based on eq. 2, small variations in the terminal voltages and capacitive couplings vary the relation between change ΔVpp in control gate voltage Vpp and the resulting change ΔVst in saturation threshold voltage Vst. Voltage source variations can also change the relation between control gate voltage change ΔVpp and saturation threshold voltage change ΔVst.

Figure 4:
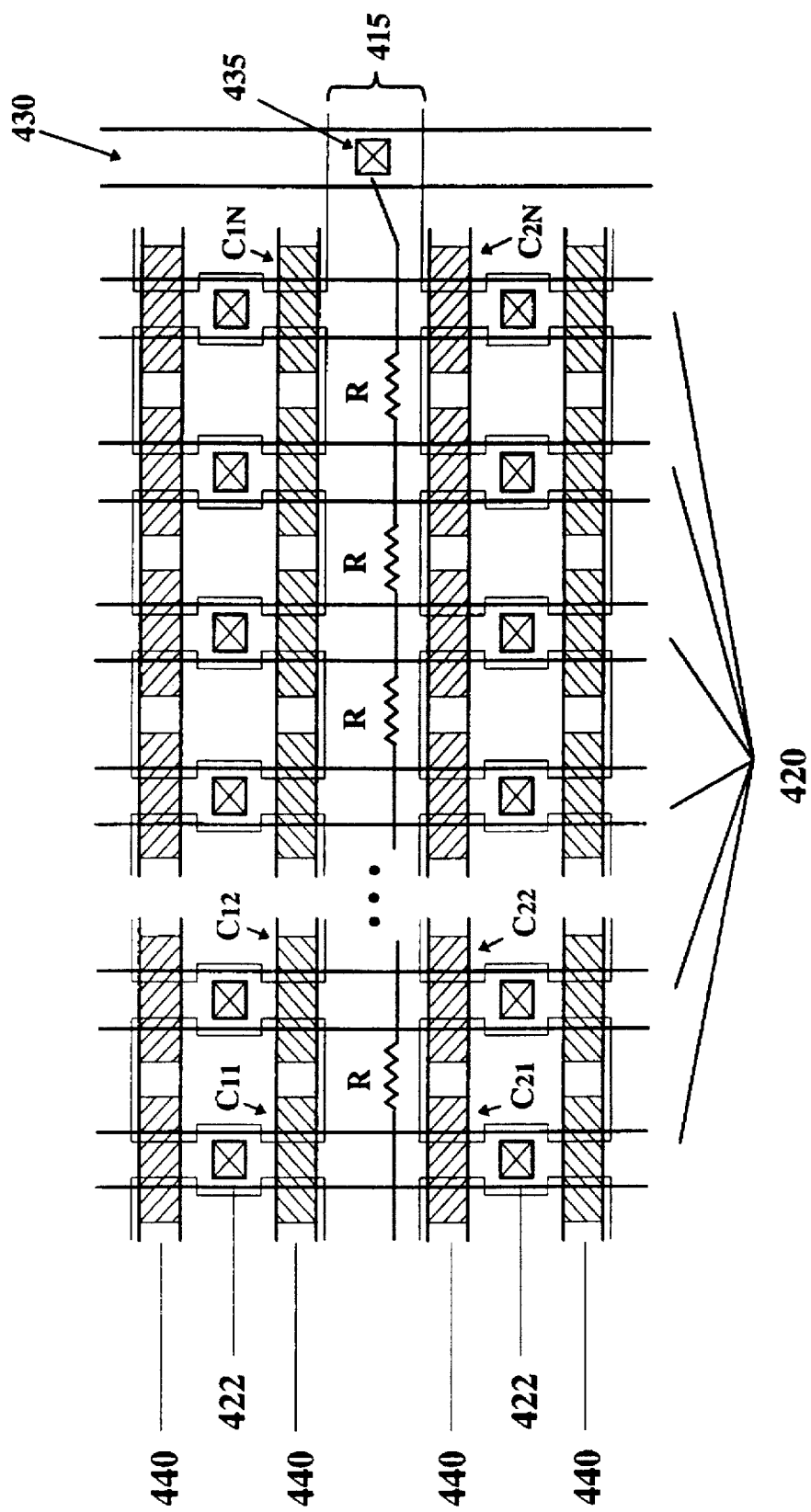
FIG. 4 is a layout drawing representing a portion of a flash EPROM memory array.

Additional variations in the relation between control gate voltage Vpp and saturation threshold voltage Vst arise from the layout of a memory array. FIG. 4 shows a typical memory array in which metal bit lines 420 connect drain terminals 422 of memory cells $C_{11}$ and $C_{21}$ in a column so that the memory cells' drain voltages are essentially constant along the column. However, drain-to-source voltage Vds changes depending on the magnitude of drain currents because of the finite impedance between drains 422 and a voltage source (not shown) coupled to bit lines 420.

The source voltage also varies with current. As shown in FIG. 4, stacked gate cell $C_{11}$ shares a common diffused source line 415 with other cells $C_{12}$ to $C_{1N}$ in the same row and with memory cells $C_{21}$ to $C_{2N}$ in an adjacent row. Common diffused source line 415 is strapped periodically to a metal source line 430 that is grounded during a write. The exact source voltage for memory cell $C_{11}$ is determined by a voltage drop along diffused source line 415 and depends on current through diffused source line 415 and on the distance between memory cell $C_{11}$ and a source line contact 435. Current through diffused source line 415 depends on control gate voltage Vpp.

Control gate voltage Vpp is typically more uniform across the memory array because row lines 440 which form control gates are capacitive terminals.

Figure 3B:
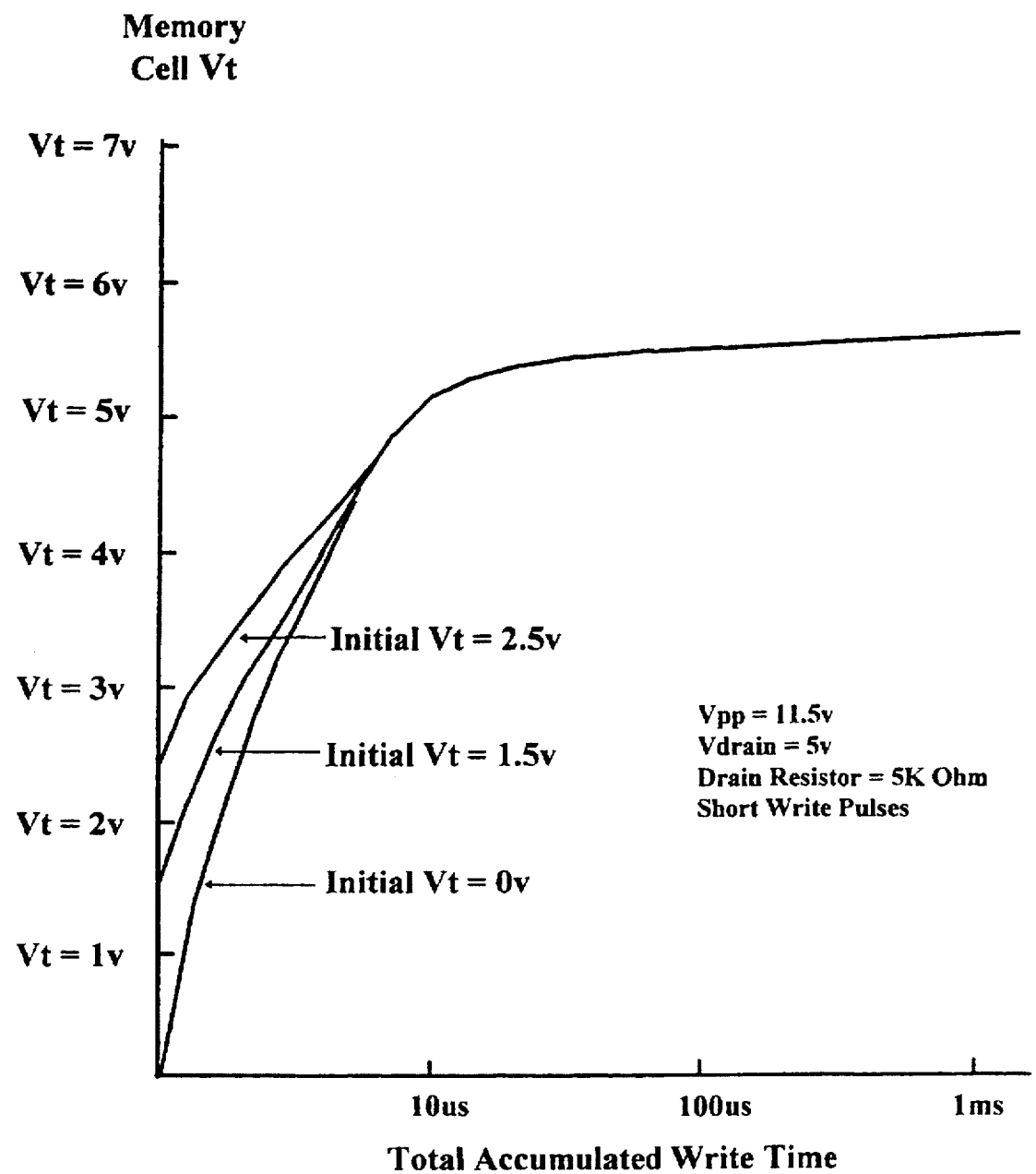

In general, the saturation threshold voltage Vst, of a cell does not depend on the virgin threshold voltage of the cell after an erase. FIG. 3b shows that after a sufficient write time, experimental plots of threshold voltage versus time become nearly identical regardless of the virgin threshold voltage. However, the virgin threshold voltage must be lower than the target threshold voltage Vtt of a subsequent write.

Figure 3C:
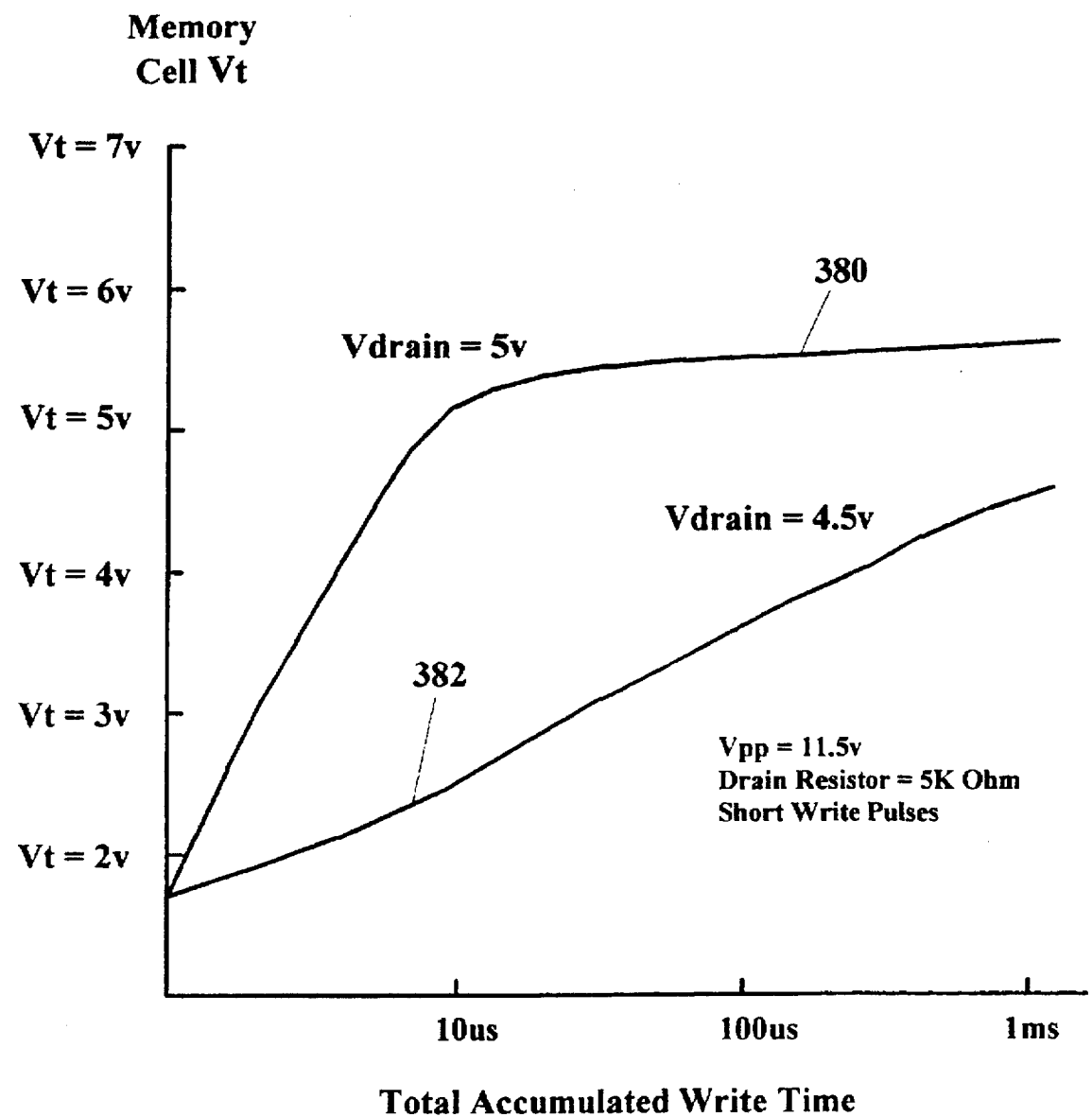

In general, the drain voltage of a flash EPROM cell during a write has a minor effect on a cell's saturation threshold voltage Vst. However, the drain voltage can significantly change the write speed of the memory cell because CHE injection exhibits an exponential dependence on the surface potential in the memory cell's channel. FIG. 3c shows plots 380 and 382 of threshold voltage versus time for a drain voltage of 5 volts and 4.5 volts during a write of a typical memory cell with a control gate voltage pulsed (applied in pulses) at a peak voltage of 11.5 volts. To reduce write time and improve write accuracy, the drain voltage should be held constant at a sufficiently high voltage to produce hot electrons during the write.

Figure 5A:
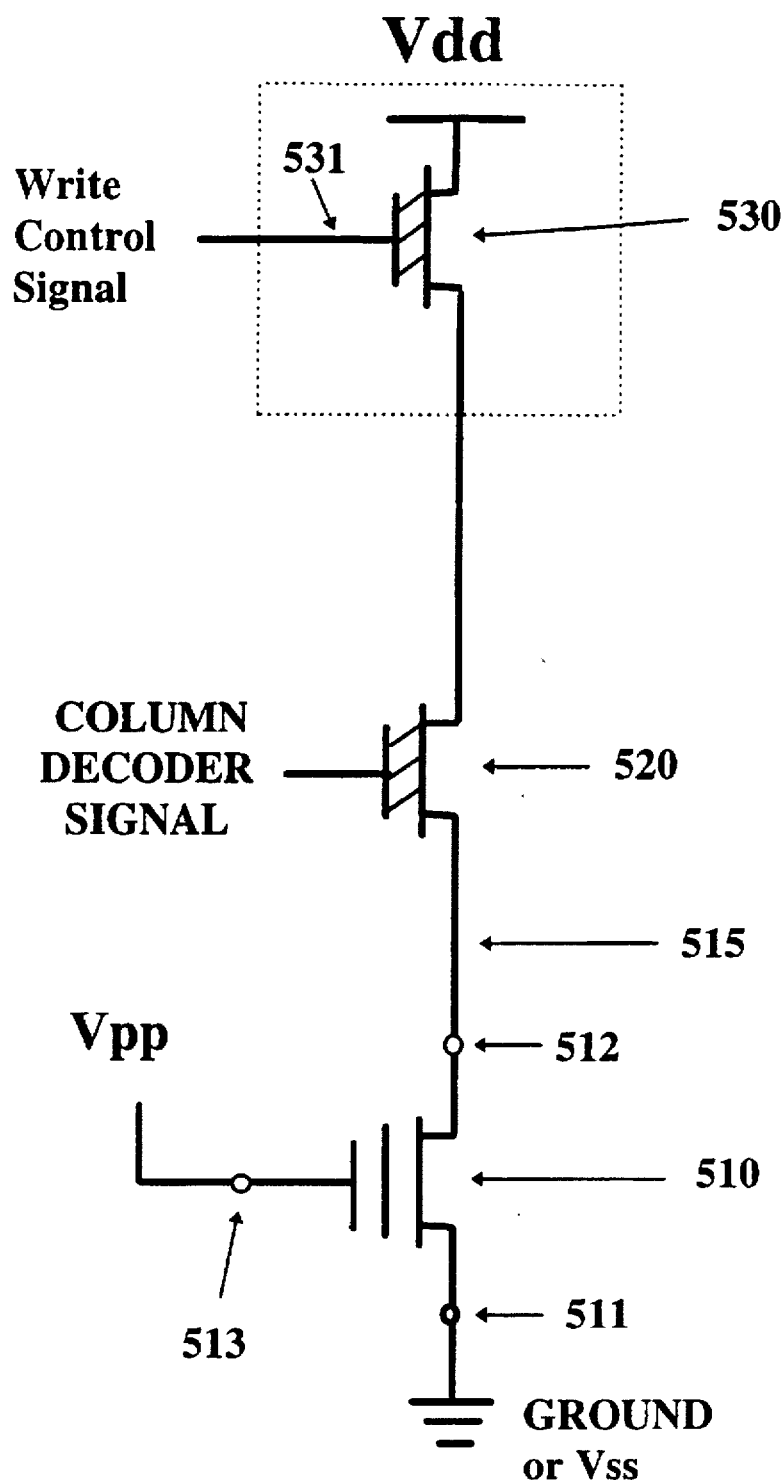
FIG. 5a is a schematic drawing of write circuitry including a resistive load device.

FIG. 5a shows write circuitry for a flash EPROM cell 510. Memory cell 510 has a grounded source 511 and a drain 512 connected through a metal column line 515 and a column select device 520 to a pull-up device 530. Pull-up device 530 forms a loadline which controls a drain voltage Vdrain during writing to memory cell 510 and has an impedance determined by a write control signal. In the embodiment of FIG. 5a, pull-up device 530 is a P-channel transistor having a drain coupled to a write supply voltage Vdd (typically about 5 to 6 volts) which is at or above the supply voltage Vcc. Column select device 520 is also a P-channel transistor. P-channel transistors are preferred for devices 520 and 530 because P-channel transistors conduct high voltages without a threshold voltage drop. Alternative embodiments use N-channel transistors with the gates bootstrapped to above voltage Vdd. The impedance of pull-up device 530 can be constant or vary with time or with an analog signal Vanalog being written to memory cell 510. Variable loadline embodiments of this invention are disclosed below.

Figure 5B:
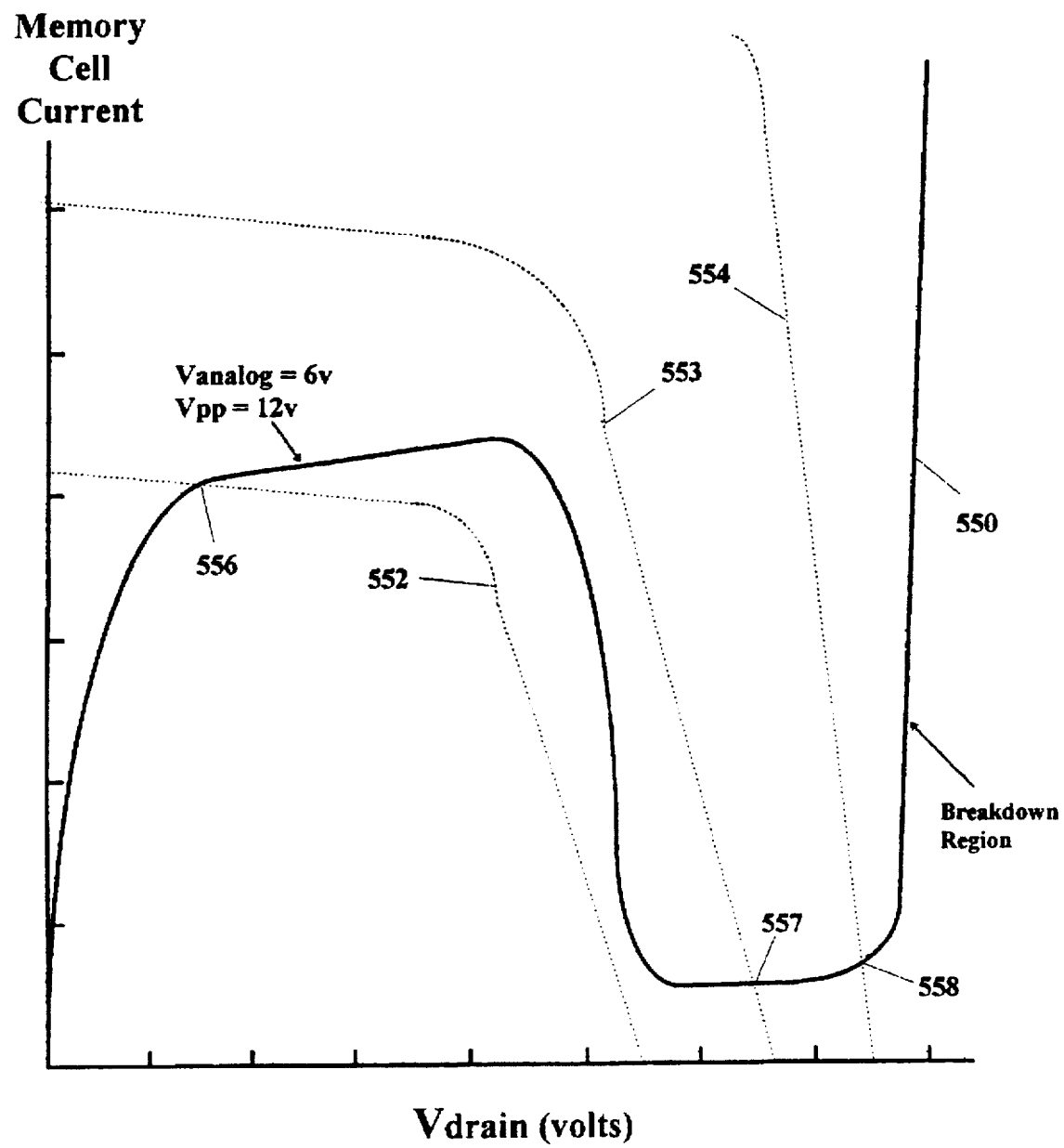
FIG. 5b shows plots of memory cell current versus drain voltage for various loadline impedances and for a flash EPROM cell.

The write control signal on gate 531 is chosen to optimize writing speed when pull-up device 530 provides a constant drain voltage for writing. FIG. 5b shows a plot 550 of current versus drain voltage Vdrain for memory cell 510 and plots 552 to 554 of current versus drain voltage Vdrain for pull-up device 530 for different write control signals. Intersections 556 to 558 of plots 552 to 554 with plot 550 determine the DC operating drain voltages of memory cell 510 during a write. If the impedance of loadline 530 is low, as in plot 554, operating drain voltage 558 is high, and cell 510 operates near its breakdown region which may trigger latch-up which draws a very large current. If impedance of loadline 530 is high, as in plot 552, operating drain voltage 556 limits the drain voltage which causes poor writing. An intermediate loadline impedance, as in plot 553, has a DC operating drain voltage 557 which provides an optimal write speed.

As discussed earlier, there is a linear relationship between the saturation threshold voltage Vst and the control gate voltage Vpp. If Vpp has also a one-to-one correspondence to analog signal Vanalog, then the saturation threshold voltage Vst of a memory cell will have a one-to-one correspondence to the analog signal Vanalog. However, the time it takes the memory cell to reach its saturation threshold voltage Vst is more than 1 ms, which is typically longer than the write time allowed for most applications. Therefore, a target threshold voltage Vtt which is near but lower than the saturation threshold voltage Vst is chosen such that for any given control gate voltage Vpp, the target threshold voltage Vtt can be reached at about the same time and also within the write time allowed by the application. Furthermore, since the target threshold voltage Vtt has a-one-to-one correspondence to the saturation threshold voltage Vst, Vtt will have a one-to-one correspondence to the control gate voltage Vpp, and hence to the analog signal Vanalog. Therefore, analog signal Vanalog can be written to a flash EPROM cell 510 by raising the threshold voltage Vt from a virgin level to a target level Vtt which indicates signal Vanalog.

Referring to FIG. 3a, for the example of a 100-μs write time, a control gate voltage Vpp of 10 volts, which has a saturation threshold voltage of about 4.5 volts, reaches a target threshold voltage $Vtt_1$ of about 4 volts; and a control gate voltage Vpp of 12 volts, which has a saturation threshold voltage of about 6.5 volts, reaches a threshold voltage $Vtt_2$ of about 6 volts. As a result, target threshold voltage Vtt can be achieved within a selected write time regardless of the value of analog signal Vanalog. The lower control gate voltages used for lower target threshold voltages provide slower changes in threshold voltage near the target threshold voltages, and allow for high resolution writing.

Figure 6A:
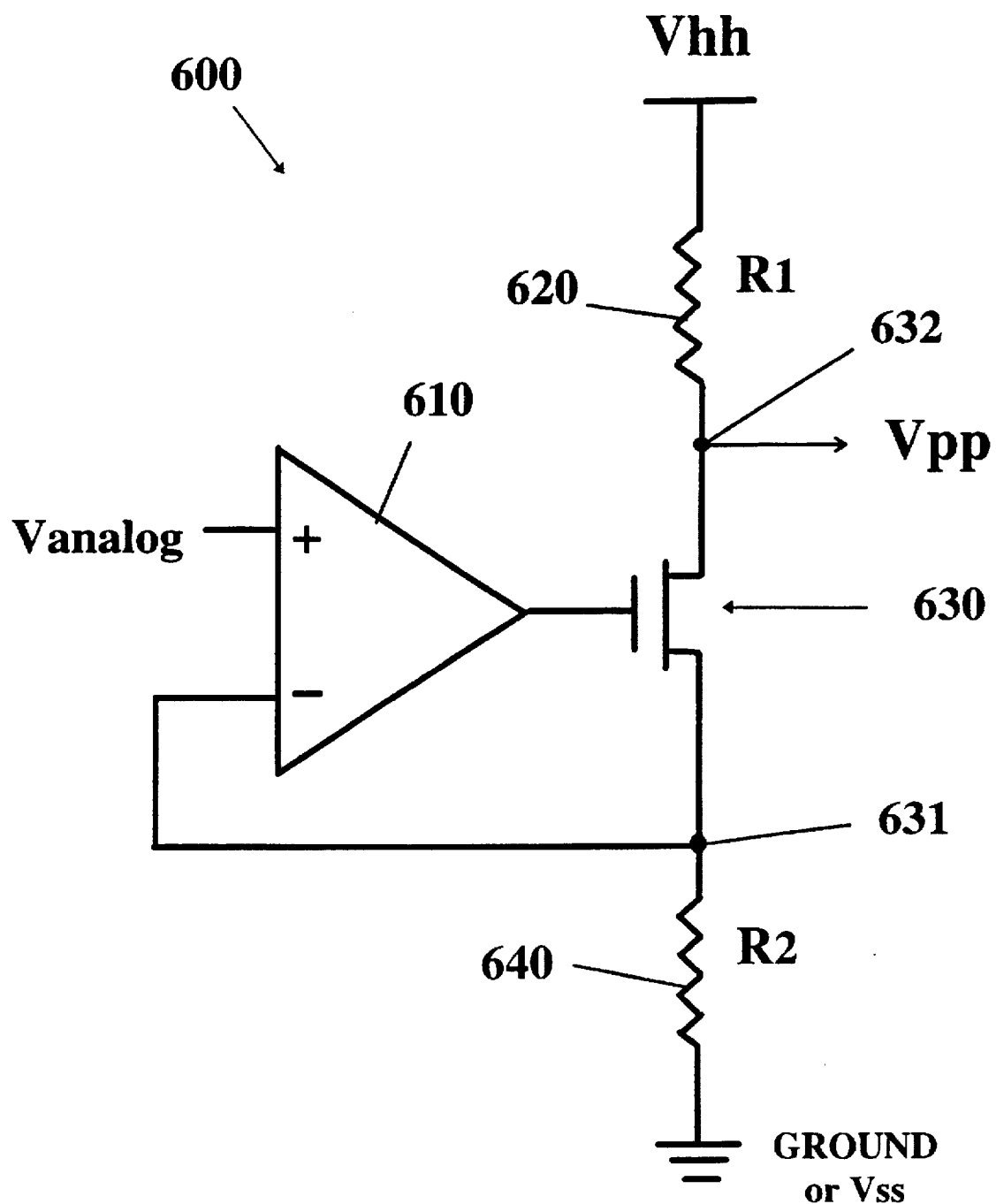
FIG. 6a is a schematic drawing of a linear inverting voltage shifter in accordance with one embodiment of this invention.

One way of generating a control gate voltage Vpp corresponding to an analog signal Vanalog is with an inverting voltage shifter that level-shifts analog signal Vanalog to a high voltage Vhh minus an amount proportional to analog signal Vanalog. FIG. 6a shows an embodiment of an inverting linear voltage shifter 600 which provides control gate voltage Vpp to a flash EPROM cell 510 (FIG. 5a). Voltage shifter 600 includes an operational amplifier (opamp) 610 having a positive input terminal which .receives analog signal Vanalog for storing in memory cell 510, a negative terminal connected to a source 631 of an N-channel transistor 630, and an output terminal connected to the gate of N-channel transistor 630. Source 631 and drain 632 of the N-channel transistor 630 are connected through resistors 640 and 620 to voltages Vss and Vhh, respectively. A conventional high-voltage charge-pump (not shown) provides voltage Vhh (typically about 14 to 16 volts).

Opamp 610 has a high gain which causes voltage at source 631 to track analog signal Vanalog. Resistors 620 and 640 have the same resistance (R1=R2), and the voltage drop across each resistor equals signal Vanalog because resistors 620 and 640 conduct the same current. Accordingly, output voltage Vpp at drain 632, equals voltage Vhh minus signal Vanalog. In an alternative embodiment, resistors 620 and 640 have different resistances, and voltage drop across resistor 620 is proportional to signal Vanalog.

Figure 6B:
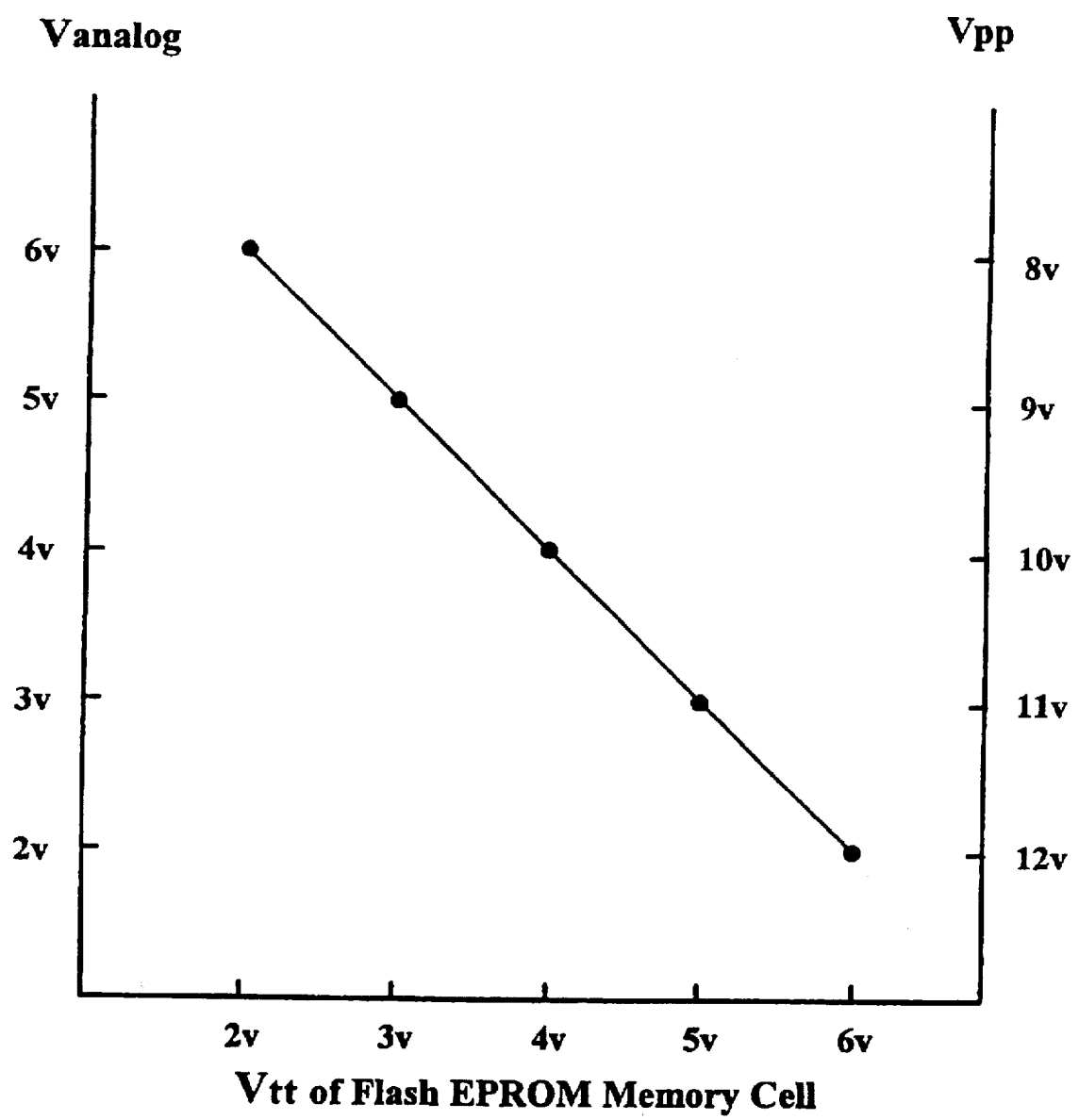

Control gate voltage Vpp from shifter 600 decreases in a one-to-one correspondence as signal Vanalog increases. Accordingly, a lower threshold voltage in a memory cell 510 indicate a higher analog signal Vanalog. FIG. 6b shows an example relationship between analog signal Vanalog and the target threshold voltage Vtt. When analog signal Vanalog is in a range from 2 to 6 volts, the corresponding output voltage Vpp is in a range from 12 to 8 volts respectively, and the target threshold voltage Vtt is in a range from 6 to 2 volts respectively.

Figure 7A:
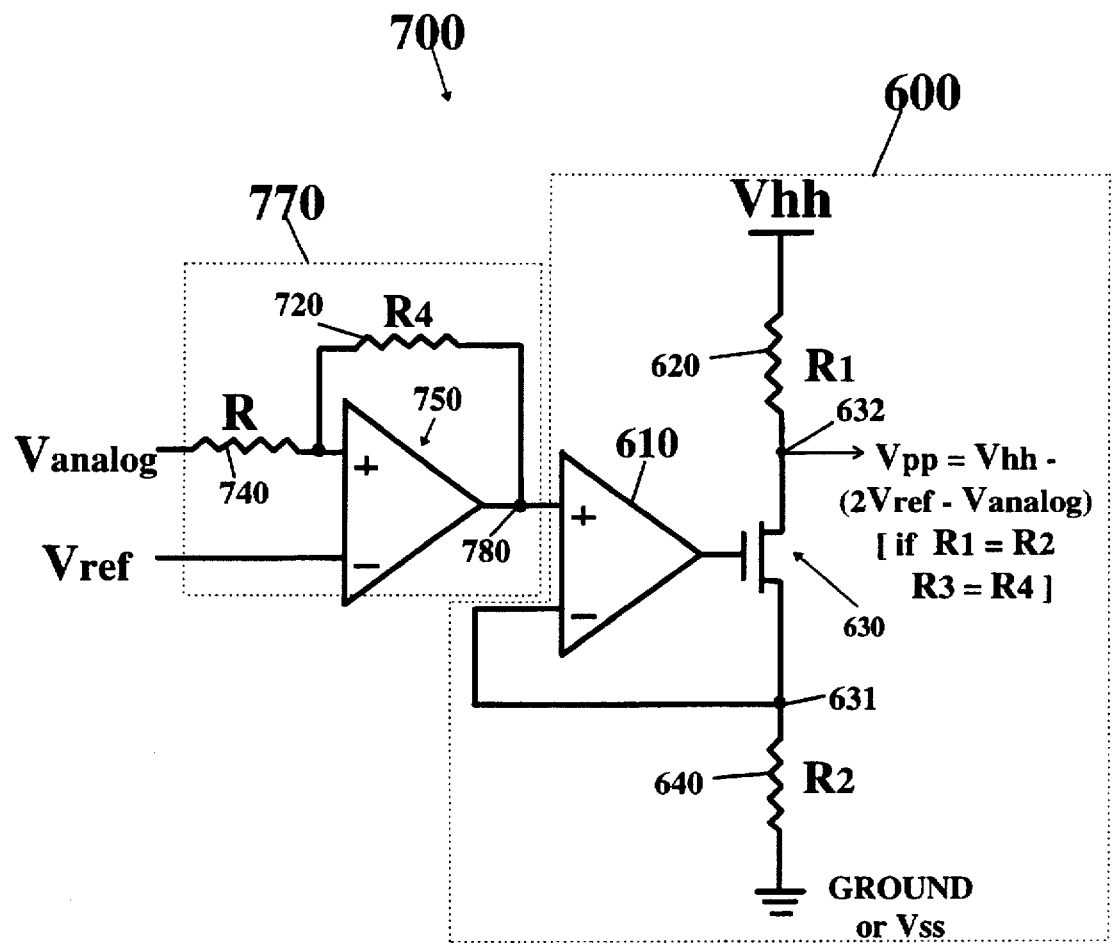
FIG. 7a is a schematic drawing of a linear high voltage shifter in accordance with an embodiment of this invention.

FIG. 7a shows an example of a non-inverting linear voltage shifter 700 with an output voltage Vpp that increases with input signal Vanalog. Voltage shifter 700 consists of voltage shifter 600 and an analog inverting stage 770. The analog inverting stage 770 inverts input signal Vanalog with respect to a reference voltage Vref. Voltage Vref is the midpoint of the range of input signals Vanalog. If resistors 720 and 740 have the same resistance, then an output node 780 of an opamp 750 inversely tracks analog signal Vanalog. Since output node 780 drives the positive terminal of opamp 610 in the voltage shifter 600, voltage Vpp at output node 632 of voltage shifter 700 directly tracks analog signal Vanalog.

Figure 7B:
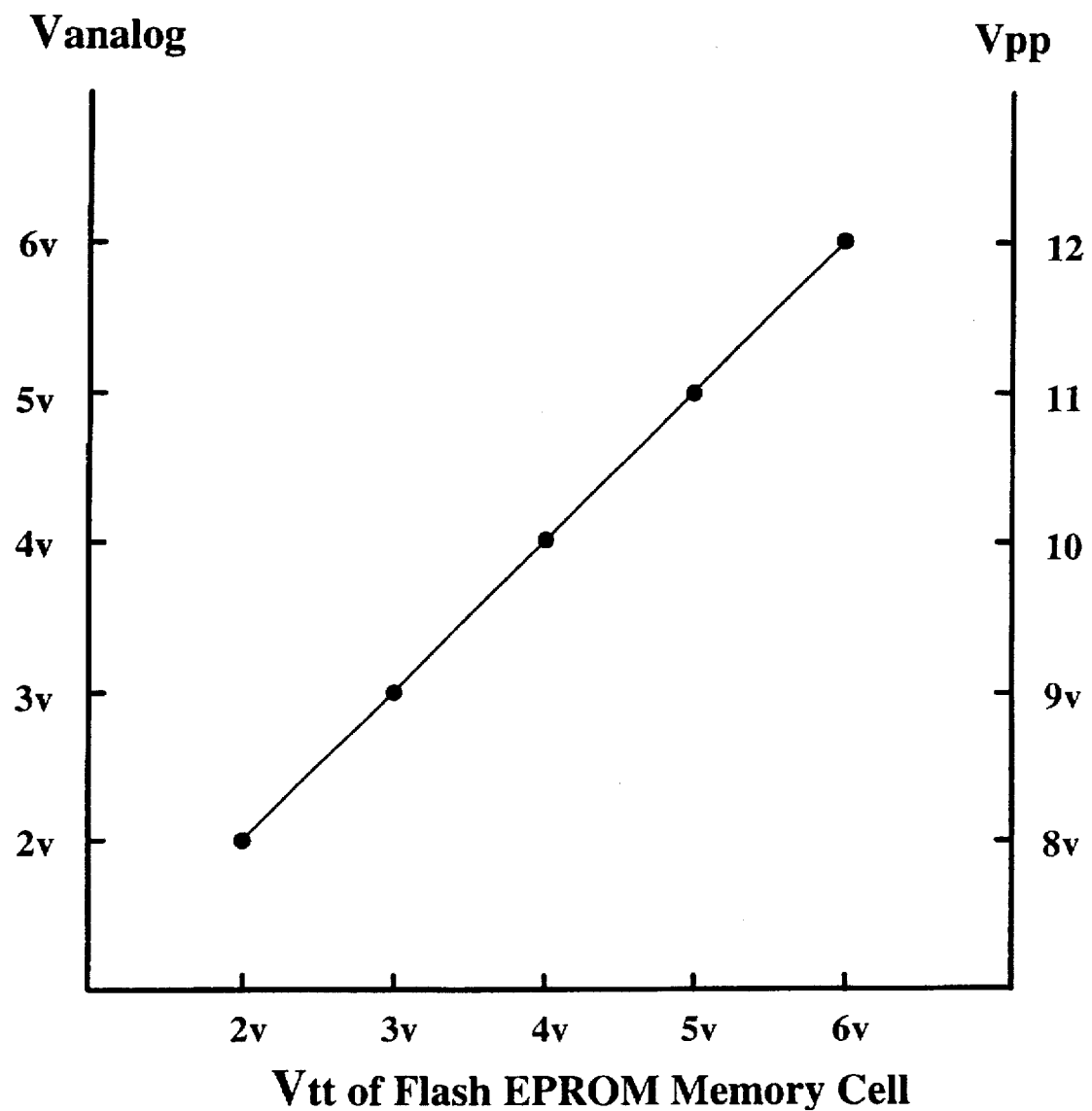

FIG. 7b shows a plot relating analog signal Vanalog to the resulting control gate voltage Vpp and target threshold voltage Vtt for the embodiment according to FIG. 7a. In the example embodiment, analog signal Vanalog varies between 2 volts and 6 volts, and voltage Vref is 4 volts which is the average of the minimum and the maximum values of analog signal Vanalog. When analog signal Vanalog rises from 2 volts to 6 volts, the voltage at node 780 drops from 6 volts to 2 volts, and the corresponding output voltage Vpp rises from 8 volts to 12 volts. The resulting target threshold voltages Vtt written to memory cells are between 2 and 6 volts respectively, and the written threshold voltage Vtt equals analog signal Vanalog.

The written threshold voltage Vtt does not need to equal signal Vanalog to indicate signal Vanalog. The relationship between signal Vanalog and control gate voltage Vpp does not even need to be linear. A one-to-one correspondence between memory cell threshold voltages and the range of signals Vanalog is sufficient. A linear relationship between signal Vanalog and control voltage Vpp simplifies read and write circuitry and is preferred. However, companding (compressing and expanding) schemes may provide better threshold voltage resolution and improved signal-to-noise ratio. For example, a well known logarithmic relationship such as A-law or μ-law can compress input analog signal Vanalog before or during the voltage shifting. During a read, an inverse relationship expands the threshold voltage to generate an output voltage equal to analog signal Vanalog.

Control gate voltage Vpp can be selected so that a threshold voltage Vtt written in a memory cell equals analog signal Vanalog. The specific voltages Vpp which meet the above requirements depend on the technology and the characteristics of the memory cell and are chosen to meet resolution and write time requirements. Accounting for common mode variations in memory cell performance (variations that arise from manufacturing or environment and are common to all cells in an array) is also required. One method to satisfy these requirements is to make control gate voltage Vpp track the memory cell's common mode variations. In particular, control gate voltage Vpp in shifters 600 (FIG. 6a) or 700 (FIG. 7a) can be regulated by adjusting a high-voltage charge-pump circuit which supplies voltage Vhh.

Figure 7C:
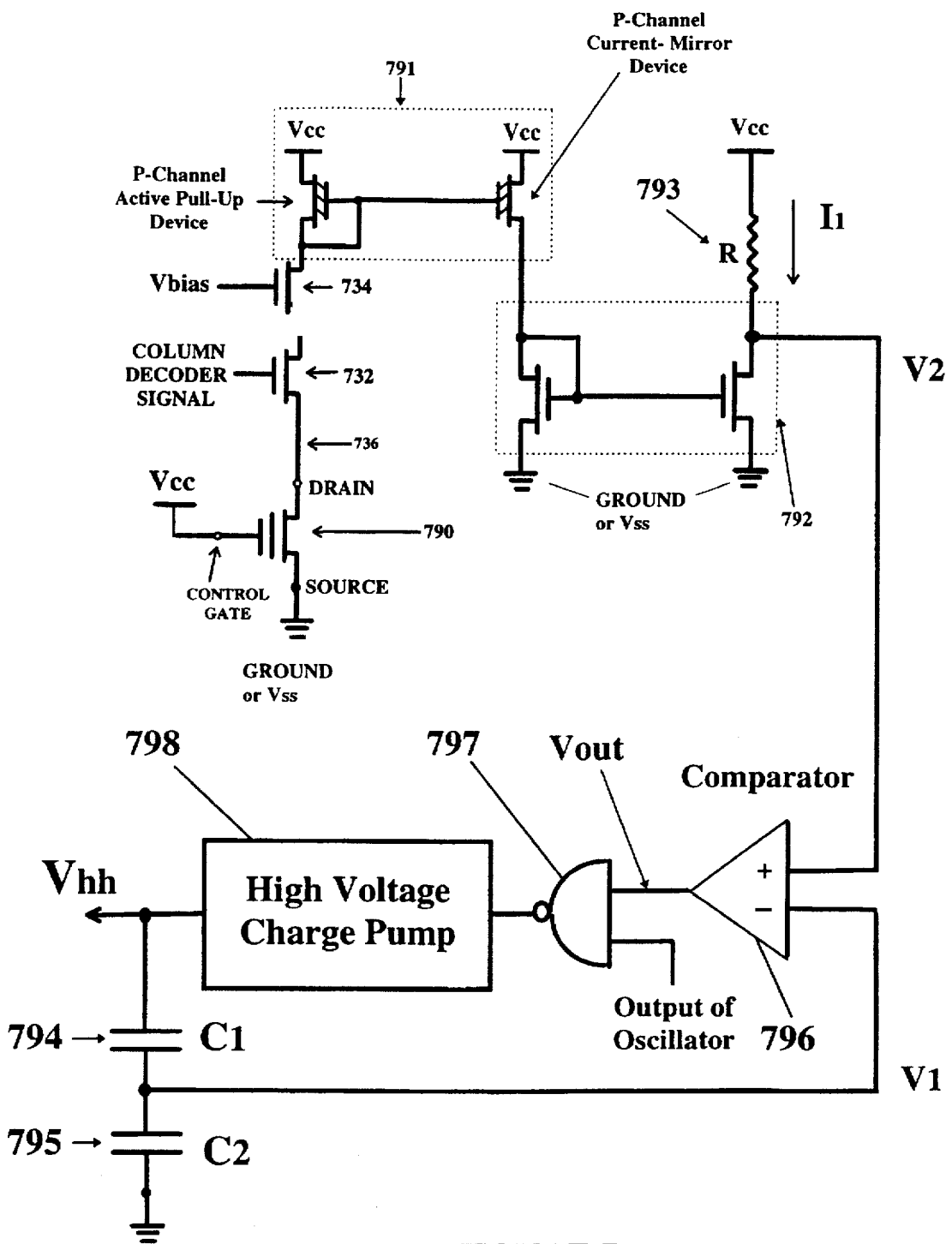

FIG. 7c shows an embodiment of a control circuit and a charge pump 798 which supply a voltage Vhh which tracks memory cell performance. The control circuit contains a reference cell 790 which has a threshold voltage at the virgin level and is biased in the linear region to act as a "cell-tracking" current source. Reference cell 790 is in a reference column in a memory array containing reference cells (not shown) identical to reference cell 790. The reference column is coupled to column select device 732 and a cascoding device 734 so that current through reference cell 790 matches current through an unprogrammed memory cell. A P-channel current-mirror circuit 791 and an N-channel current-mirror circuit 792 control a current $I_1$ through a resistor 793. Current $I_1$ is proportional to the channel current of reference cell 790 and flows from a supply voltage Vcc through resistor 793 to generate a voltage $V_2$. A higher cell current lowers voltage $V_2$.

A comparator 796 compares voltage $V_2$ with a voltage $V_1$ which is proportional to output voltage Vhh of a conventional high-voltage charge-pump circuit 798. As is well known for conventional charge pumps, charge-pump 798 requires a oscillating signal, from a NAND gate 797 in the embodiment of FIG. 7c, to maintain or increase the level of voltage Vhh. Voltage Vhh and the capacitive ratio of capacitors 794 and 795 determine voltage $V_1$. Voltage $V_1$ equals Vhh·$C_1/(C_1+C_2)$ where $C_1$ and $C_2$ are the capacitances of capacitors 794 and 795 respectively. If voltage $V_1$ is lower than voltage $V_2$, comparator 796 drives one input terminal of NAND gate 797 high, and the output voltage of NAND gate 797 oscillates with an output of an oscillator (not shown) connected to a second input terminal of NAND gate 797. Accordingly, NAND gate 797 drives high-voltage charge-pump 798 which increases voltage Vhh when voltage $V_1$ is less than voltage $V_2$. However, if voltage $V_1$ reaches or exceeds voltage $V_2$, comparator 796 keeps an output voltage from a NAND gate 797 high and stops the oscillator from driving charge pump 798. Since common mode variations which increase current through reference cell 790 also increase currents in the memory cells and make CHE injection more efficient during writing, voltage Vhh (and therefore control gate voltage Vpp) is lowered to maintain a desired rate of threshold voltage change, a desired threshold voltage accuracy, and a desired total writing time.

Most applications of memory have a limited total write time available. For recording audio signals in real time, the typical sampling rate is about 8 KHz to 44 KHz, which allows a total write time of about 125 μs to 23 μs respectively per sample. A constant voltage Vpp may require a write time longer than 125 μs for a typical flash EPROM cell to near the saturation threshold voltage Vst, and hence write speed needs to be increased for applications having a maximum write time under 125 μs.

Figure 8:
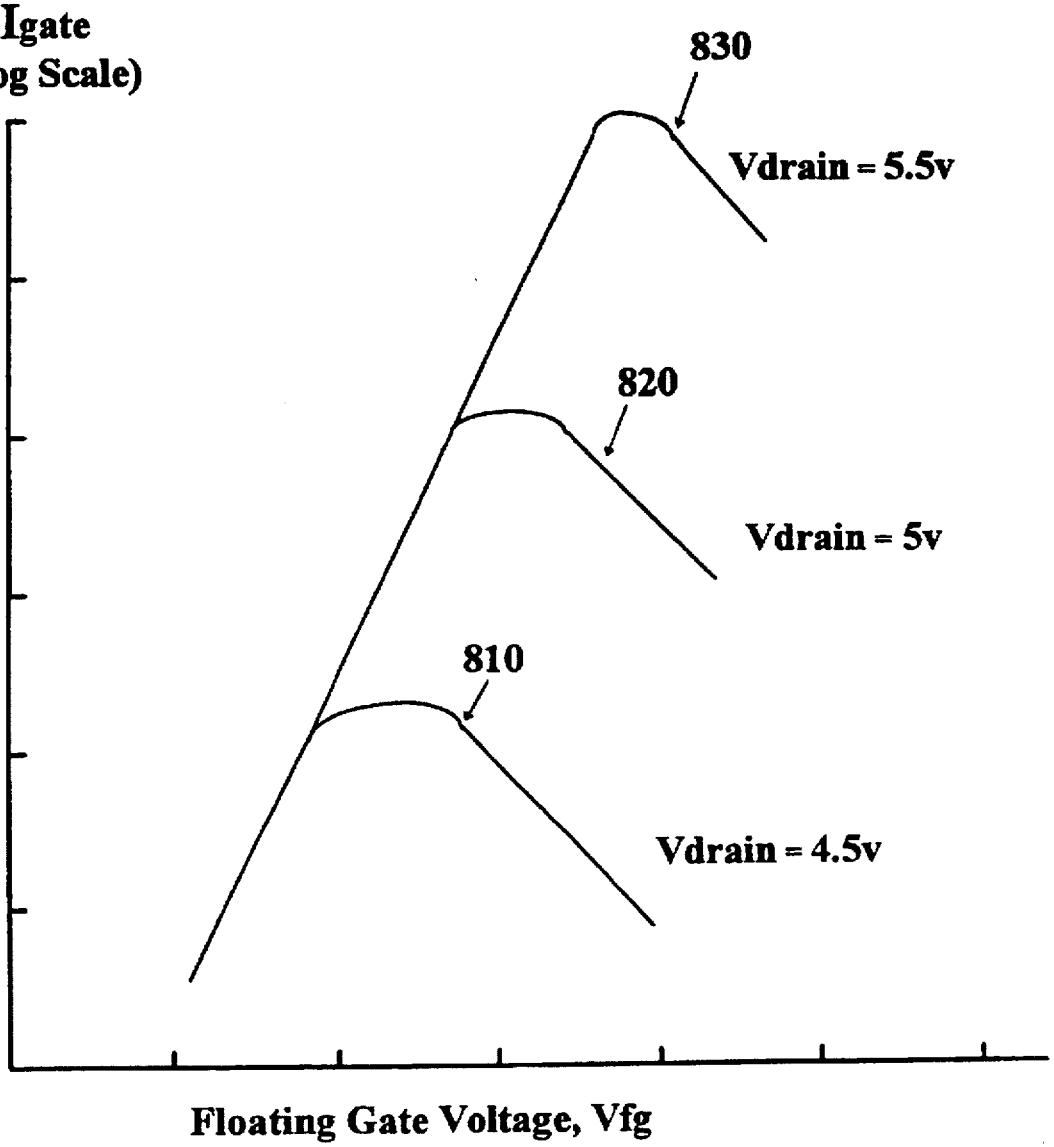
FIG. 8 shows plots of CHE injection current versus floating gate voltage for three different drain voltages in a flash EPROM cell.
Figure 9:
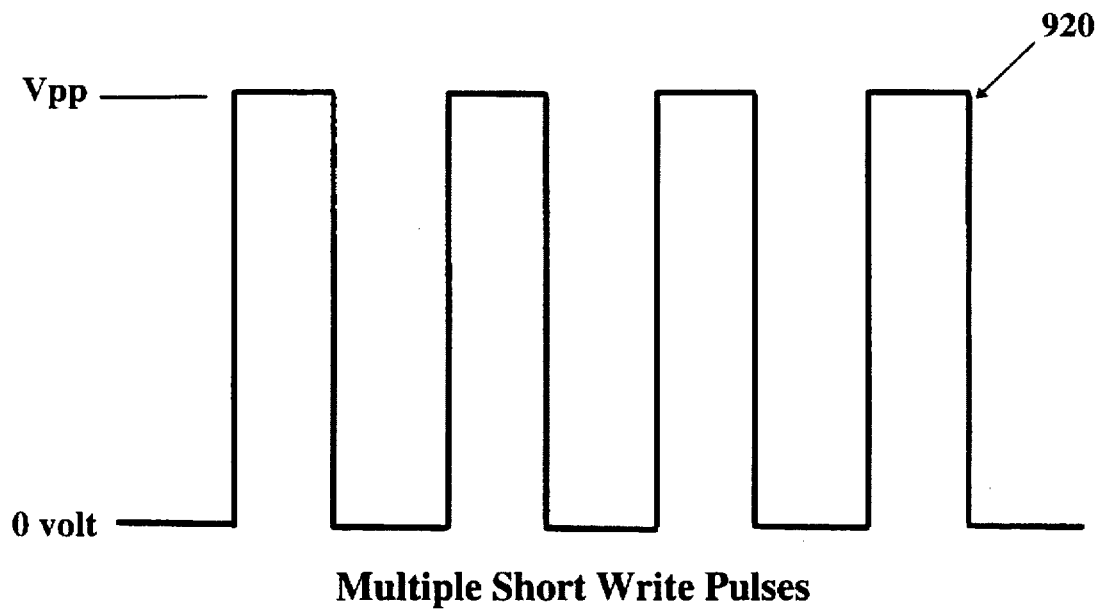
FIG. 9 shows waveforms of short write pulses and a single long write pulse.
Figure 9:
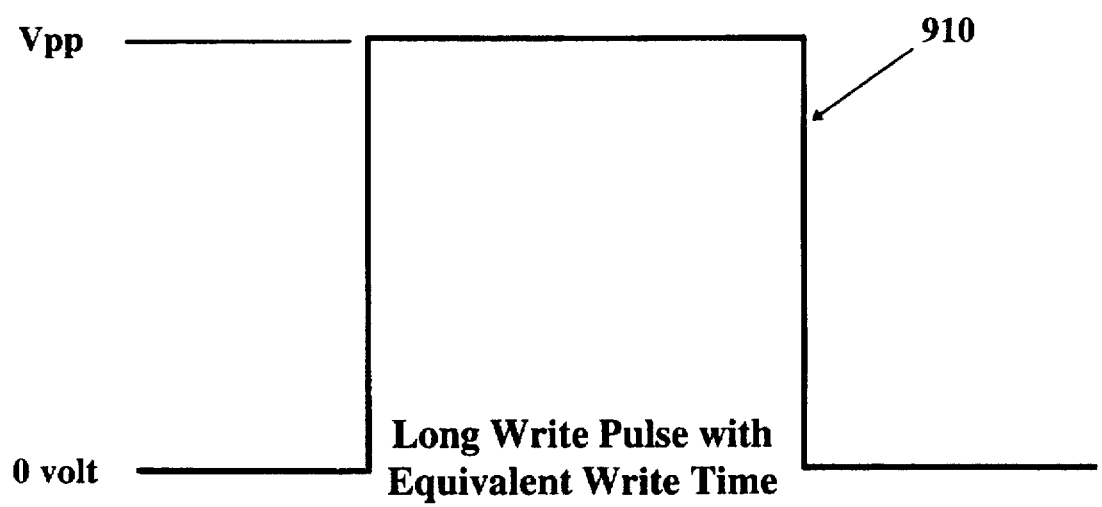

A control gate voltage Vpp for peak CHE injection current for a memory cell depends on the drain voltage, the surface potential, and the vertical electric field in the gate oxide where channel electrons are most energetic. FIG. 8 shows plots 810, 820, and 830 of CHE injection current Igate versus floating gate voltage Vfg for a typical flash EPROM cell having drain voltages Vdrain of 4.5, 5, and 5.5 volts respectively. For each plot 810, 820, and 830, injection current Igate increases with floating gate voltage Vfg until reaching a peak current and then declines. For constant drain voltage Vdrain, the floating gate voltage which causes peak CHE injection current condition occurs during the ramp-up and the ramp-down of control gate voltage Vpp when control gate voltage Vpp is pulsed. Therefore, a single long pulse 910 (FIG. 9) takes longer to achieve a target threshold voltage than does multiple short (less than about 1 μs) pulses 920 with the same total pulse duration.

Figure 10A:
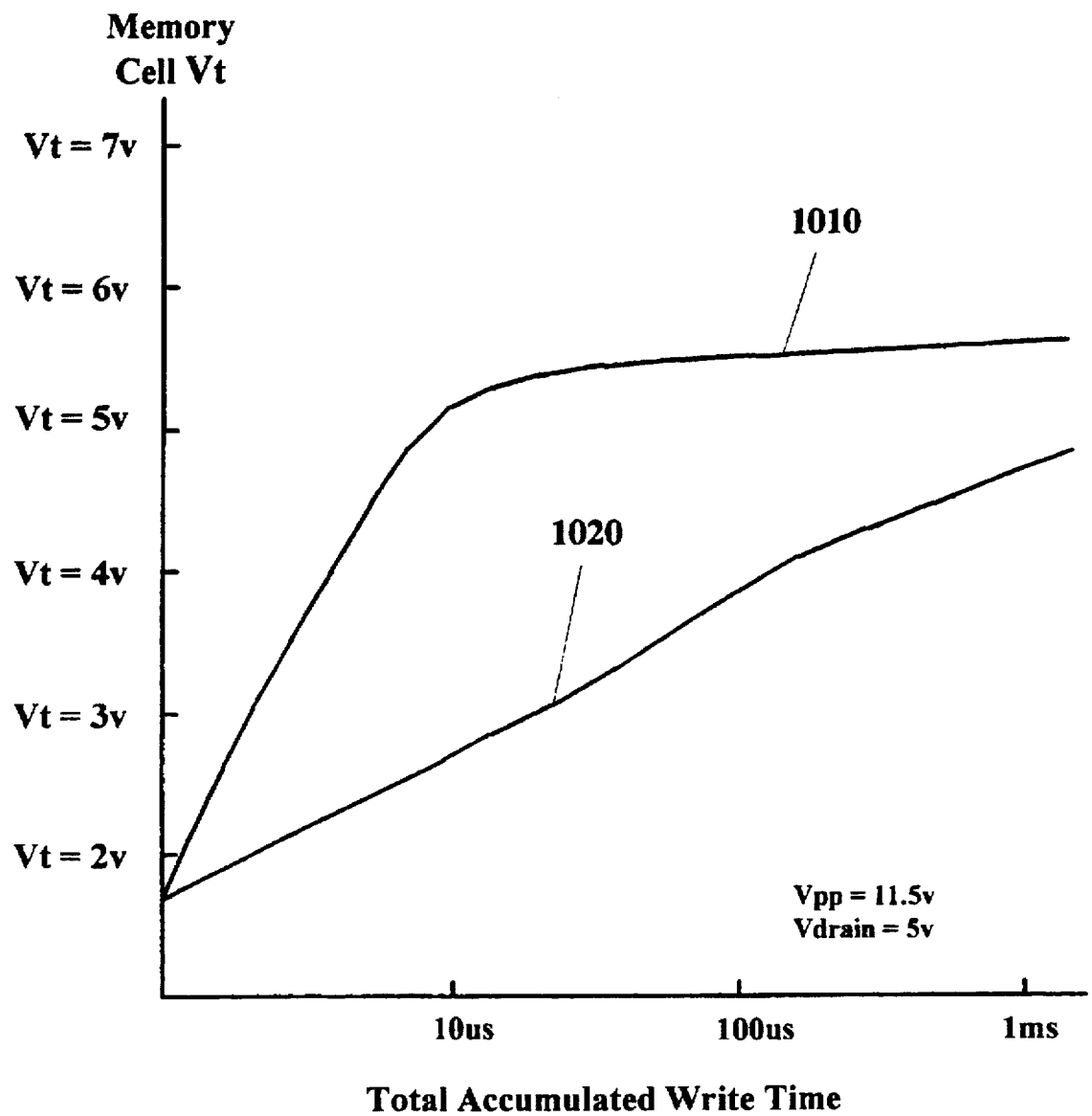
FIGS. 10a, 10b, and 10c respectively show plots of threshold voltage, threshold voltage shift, and the standard deviation of the threshold voltages versus accumulated write time for short and long write pulses.

FIG. 10a shows plots 1010 and 1020 of threshold voltage versus the total accumulated write time for write pulses that are 0.1 μs and 10 μs long respectively applied to a typical memory cell. As shown in FIG. 10a, threshold voltage increases faster when multiple short pulses are applied to a control gate.

Figure 10B:
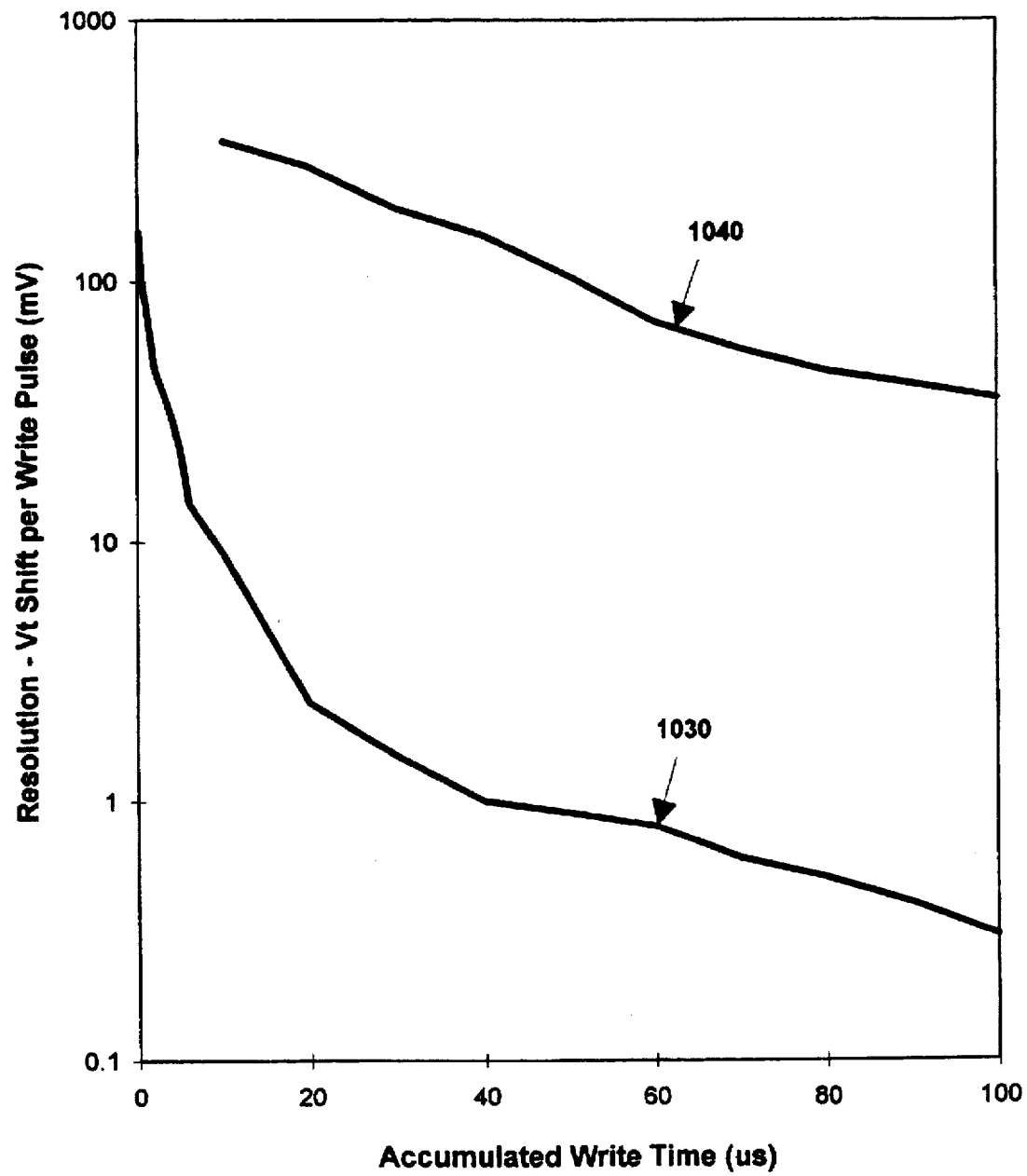

Short write pulses also achieve high resolution in the written threshold voltage Vtt. As the number of pulses increases, the threshold voltage of the memory cell approaches a saturation threshold voltage corresponding to the control gate voltage Vpp, and the number of hot electrons injected per pulse into the floating gate decreases. The threshold voltage change per pulse determines the possible resolution between two consecutive threshold voltages. Row driver size and total resistance and capacitance of the control gates in a row of memory cells determine the minimum charging and discharging times for a row and restrict the shortest write pulses usable for programming a flash EPROM cell. As shown in FIG. 10b, a plot 1030 of the threshold voltage change per pulse for short write pulses of about 0.1 μs decreases more rapidly with accumulated write time than does a plot 1040 of the threshold voltage change per pulse for long write pulses of 10 μs. Accordingly, using shorter write pulses improves the resolution of the threshold voltage written.

Figure 10C:
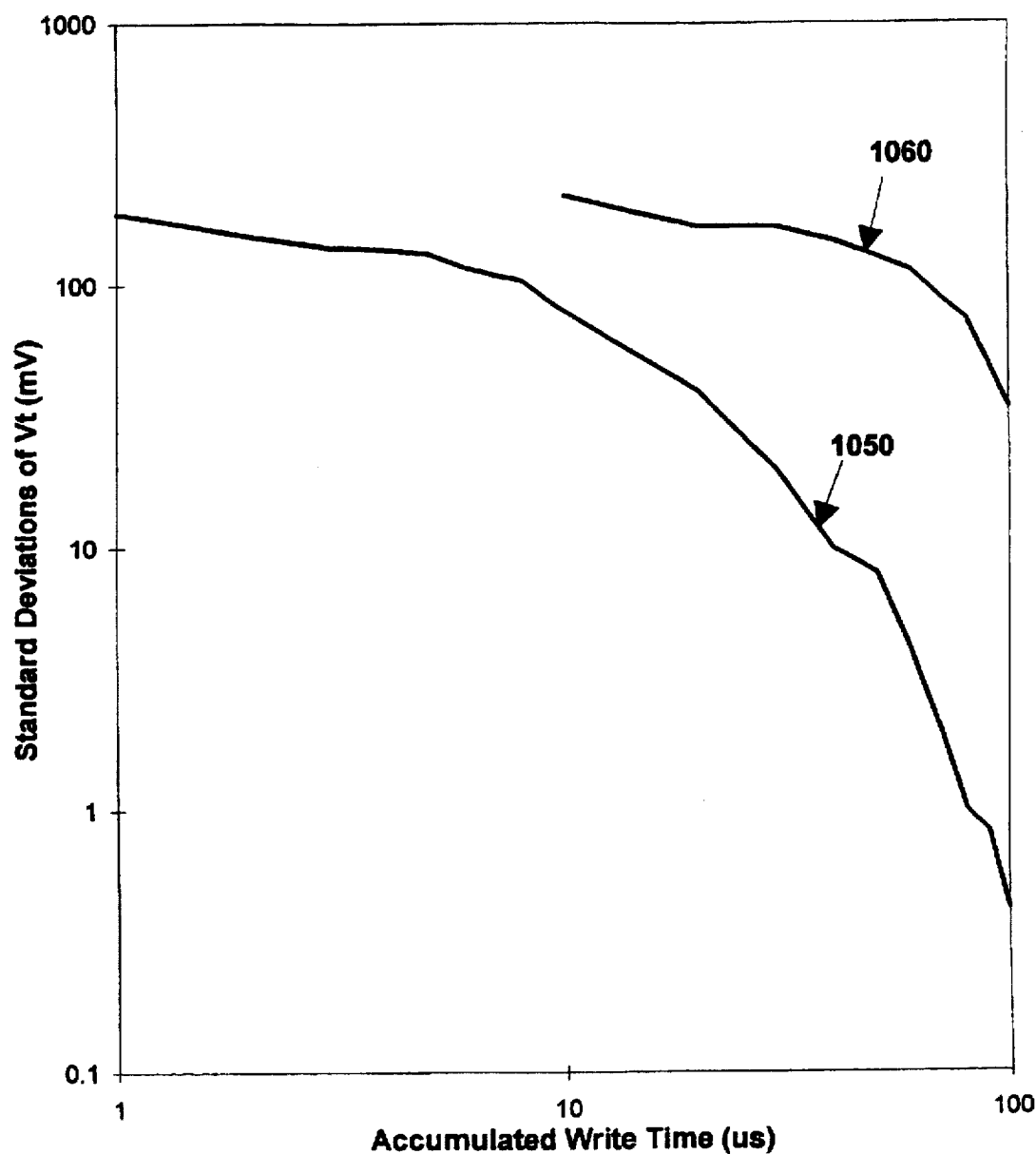

Another advantage of short duration write pulses is that the distribution of the threshold voltages of different cells is tighter with multiple short pulses than with multiple long pulses with the same total pulse duration. FIG. 10c shows experimental plots 1050 and 1060 of the standard deviation of the threshold voltages of a set of memory cells versus accumulated write time for 0.1-μs write pulses and 10-μs write pulses respectively. The standard deviation of threshold voltages drops more quickly with accumulated write time for 0.1-μs pulses than for 10-μs pulses. This can be explained by the higher injection efficiency of shorter pulses and the threshold voltage approaching the saturation threshold voltage faster.

The pulse widths should be selected so that: (1) the target threshold voltage is not exceeded within a small number of pulses; (2) when the threshold voltage approaches the target threshold voltage, each additional pulse injects only a small number of electrons into the floating gate and changes the threshold voltage by less than the desired resolution; and (3)

the total write time including the write pulses and overhead required for the cell to reach the target threshold voltage does not exceed the total available write time for the application of the memory.

For CHE injection, drain voltage Vdrain must be higher than a level which provides hot electrons with energy higher than about 3.2 eV. In one embodiment of this invention, a constant loadline controls drain voltage Vdrain during writing of a flash EPROM cell. A constant loadline impedance does not provide a constant drain voltage Vdrain because control gate voltage Vpp depends on input analog voltage Vanalog, and different control gate voltages cause different currents through the loadline and the memory cell's channel. A constant drain voltage Vdrain is desired during a write to keep threshold voltage change ΔVst proportional to control gate voltage change ΔVpp.

Figure 11A:
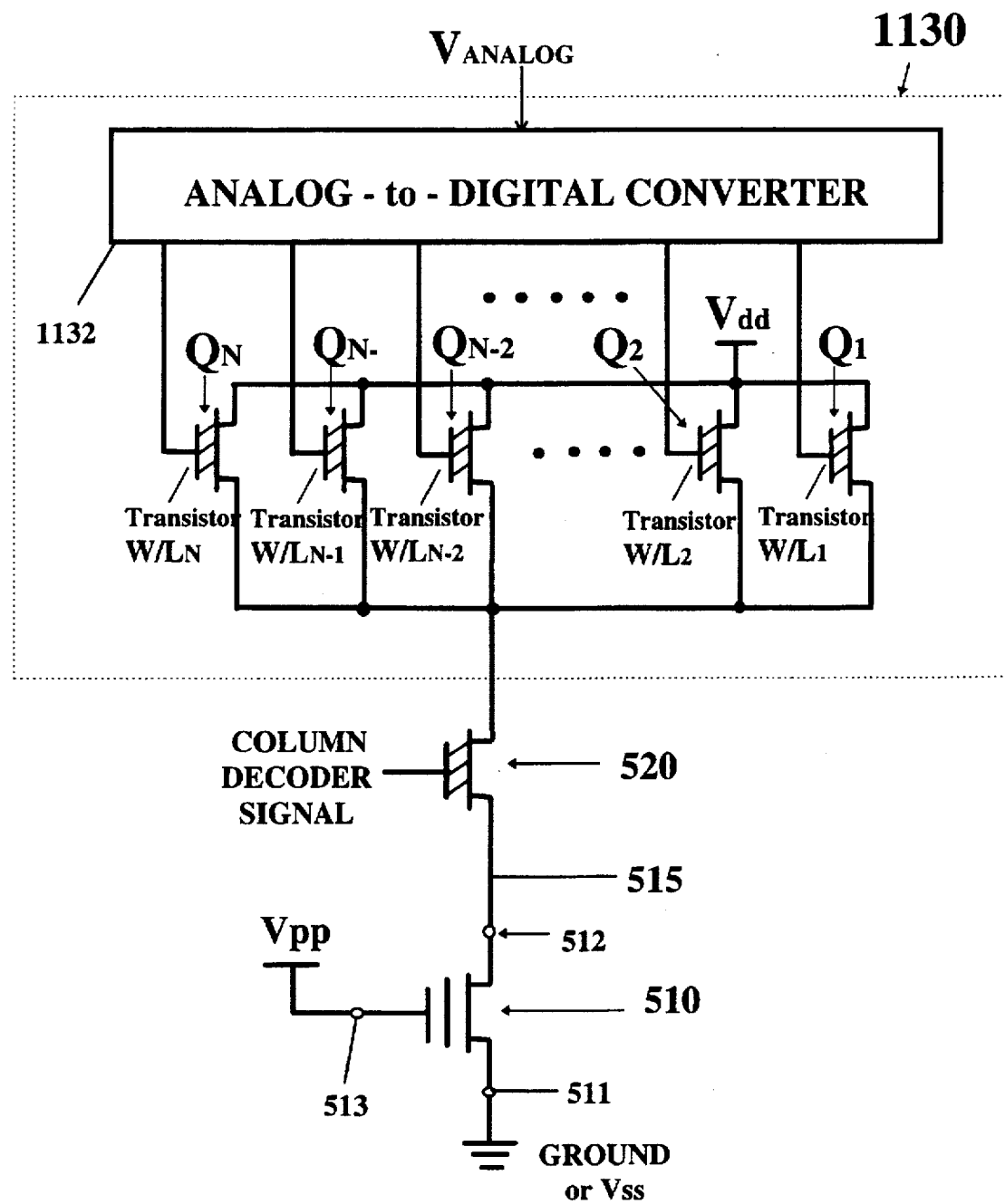
FIGS. 11a and 11b show schematics of write circuitry including variable write loadlines.

A variable loadline can compensate for different currents through a memory cell and maintain a constant drain voltage Vdrain. FIG. 11a shows a variable loadline circuit 1130 having an analog-to-digital converter (ADC) 1132 and a series of P-channel transistors $Q_1$ to $Q_N$ which control the impedance of variable loadline 1130. Transistors $Q_1$ to $Q_N$ have channel widths and lengths selected so that ADC 1132 applies a multi-bit digital representation of voltage Vanalog to the gates of transistors $Q_1$ to $Q_N$ and turns on a combination of transistors which makes the impedance of loadline 1130 proportional to signal Vanalog. For a standard base-two binary representation of voltage Vanalog, each transistors of $Q_2$ to $Q_N$ in the series has twice the impedance (when on) of the preceding transistor $Q_1$ to $Q_{N-1}$.

Figure 11B:
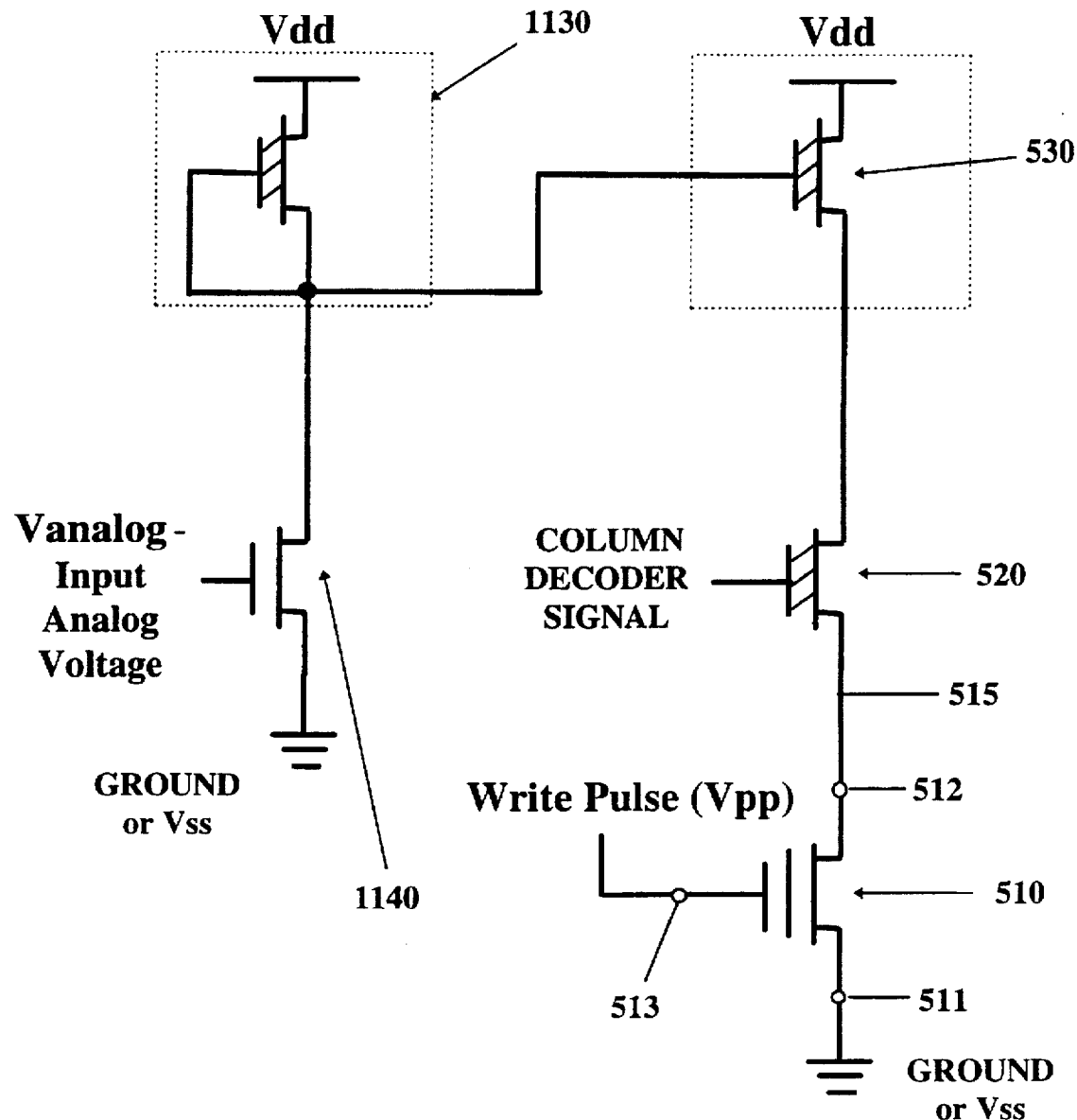
Figure 11C:
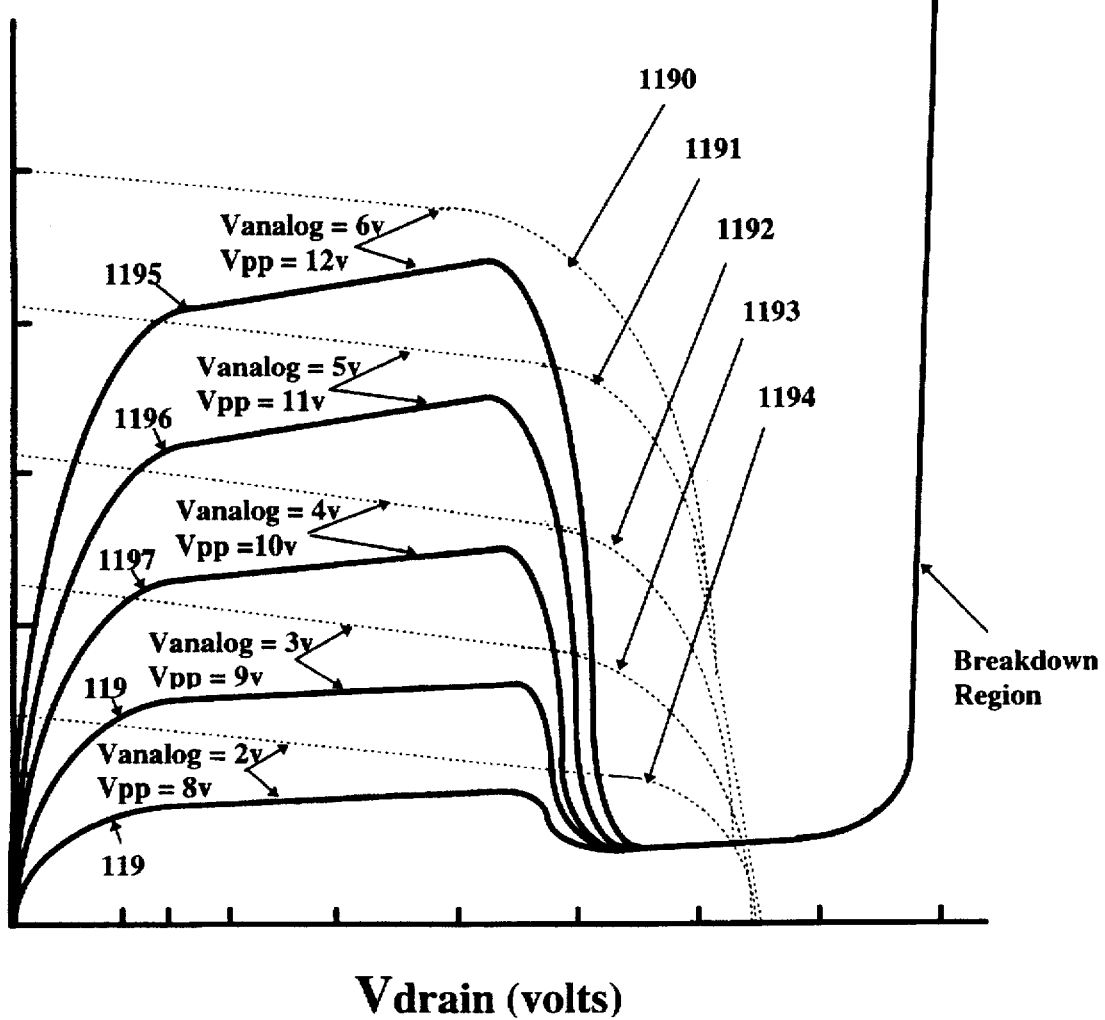
FIG. 11c shows plots of current versus drain voltage for a memory cell and the variable write loadlines of FIGS. 11a and 11b.

FIG. 11b illustrates a current mirror circuit which adjusts the current of pull-up device 530 to track input analog voltage Vanalog. Signal Vanalog is applied to a gate of an N-channel transistor 1140 so that current through transistor 1140 increases with signal Vanalog. A P-channel transistor 1150 has its gate coupled to its drain and to the gate of pull-up device 530 so that the current through pull-up device 530 mirrors current through transistor 1150 and compensates for the reduced resistance of memory cell 510 when control gate voltage Vpp (and signal Vanalog) is high. FIG. 11c shows plots 1195 to 1199 of current versus drain voltage for memory cell 510 in FIGS. 11a and 11b and plots 1190 to 1194 of current versus drain voltage for pull-up device 530 for different control gate voltages Vpp and corresponding analog signals Vanalog.

Minimizing the effects of cell-to-cell structural variations is very important in writing an analog signal. Potential memory cell variations include: (1) variations in physical dimensions such as channel width and length of the memory cell, gate oxide and inter-polysilicon gate oxide thicknesses, floating gate polysilicon and control gate polysilicon thicknesses, field oxide thickness, drain and source junction depths; (2) electrical parameter variations such as mobility and doping concentration of the drain, source, and substrate; (3) parasitic voltage drop due to source and drain resistance; and (4) optical/microloading effects affecting memory cells at or near the edges of a memory array and adjacent to the source line metal straps. Additionally, flash EPROM memory, like other floating gate non-volatile memories, exhibits degradations after many write and erase cycles. These endurance-related degradations include for example changes in write and erase times and write-erase window widening and narrowing due to charge trapping. Many of these variations affect a memory cell's saturation threshold voltage Vst and cause the write and read characteristics of flash EPROM cells to vary across a memory array, from one die to another across a wafer, and from one wafer lot to another.

To compensate for cell-to-cell variations and endurance-related degradations and still achieve the necessary resolution of threshold voltages, a write process with feedback can be employed. For example, between write pulses, a flash EPROM performs a verify cycle to determine whether a target threshold voltage Vtt has been reached. The verify cycle reads the memory cell and compares an output voltage Vout read to analog signal Vanalog. When output voltage Vout equals analog signal Vanalog, the target threshold voltage Vtt has been achieved, and further writing is inhibited, for example, by stopping the pulsing of the control gate, or removing the high voltage from the drain, or both.

Figure 12A:
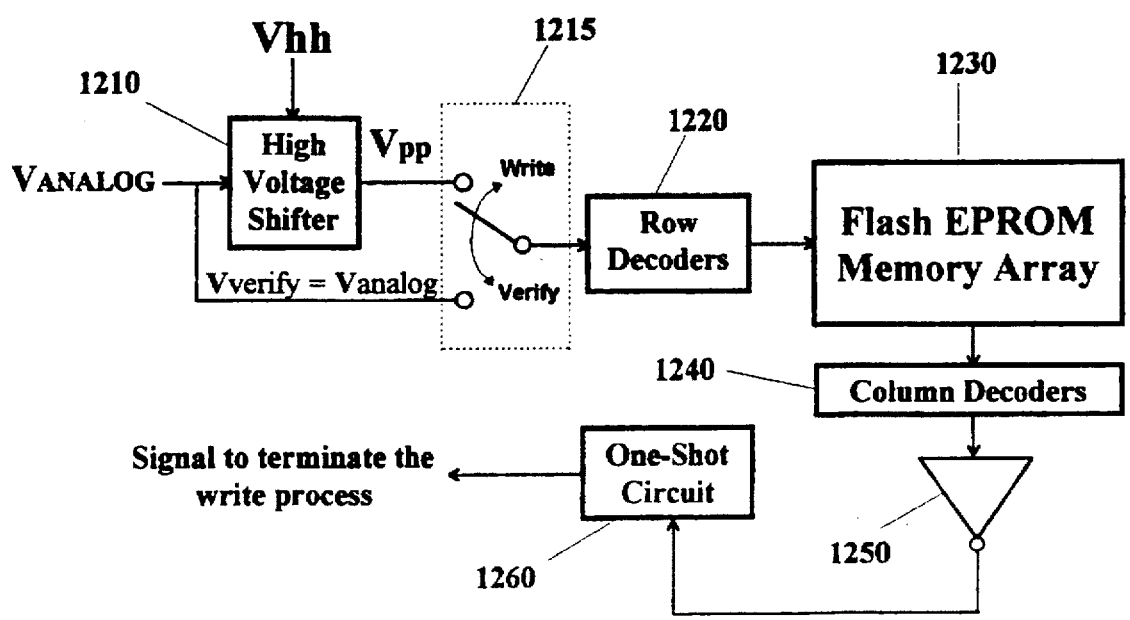
FIGS. 12a and 12b are block diagrams of write and verify paths in accordance with two embodiments of this invention.

FIG. 12a shows a block diagram of write and verify paths for an embodiment of this invention where the target threshold voltage Vtt of a selected memory cell equals analog signal Vanalog. In FIG. 12a, a voltage shifter 1210 generates a control gate write voltage Vpp from signal Vanalog. Voltage Vpp and signal Vanalog are asserted to input terminals of a multiplexer 1215. Multiplexer 1215 has an output terminal connected to a conventional row decoder 1220 and alternates between selecting voltage Vpp as output signal during write pulses and selecting signal Vanalog as output signal during verify cycles. Row decoder 1220 drives the control gates of the row in flash EPROM array 1230 containing the selected memory cell.

During a write pulse, the control gate of the selected memory cell is at voltage Vpp. The source is grounded, and drain voltage Vdrain of the selected memory cell is at the level which produces electrons with enough energy to reach a floating gate of the selected memory cell and increase the threshold voltage of the selected memory cell.

Figure 13:
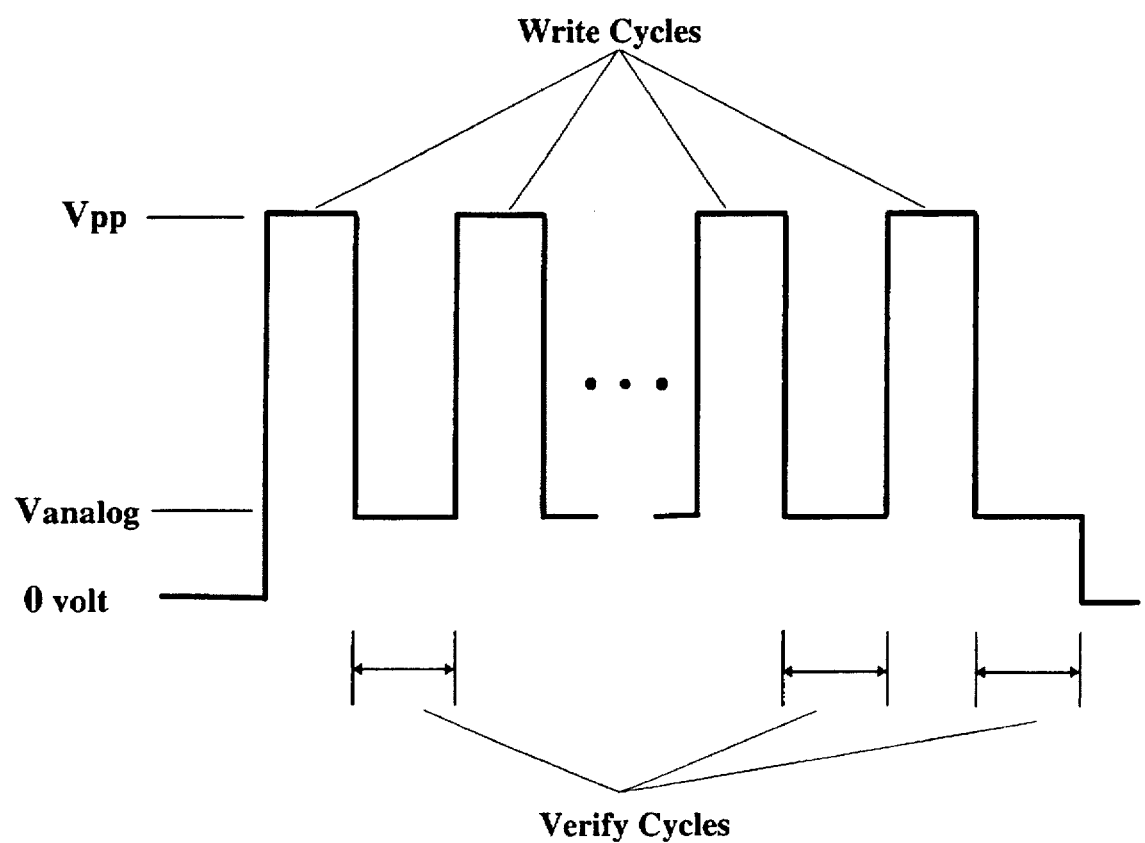
FIG. 13 shows a voltage waveform applied to the control gate of a flash EPROM cell during write and verify cycles.

During a verify cycle, the control gate voltage of the selected memory cell equals signal Vanalog, and source and drain voltages are set for reading the selected cell. For example, the drain is at about 1.5 volts, and the source is grounded. A conventional column decoder 1240 and an inverting sense amplifier 1250 determine if signal Vanalog causes the selected memory cell to conduct and asserts to a one-shot circuit 1260 a signal that indicates whether the threshold voltage of the selected memory cell is lower than signal Vanalog. If the signal indicates the threshold voltage exceeds signal Vanalog, further writing is inhibited. FIG. 13 shows a typical voltage waveform asserted to the control gate of the selected flash EPROM cell during the write and verify cycles.

Figure 14:
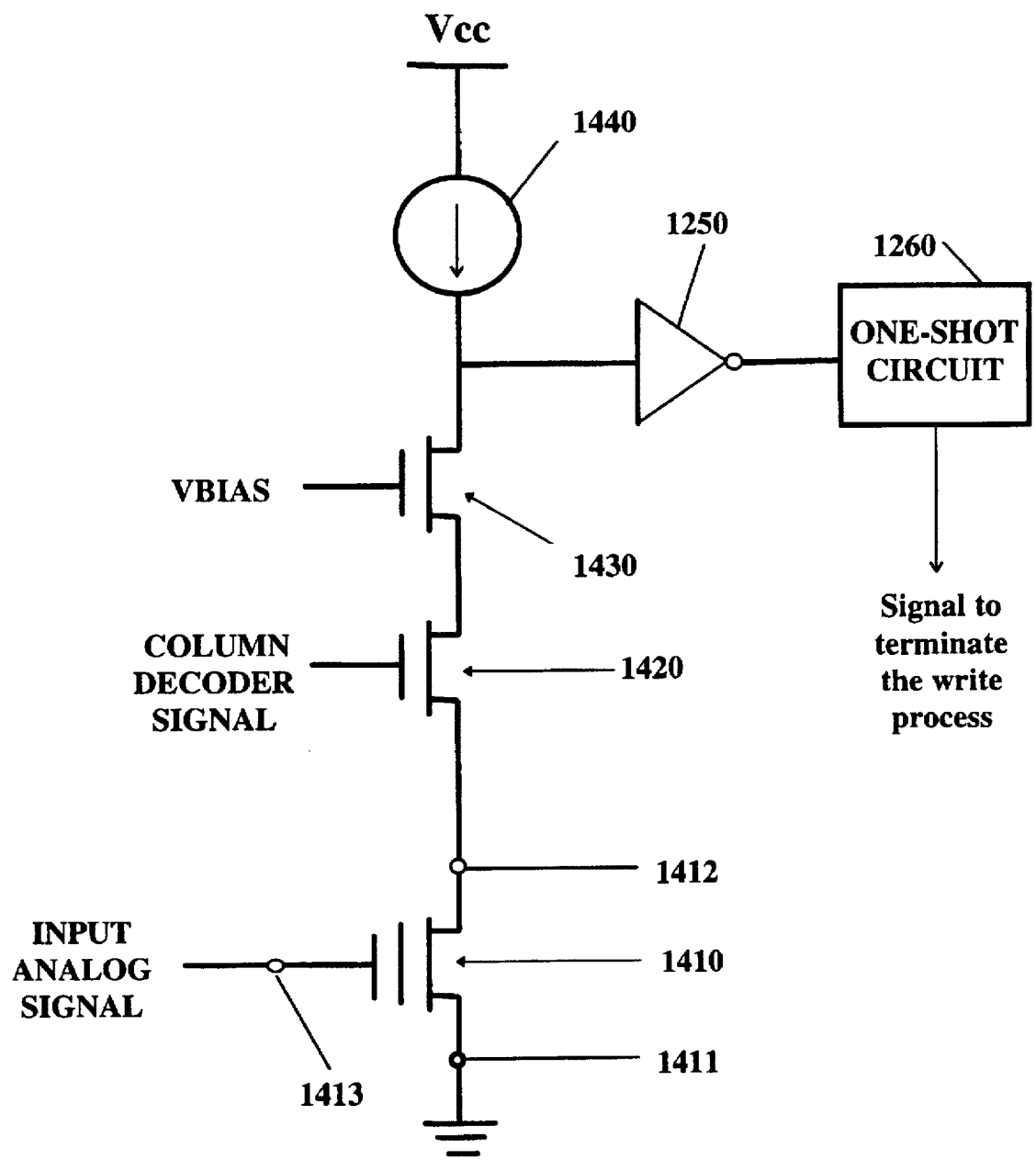
FIG. 14 is a schematic of an embodiment of verify circuitry in accordance with this invention.

FIG. 14 shows verify circuitry which biases and reads a selected floating gate non-volatile memory cell 1410 during a verify cycle. Additional circuitry (not shown but well known) generates the drain voltage of memory cell 1410 during a write pulse. During a verify cycle, a drain 1412 of selected memory cell 1410 is pulled up by a weak current source 1440. A cascoding device 1430 gated with a bias voltage Vbias limits drain voltage Vdrain of drain 1412 to less than about 1.5 volts to avoid a read disturb. If drain voltage Vdrain is more than about 1.5 volts for an extended period of time, some electrons, aided by the electric field caused by drain voltage Vdrain, escape from the floating gate of memory cell 1410 and reduce the threshold voltage of memory cell 1410.

Before target threshold voltage Vtt is attained, signal Vanalog being applied to control gate 1413 of selected memory cell 1410 causes memory cell 1410 to conduct. Thus drain 1412 discharges through memory cell 1410 during the verify cycle. The voltage on drain 1412 stays high when cell 1410 reaches a threshold voltage Vt which equal or exceeds signal Vanalog. A conventional inverting, sense amplifier 1250 and one-shot circuit 1260 monitor drain voltage Vdrain on drain 1412 during each verify cycle. One-shot circuit 1260 trips when the voltage on drain 1412 stays high, which signals the threshold voltage of memory cell 1410 equals or exceeds target threshold voltage Vtt. One-shot circuit 1260 prevents further pulsing of control gate 1413 at voltage Vpp, or alternately, disables a write loadline such as 1130 (FIG. 11a) or 530 (FIGS. 5a and 11b) to stop the writing.

Figure 12B:
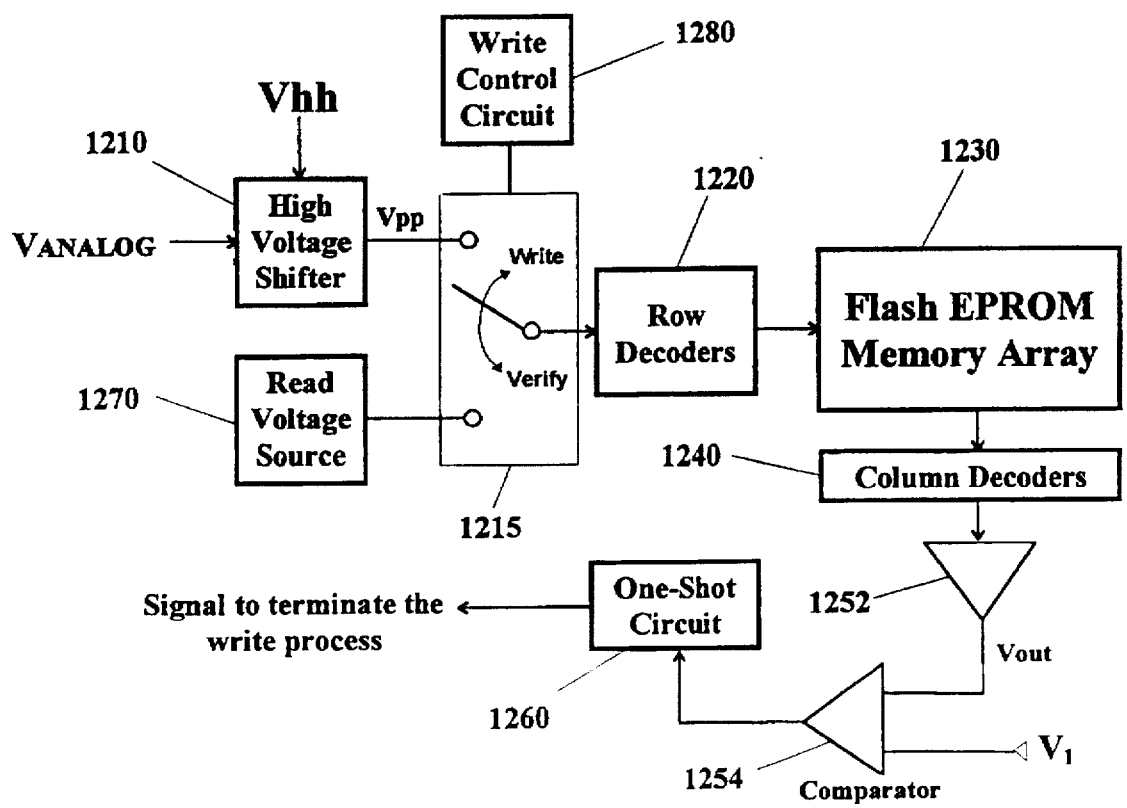

FIG. 12b shows an alternative write path which uses read circuitry 1252 and 1270 during verify cycles. Read circuitry 1270 and 1252 respectively drive a control voltage of a selected memory cell and generate a voltage Vout indicating the value stored in the selected memory cell. Several alternative embodiments for read circuits 1270 and 1252 are disclosed below and circuits 1270 and 1252 can perform both read operations and verify cycles of write operations.

During a write operation, a write control circuit 1280 controls which of high voltage shifter 1210 and read voltage source 1270 drives the control gate of the selected memory cell. During write pulses, high voltage shifter 1210 asserts voltage Vpp to the control gate, and the threshold voltage of the selected memory cell increases. During verify cycles, read voltage source 1270 asserts a voltage to the control gate for reading the selected memory cell. Other circuits (not shown in FIG. 12b) drive the drain and source voltages for increasing the threshold voltage during write pulses and for reading the cell during verify cycles.

During a verify cycle, read circuit 1252 reads the threshold voltage of the selected cell and asserts to an input terminal of a comparator 1254 a voltage Vout indicating the value stored in the selected cell. A signal V1 that has a one-to-one correspondence with analog signal Vanalog is applied to a second input terminal of comparator 1254. Comparator 1254 trips one-shot circuit 160 when voltage Vout is first greater than or equal to signal V1. When one-shot circuit 1260 is tripped, voltage Vout read from the selected memory cell equals signal V1 to within a resolution defined by the change in threshold voltage per write pulse, and one-shot circuit 1260 generates a signal to terminate the write process. Signal Vanalog is determined from the one-to-one correspondence with signal V1, and writing is terminated by stopping further write pulses, stopping channel current through the selected cell, or stopping both write pulses and channel current.

Figure 15A:
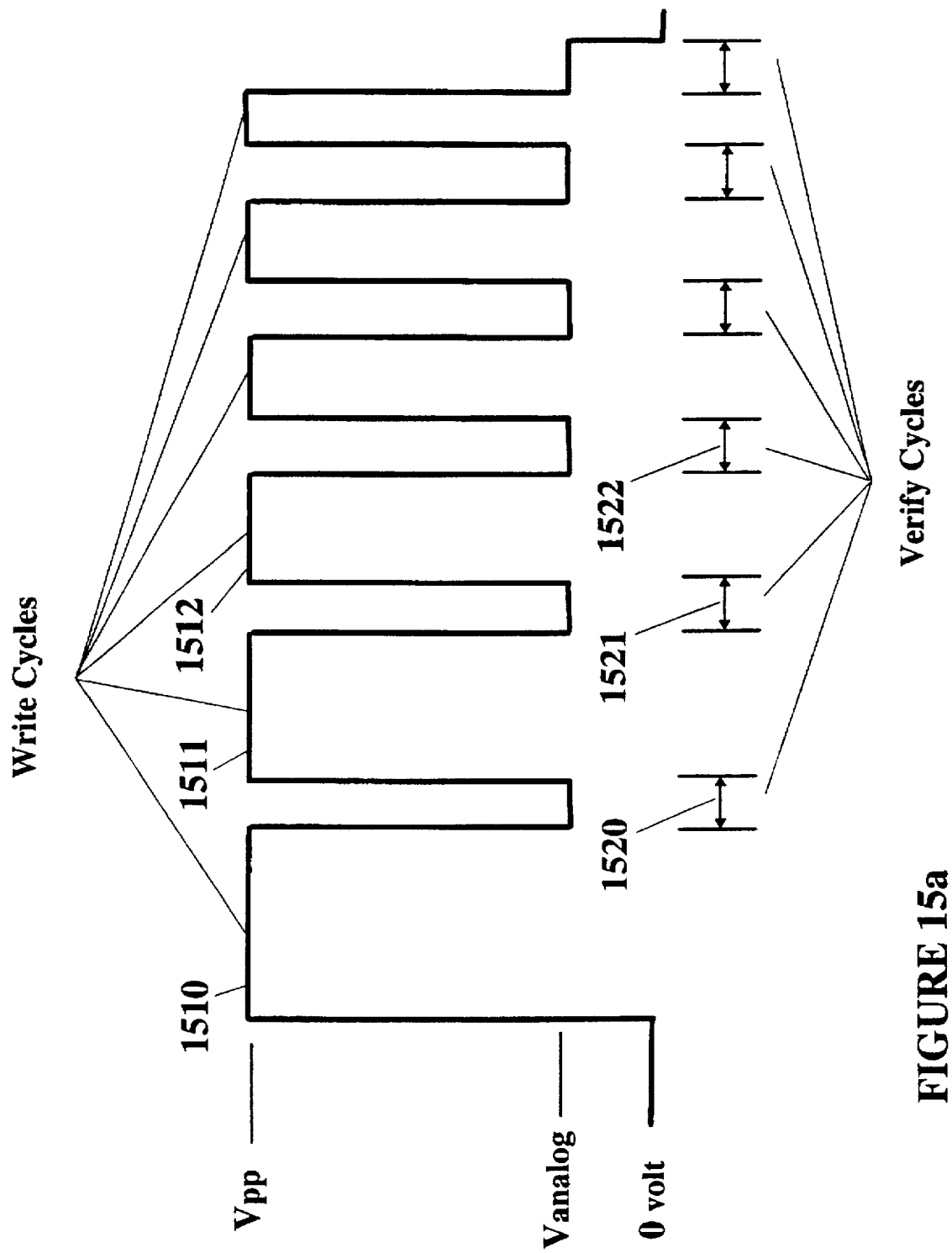
FIGS. 15a, 15b, 15c, 15d, 15e, 15f, 15g, 15h, and 15i show write and verify cycles in accordance with embodiments of this invention.

The verify cycles and ramping time for the control voltage constitute an overhead for writing to a memory cell. There are several ways to reduce this overhead and increase writing speed. First, write pulses and verify cycles do not need to be uniform in size. FIGS. 15a through 15i show examples of waveforms for write pulses and verify cycles. FIG. 15a shows a waveform where write pulse widths decrease as the memory cell's threshold voltage approaches the target threshold voltage Vtt. This reduces the number of verify cycles when the cell's threshold voltage is far from the target threshold voltage but retains the improved resolution and frequent verify cycles when the threshold voltage nears the target Vtt.

Figure 15B:
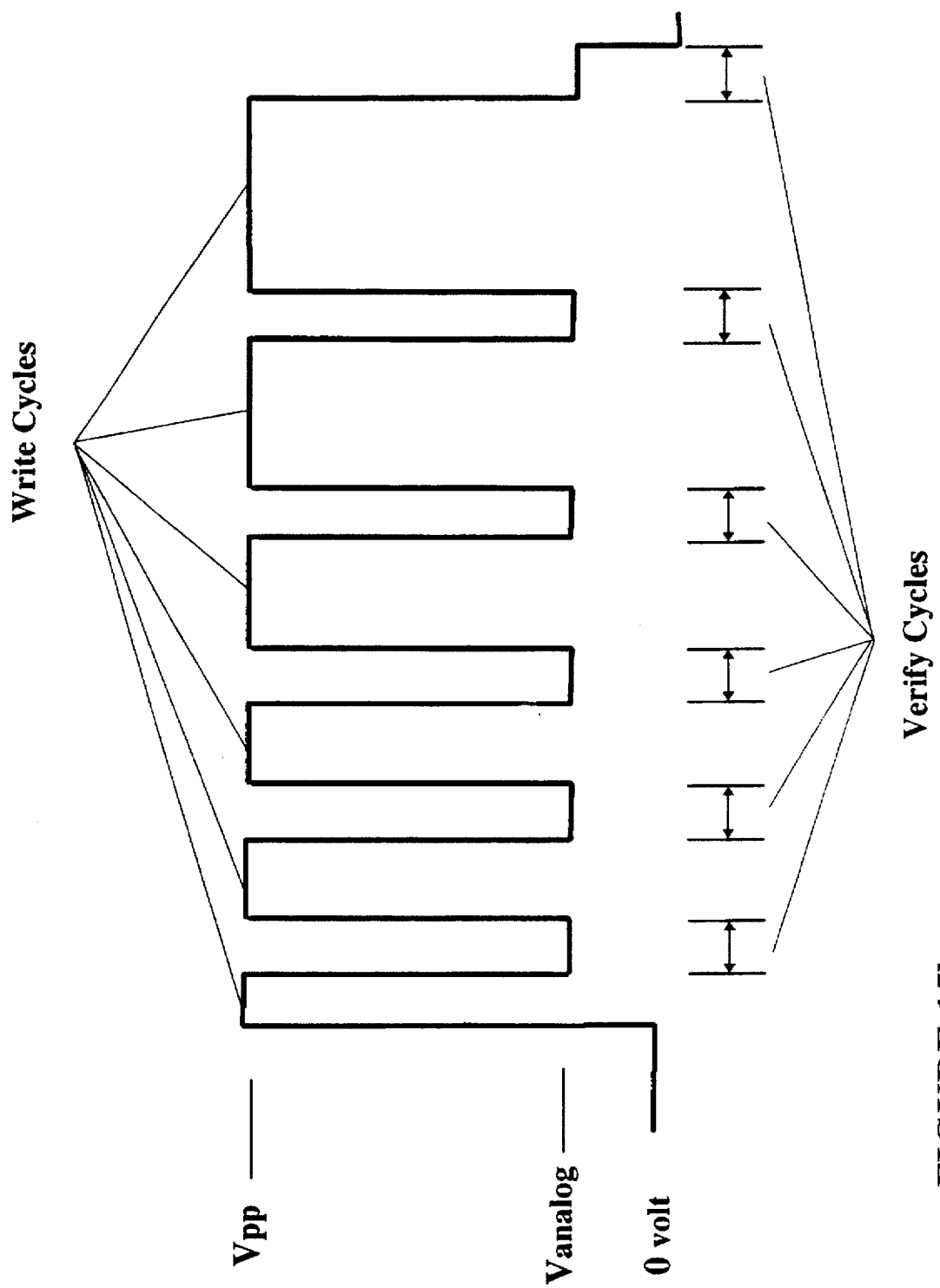
Figure 15C:
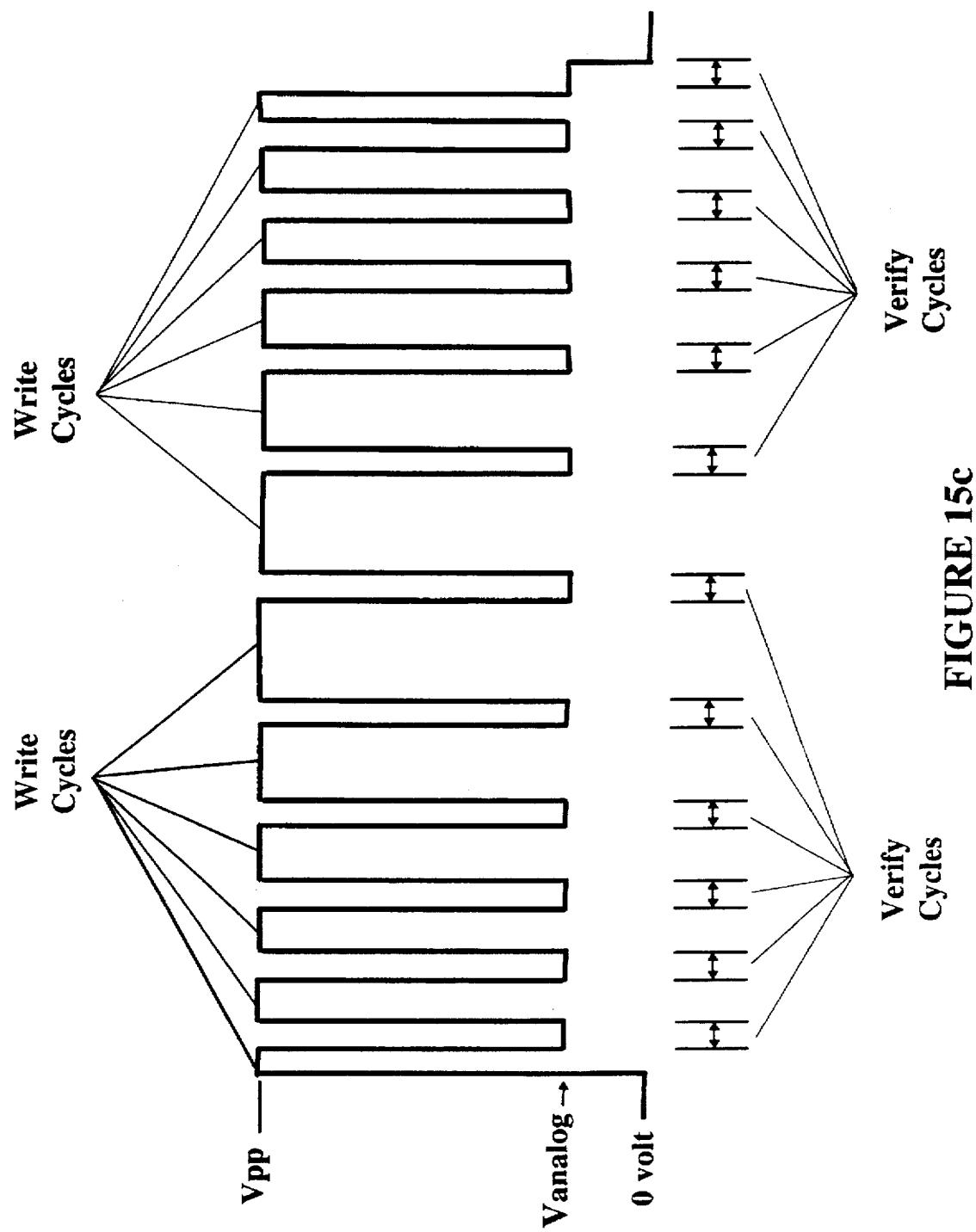

FIG. 15b shows a waveform which increases the duration of write pulses with time. FIG. 15c shows a waveform which increases then decreases the duration of write pulses to use the higher efficiency of short write pulse at the beginning of a write, reduce the number of verify cycle in the middle of the write, and increase the number of verify cycles at the end of a write.

Figure 15D:
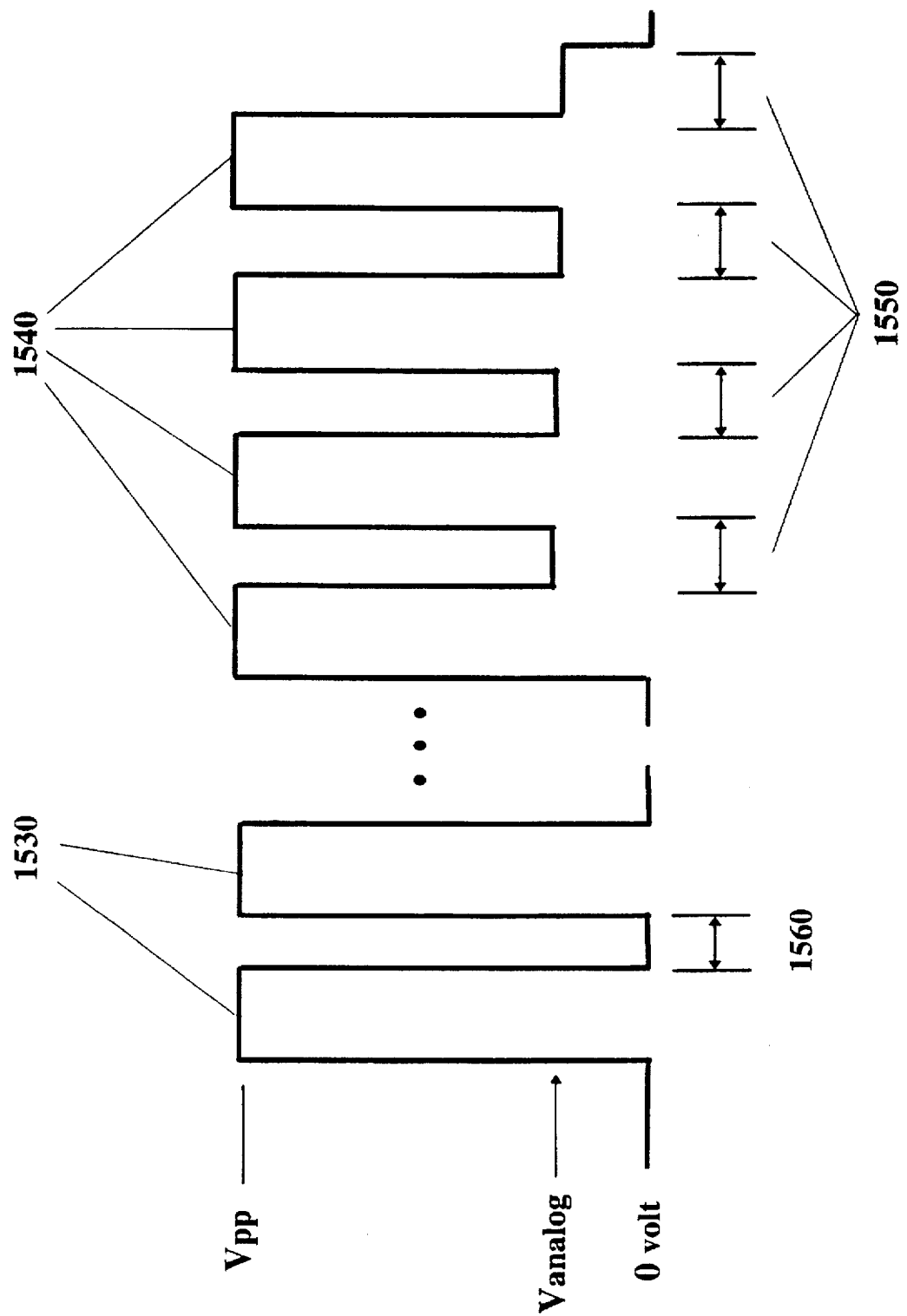

FIG. 15d shows a waveform which disables verify cycles 1560 between initial write pulses 1530 and enables verify cycles 1550 between the subsequent write pulses 1540. Total waveform of FIG. 15d reduces write time because dormant times 1560 between initial write pulses 1530 can be shorter than the time required for verify cycles 1550.

Figure 15E:
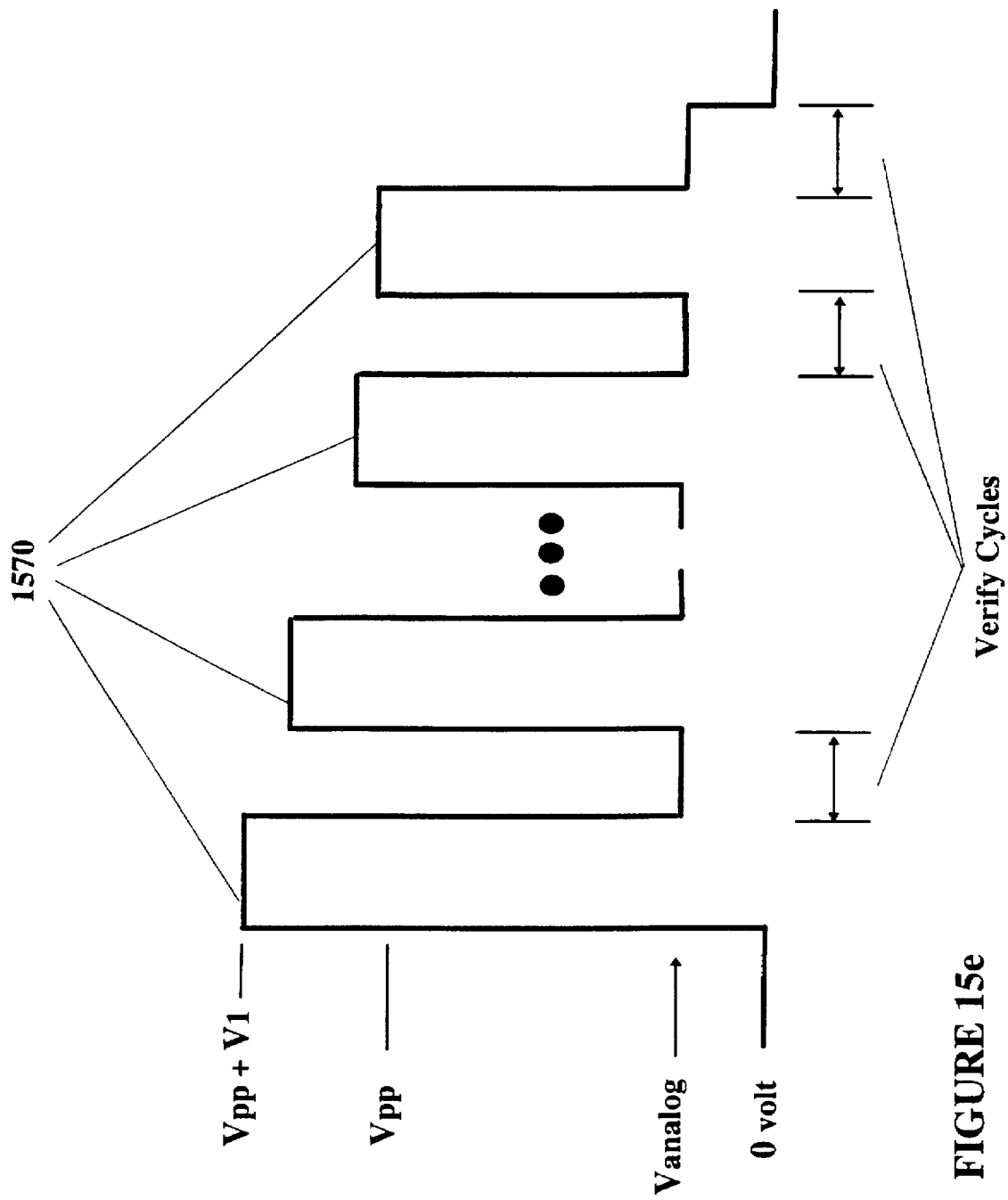
Figure 15F:
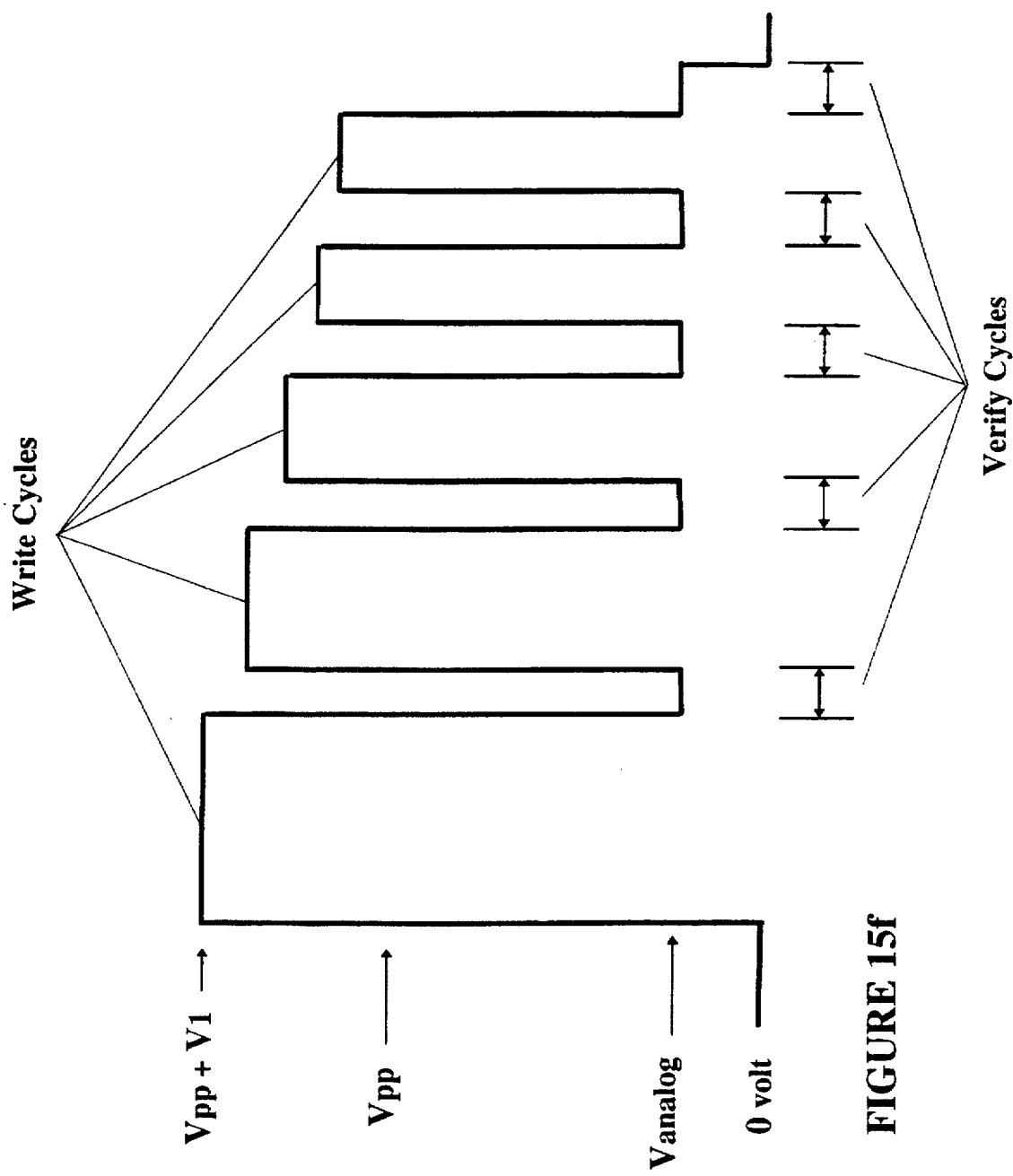
Figure 15G:
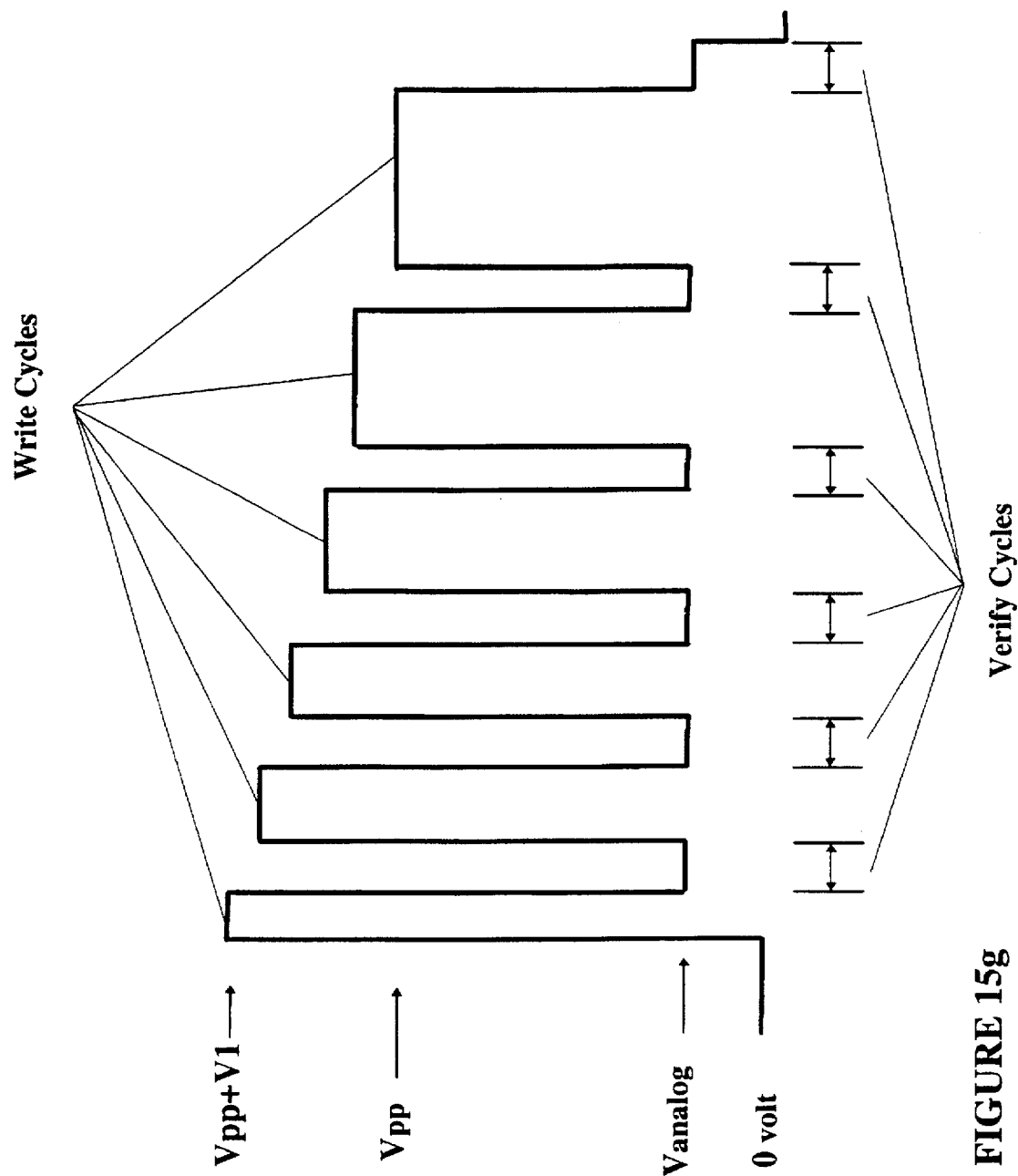
Figure 15H:
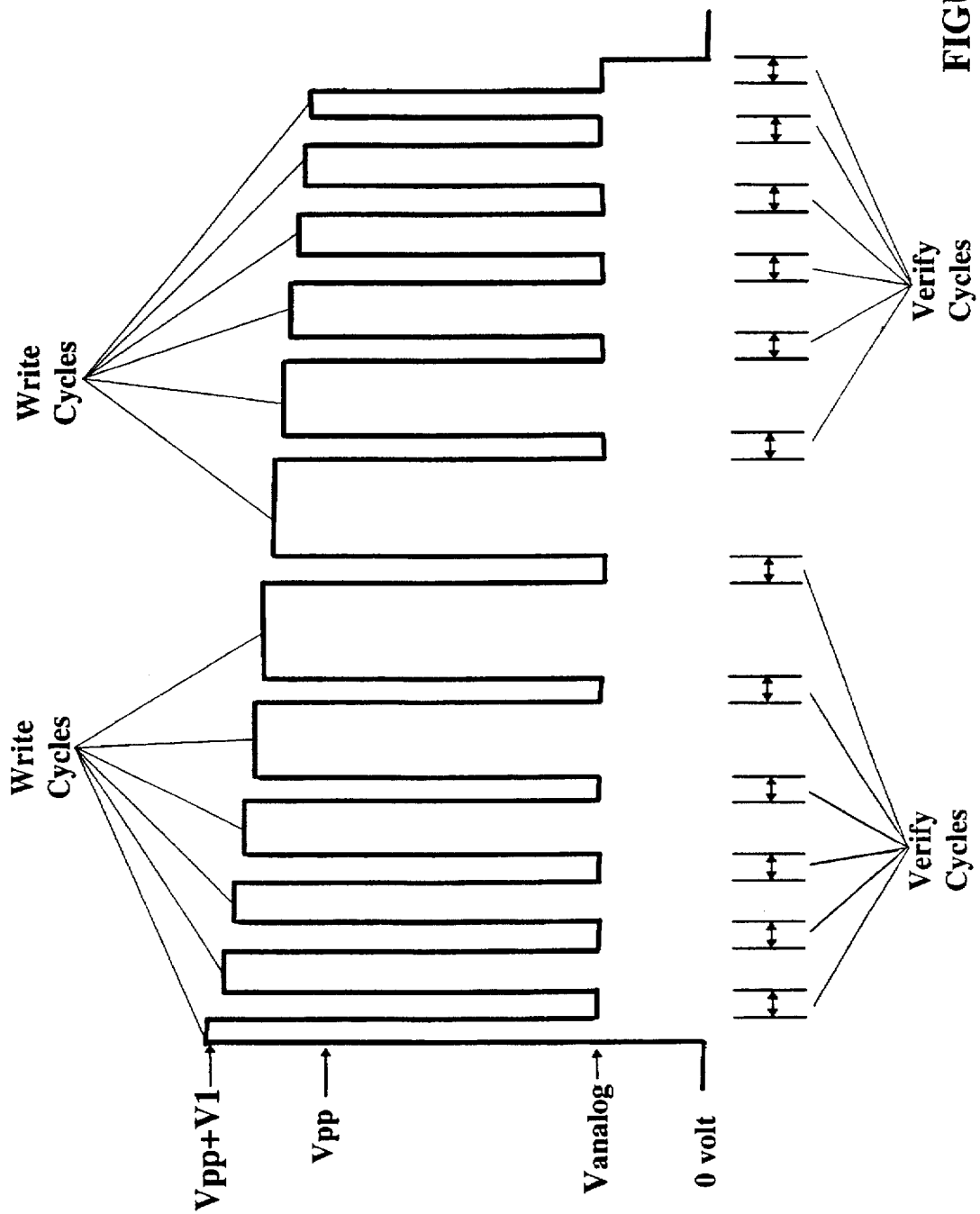

FIG. 15e illustrates a waveform with initial write pulses 1570 having peak voltage above level Vpp which provides target threshold voltage Vtt. The initial write pulses write a memory cell faster, and are reduced in magnitude before the threshold voltage is driven over the target threshold voltage Vtt. FIG. 15f shows a waveform that has initial write pulses have higher peak voltage and longer duration than subsequent write pulses. FIGS. 15f through 15h illustrate a variety of ways to vary both the peak voltage and the duration of the write pulses.

Figure 15I:
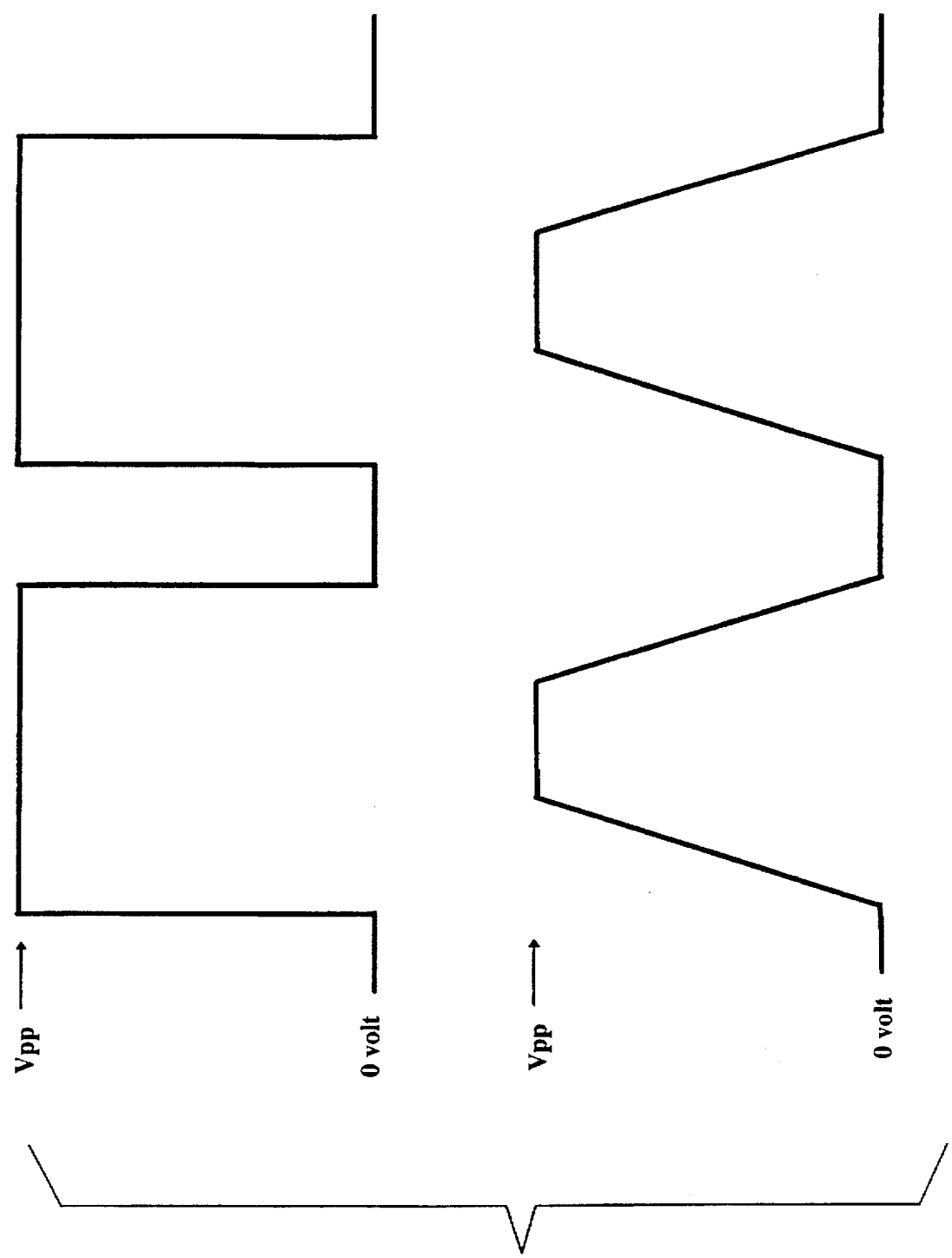

FIG. 15i illustrates that besides varying the write pulse width and the peak voltage, the shape of the write pulses can be altered. For example, increasing the ramp-up and ramp-down times (i.e. decreasing the ramping rates) of the write pulses keeps a memory cell near peak CHE injection current longer.

The minimum amount of time required for a write pulse is determine by how fast a memory array row driver can charge and discharge a row line. In some memory arrays, row lines have resistance and capacitance such that the minimum duration write pulse increases the threshold voltage of a memory cell more than the desired resolution. One way to reduce the effective write pulse width is to supply the drain with a fixed charge Q per write pulse instead of maintaining a constant drain voltage during the entire duration of the write pulse.

Figure 16A:
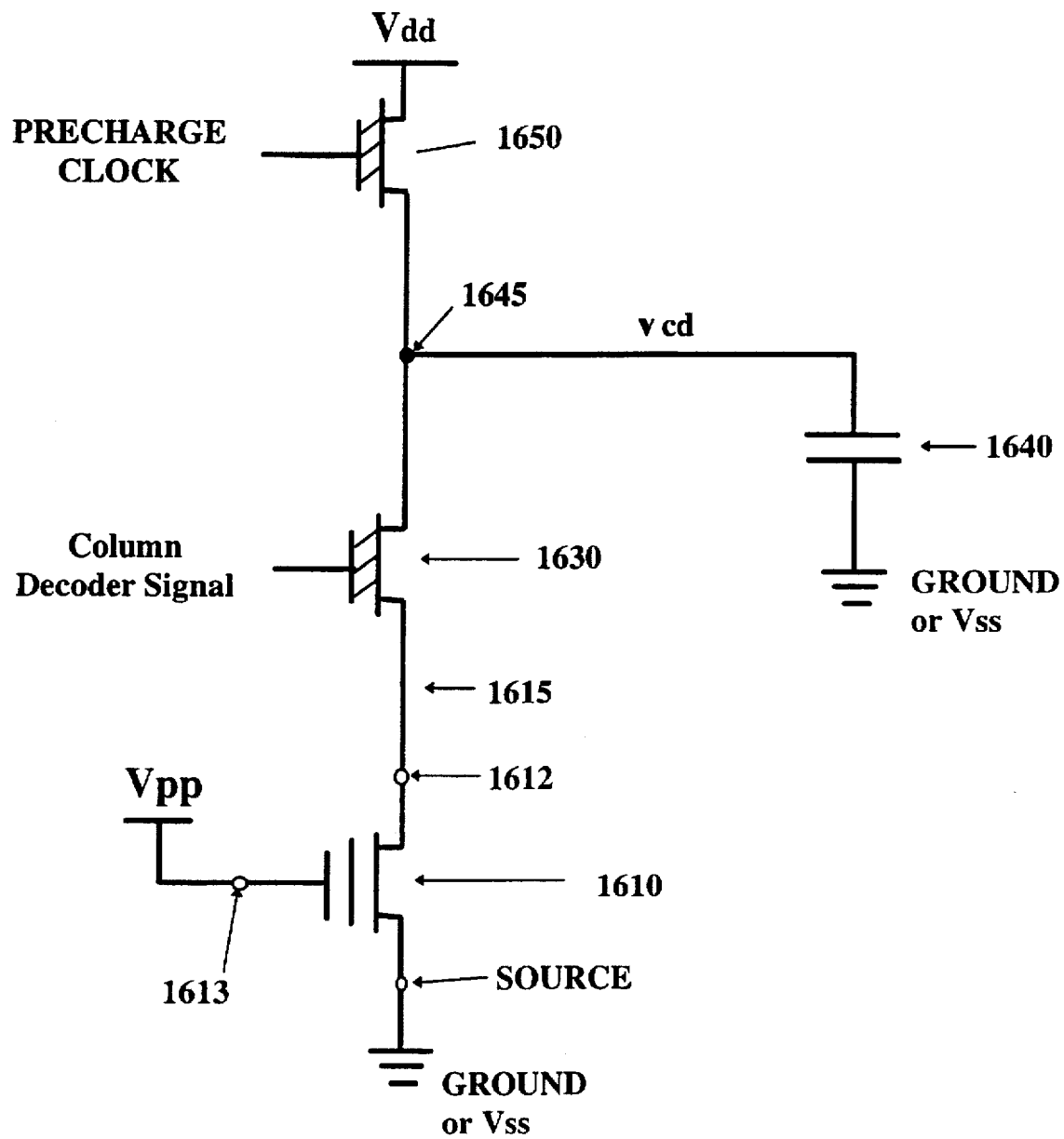
FIG. 16a is a schematic of write circuitry which generates fixed charge write pulses in accordance-with an embodiment of this invention.

FIG. 16a shows an embodiment of this invention that limits the total charge which flows through a selected memory cell 1610 during a write pulse. Before each write pulse, a P-channel transistor 1650 and a column decode device 1630 connect a voltage Vdd to a capacitor 1640 and to a drain of memory cell 1610. Voltage Vdd is high enough to provide hot channel electrons and depends on the structure of memory cell 1610. Typically, voltage Vdd is independent of the supply voltage Vcc and is supplied by a high voltage charge pump.

Figure 16B:
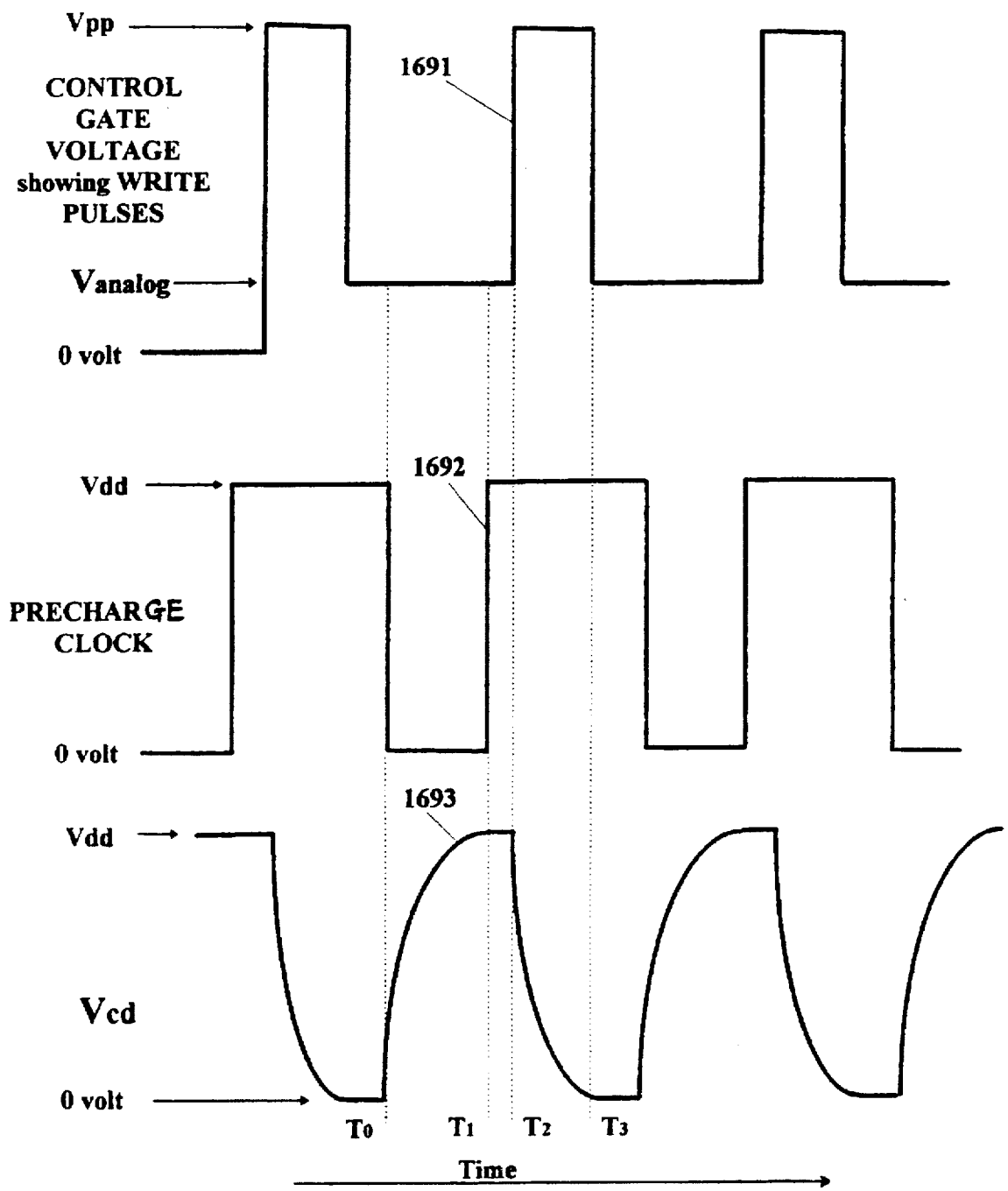

FIG. 16b shows an example write pulse 1691 used in the embodiment of FIG. 16a. At a time T0, before write pulse 1691 is asserted to a control gate 1613 of selected memory cell 1610, a signal PRECHARGE CLOCK turns on P-channel transistor 1650 which connects voltage Vdd to a node 1645 and a capacitor 1640. Node 1645 and capacitor 1640 can be connected through a column decoder including decode device 1630 to any column in a block of a memory array (not shown) which contains memory cell 1610. Column decoder device 1630 connects node 1645 and capacitor 1640 to drain 1612 of selected memory cell 1610.

At a time T1, P-channel transistor 1650 disconnects voltage Vdd from capacitor 1640 and node 1645. Node 1645 is charged to an initial drain voltage Vdrain about equal to voltage Vdd. At a time T2, write pulse 1691 begins, and memory cell 1610 discharges drain 1612 to a low level (about 0 volts in FIG. 16b). Capacitor 1640 and the capacitance of circuitry coupled to drain 1612 and node 1645 control the rate at which drain voltage Vdrain decreases. Even when control gate 1613 stays at a high voltage Vpp, CHE injection stops when drain voltage Vdrain drops below a critical level required for providing hot electrons in the channel of memory cell 1610. This effectively generates short duration write pulses and achieves a high threshold voltage resolution. At time T3, when drain 1612 is nearly discharged, the voltage on control gate 1613 falls to voltage Vanalog, and a verify cycle is performed.

Figure 16C:
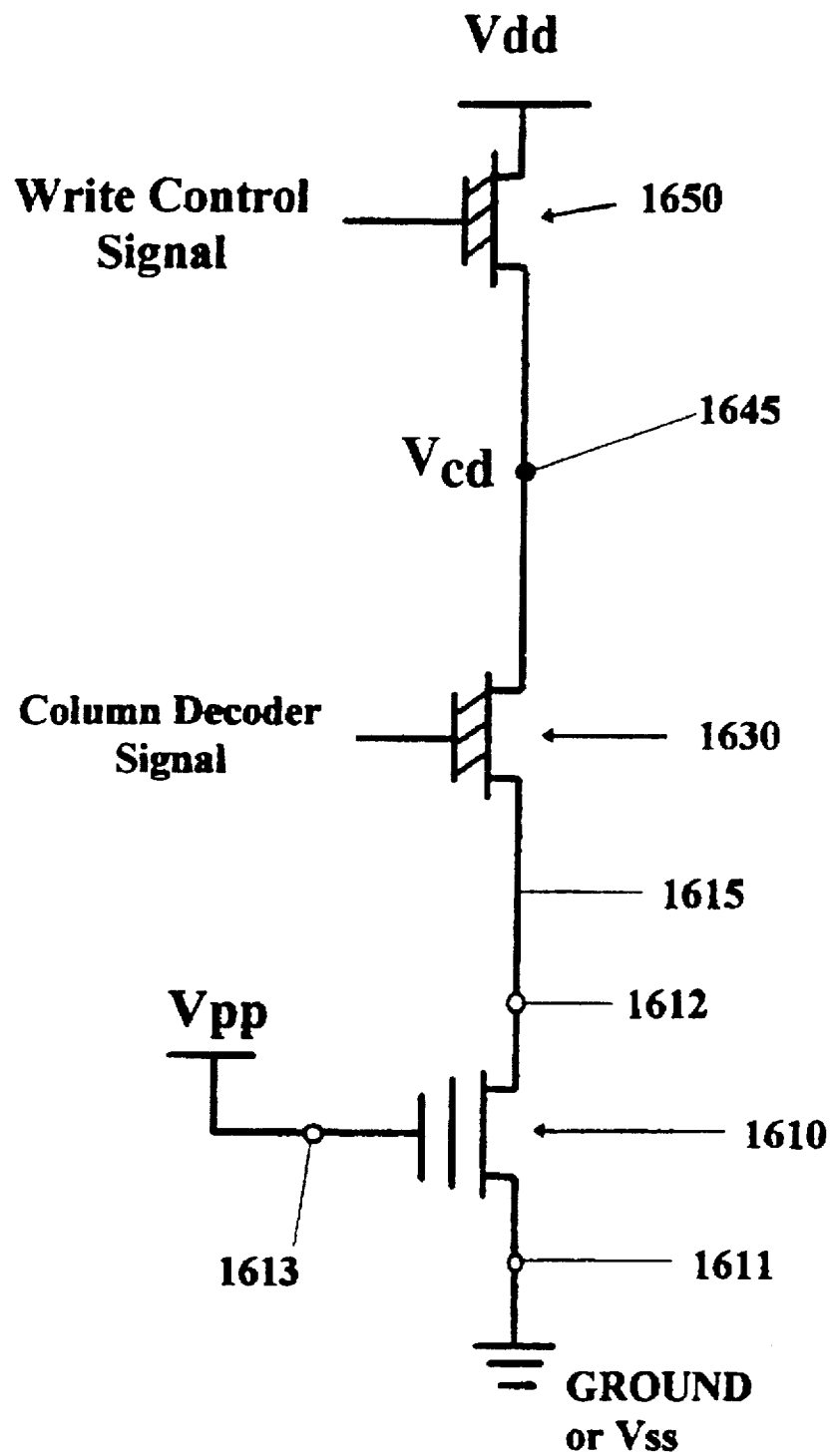
FIG. 16c is a schematic of write circuitry which generates drain voltage write pulses in accordance with an embodiment of this invention.

Another method for generating write pulses is to pulse the drain voltage of a selected memory cell. FIG. 16c shows an embodiment of this invention where a write control signal applied to the gate of P-channel transistor 1650 controls drain voltage Vdrain of selected memory cell 1610. FIG. 16c differs from FIG. 16a in that no capacitor is connected to node 1645 in FIG. 16c. The embodiments of FIGS. 16a and 16c use P-channel transistor 1650 to control pulsing of drain 1613. Alternatively, an N-channel transistor could operate with write control pulses opposite in phase to those shown in FIGS. 16b, 16d, and 16e and with the high level of the pulses bootstrapped to voltages above voltage Vdd.

Figure 16D:
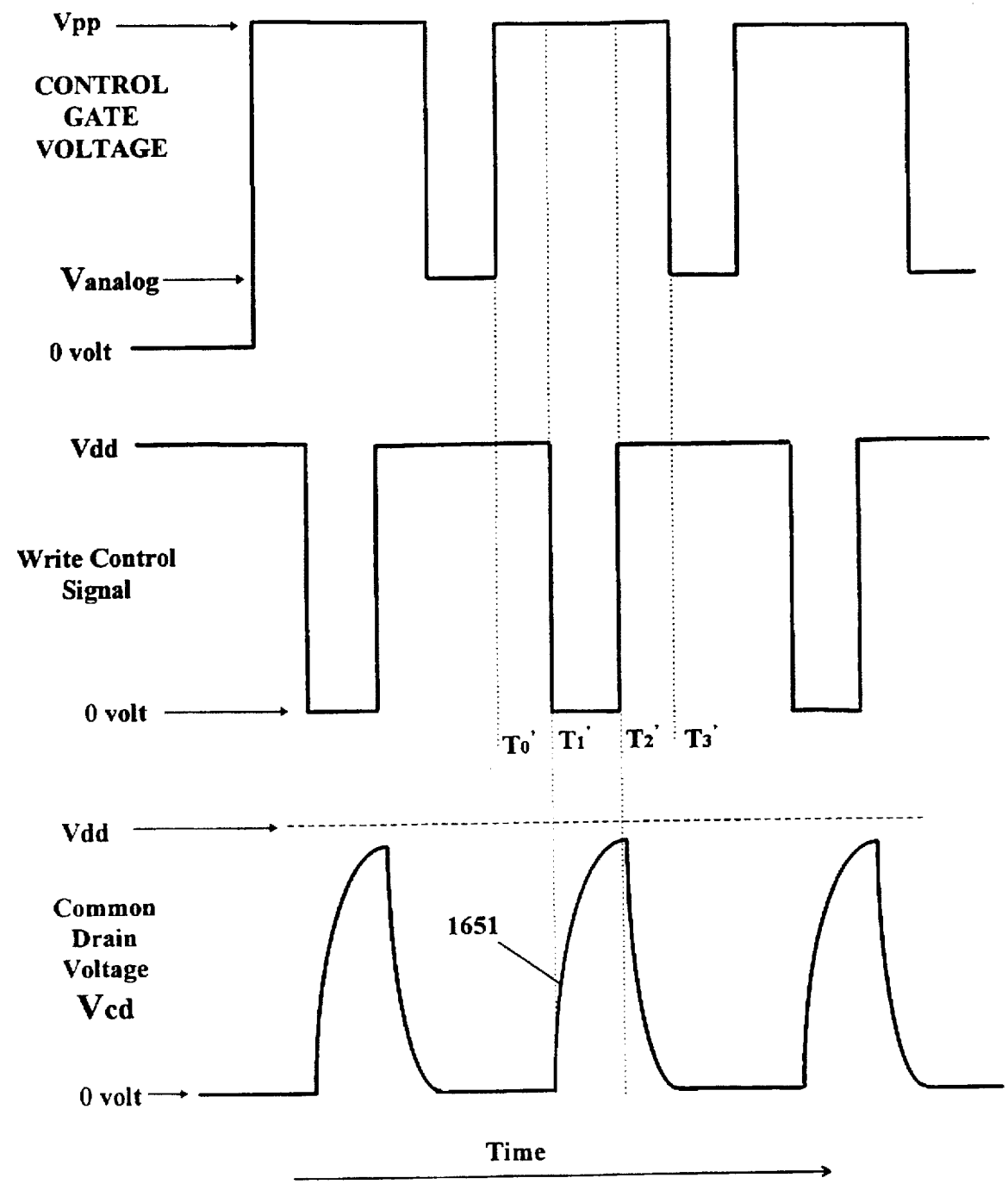
FIGS. 16d and 16e show waveforms for the embodiment of FIG. 16c.

FIG. 16d shows the timing of pulses applied to control gate 1613 and drain 1612 of FIG. 16c. Voltage Vpp is asserted to control gate 1613 at a time T0' while voltage Vcd is low and no current flows through memory cell 1610. The write control signal goes low at time T1' and begins a write pulse 1651 to drain 1612. Between time T1' and a time T2', current through memory cell 1610 increases while voltage on node 1645 charges to almost voltage Vdd. Since control gate 1613 is at voltage Vpp, CHE injection becomes significant when the current through memory cell 1610 and the voltage drop across memory cell 1610 exceed critical levels for producing hot electrons.

At time T2', the write control signal goes high. Voltage Vcd and the channel current through memory cell 1610 fall. Since CHE injection stops when drain voltage Vdrain stops producing hot electrons, the effective duration of write pulse 1651 is limited by the duration of the write control signal rather than the duration time that the control gate is at voltage Vpp. The write control signal goes high at time T2' before the voltage on control gate 1613 falls to voltage Vanalog at time T3'. Control gate 1613 is lowered to voltage Vanalog for a verify cycle as described above.

Figure 16E:
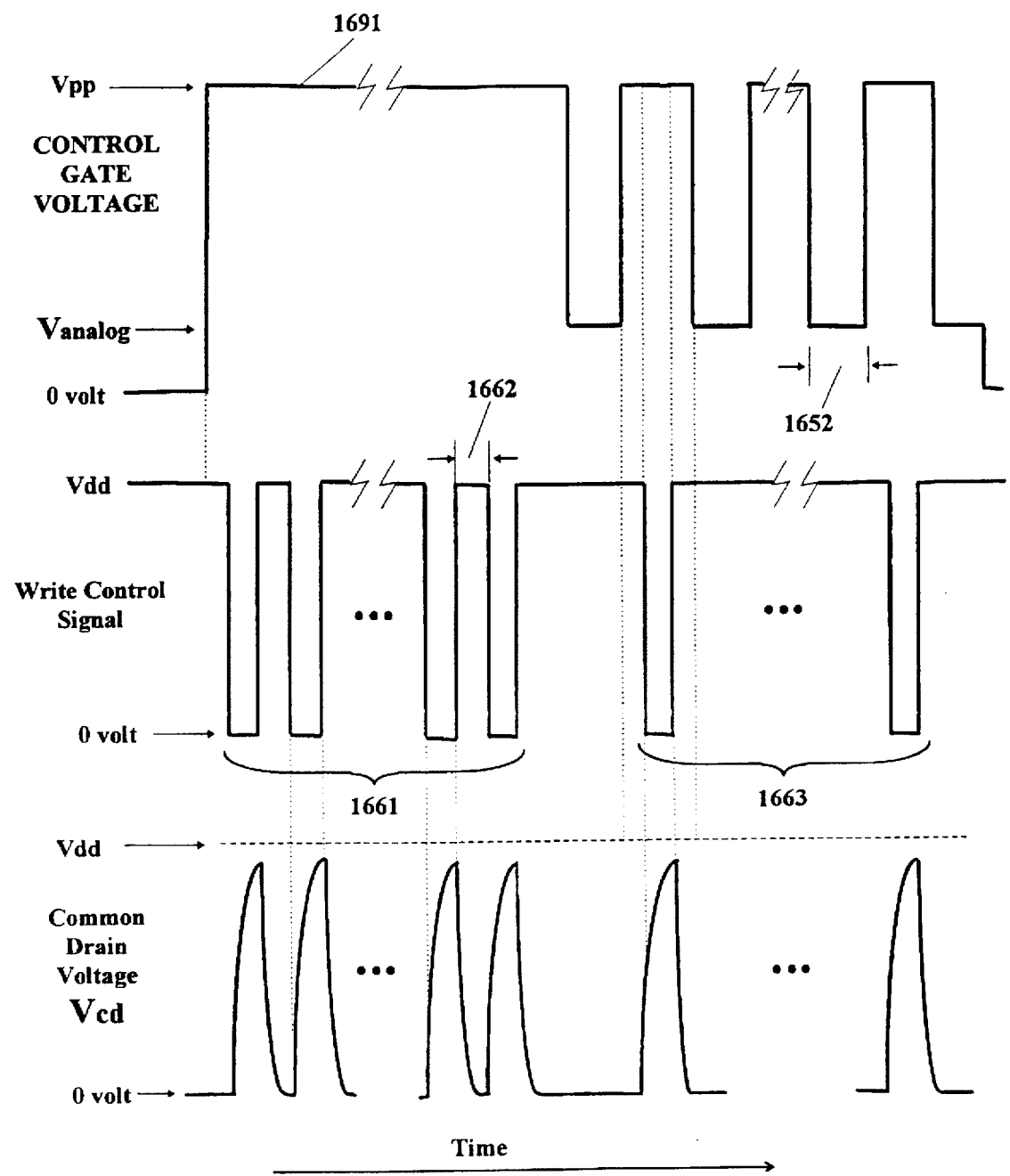

Alternative timing diagrams to those shown in FIG. 16d are shown in FIG. 16e in which drain 1612 is pulsed a number of times while control gate 1613 remains at voltage Vpp. There are no verify cycles between initial write pulses 1661 applied to drain 1612. Verify cycles 1652 occur between subsequent write pulses 1663 when the threshold voltage of the memory cell 1610 is near its target threshold voltage Vtt. The waveforms of FIG. 16e is similar to the waveform described in regard to FIG. 15d and reduce the total write time because dormant times 1662 between the write pulses 1661 can be shorter than the time required for the verify cycles 1652. Variation of the durations and amplitudes of drain write pulses adjusts the effect of write pulses in a manner similar to variation of control gate write pulses such as shown in FIGS. 15a, 15b, and 15c.

Pulsing the drains of memory cells may provide shorter effective write pulses than pulsing the control gates because the drains can typically be charged and discharged faster than control gates. (The RC constant of a metal bit line connected to drains of a typical memory array is smaller than the RC constant for a polysilicon row line which form control gates.) As described above, shorter pulses provide better threshold voltage resolution.

Pulsing the source line voltage can provide an effect similar to pulsing the drain voltage. However, in a typical flash EPROM the sources of a block of floating gate devices couple directly to the source lines, and pulsing the source voltage can disturb the threshold voltages of memory cells not being written.

Figure 17A:
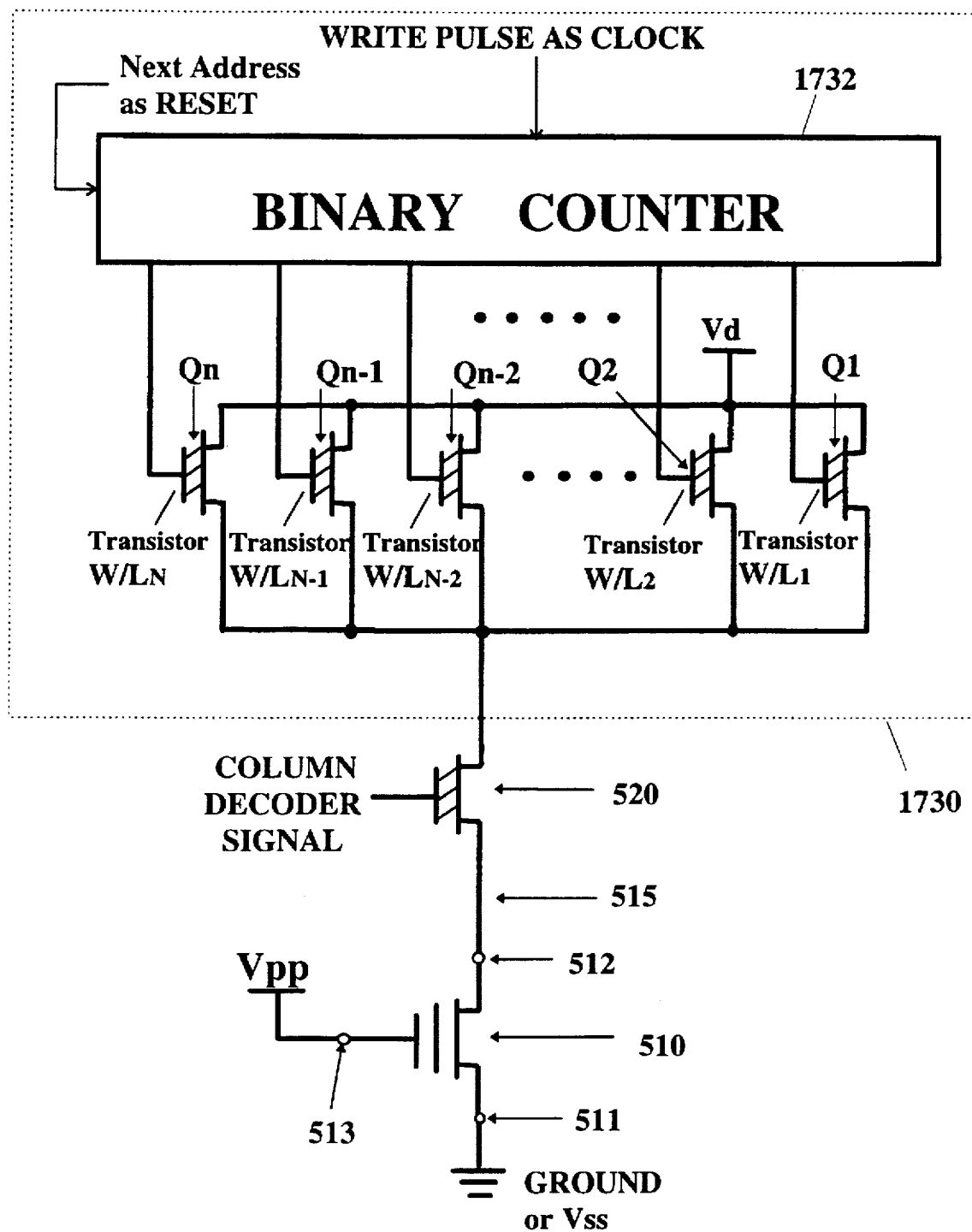
FIG. 17a is a schematic of write circuitry including a binary counter to vary write loadline resistance with time.
Figure 17B:
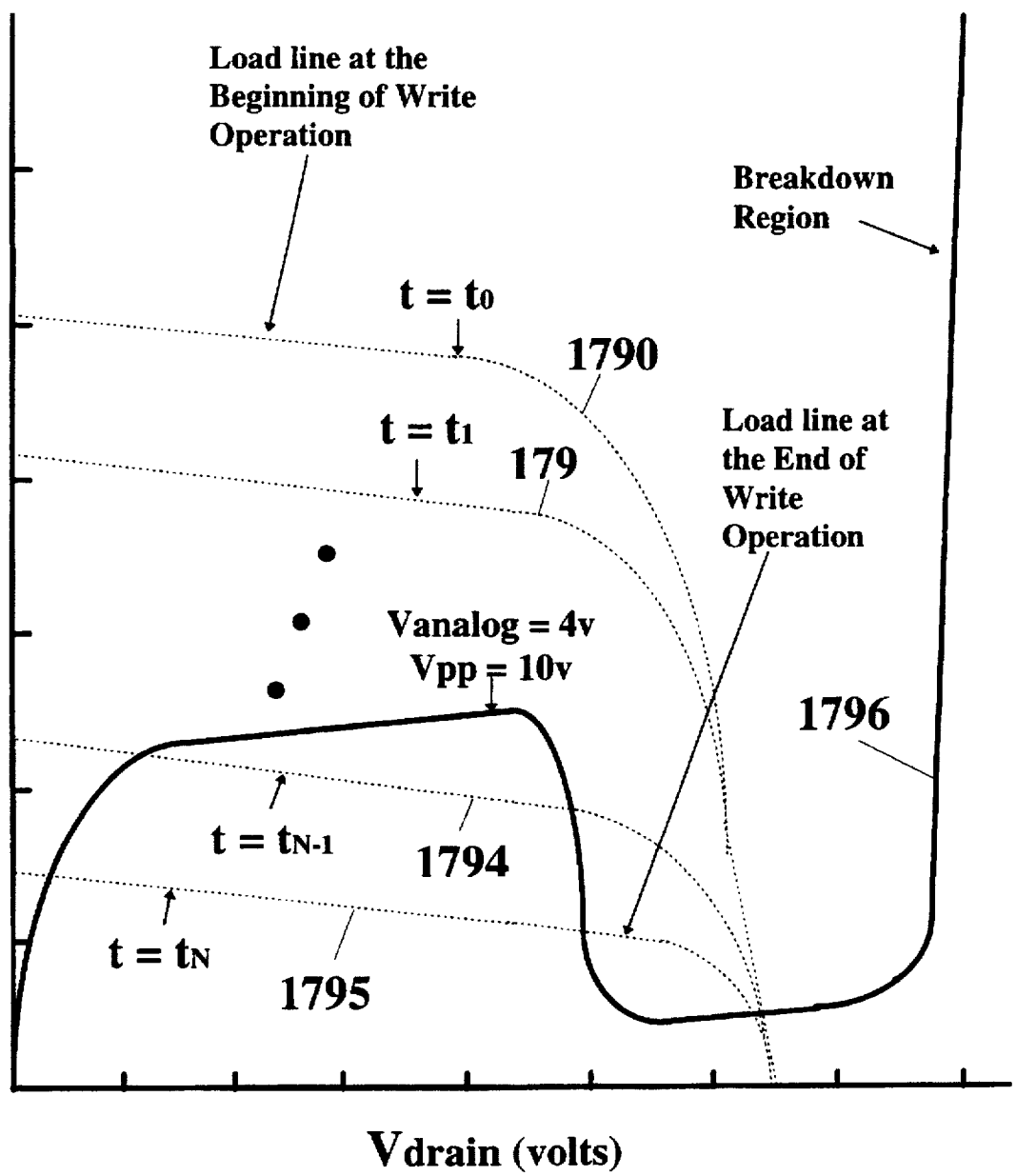
FIG. 17b shows plots of current versus drain voltage for a memory cell and for the loadline of FIG. 17a at different times during a write.

FIGS. 17a and 17b illustrate an embodiment of this invention having a loadline 1730 which changes resistance with time to provide a higher initial drain voltage to increase initial injection current and writing speed and a lower drain voltage near the target threshold voltage Vtt to improve resolution. Loadline 1730 contains a binary counter 1732 and a series of transistors $Q_1$ to $Q_N$. The series of transistors $Q_1$ to $Q_N$ has increasing resistance as described in regard to FIG. 11a. Write pulses in addition to being asserted to control gate 513 of memory cell 510 are asserted to a clock input terminal of binary counter 1732 so that binary counter 1732 increments with each write pulse and changes the combination of transistors $Q_1$ to $Q_N$ which are on. The resistance of loadline 1730 increases with each write pulse thereby decreasing current through memory cell 510 and the voltage on drain 512. During a write, the loadline current versus drain voltage plot changes from plot 1790 to plot 1795 shown in FIG. 17b, and the current through memory cell 510 and the CHE injection current decrease. Decreasing the CHE injection improves threshold voltage resolution near the target threshold voltage. After writing memory cell 510, a reset signal resets binary counter 1732 for writing the next memory cell.

As will be understood by those skilled in the art, the above described write processes can be varied and combined in a number of ways in accordance with this invention. For example, write pulse widths and peak voltages, drain voltages, or loadline resistances, can be changed according to a memory cell's threshold voltage measured during verify cycles. The changes can be in discrete steps or continuously adjusted based on the difference between the threshold voltage of the memory cell and the target threshold voltage. The above processes and circuits individually improve the resolution of the threshold voltage and the writing speed, and some or all of these can be combined to improve threshold voltage resolution and/or the total write time. In particular, any of the above methods for controlling the control gate voltage of a selected cell during a write may be combined with any of the above methods for controlling the drain voltage.

Reading an analog signal stored in a memory cell amounts to measuring the threshold voltage of the cell then reproducing the analog signal from the measured threshold voltage. As described above, in one embodiment of this invention, the threshold voltage of a memory cell equals the analog signal Vanalog stored in the cell, and measuring the threshold voltage provides a signal equal to signal Vanalog. In another embodiment, the threshold voltage of cells correspond one-to-one with the range of stored signal Vanalog, but a measured threshold voltage must be converted to a voltage which equals signal Vanalog.

Figure 18A:
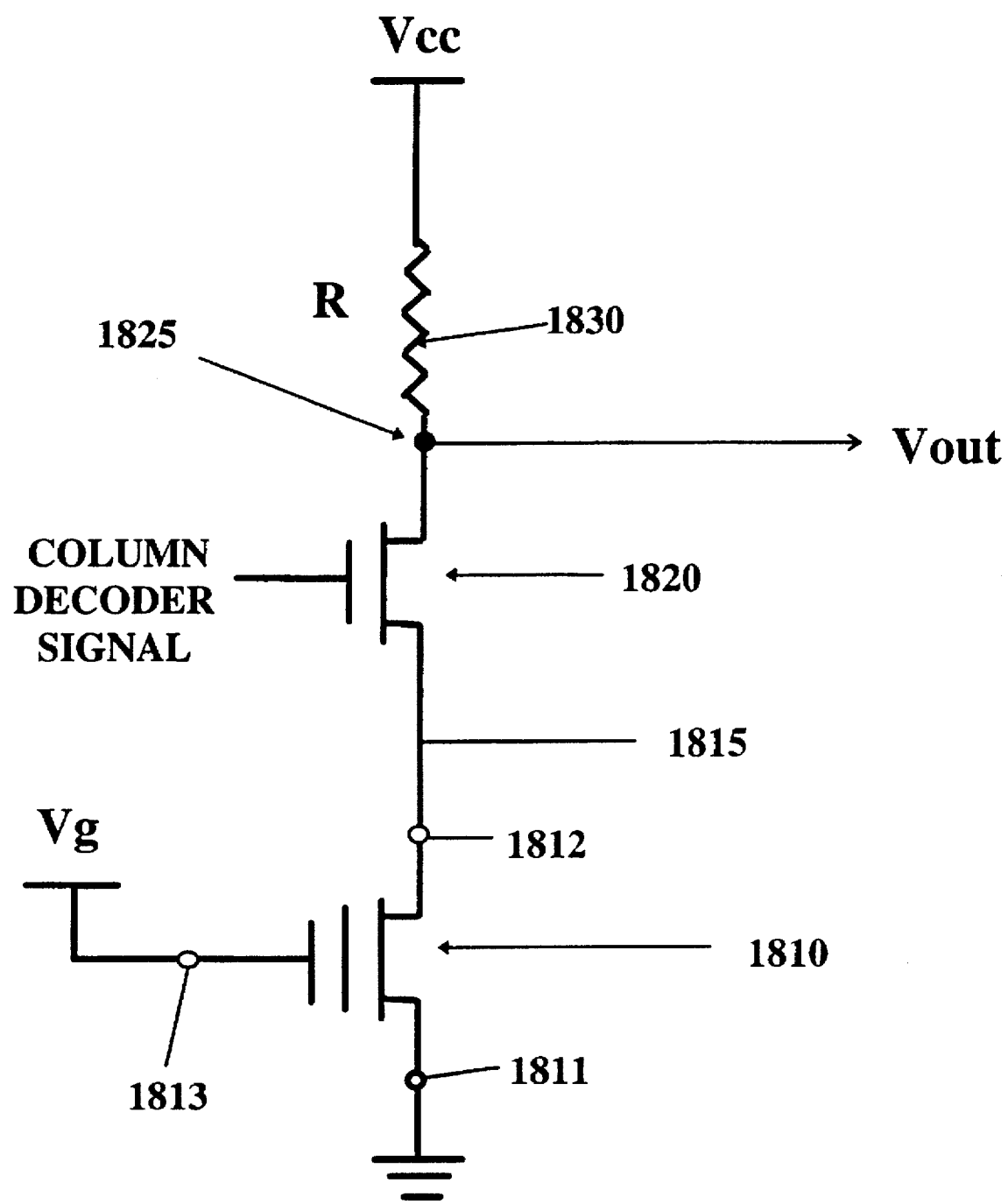
FIG. 18a illustrates conventional read circuitry for a flash EPROM cell.
Figure 18B:
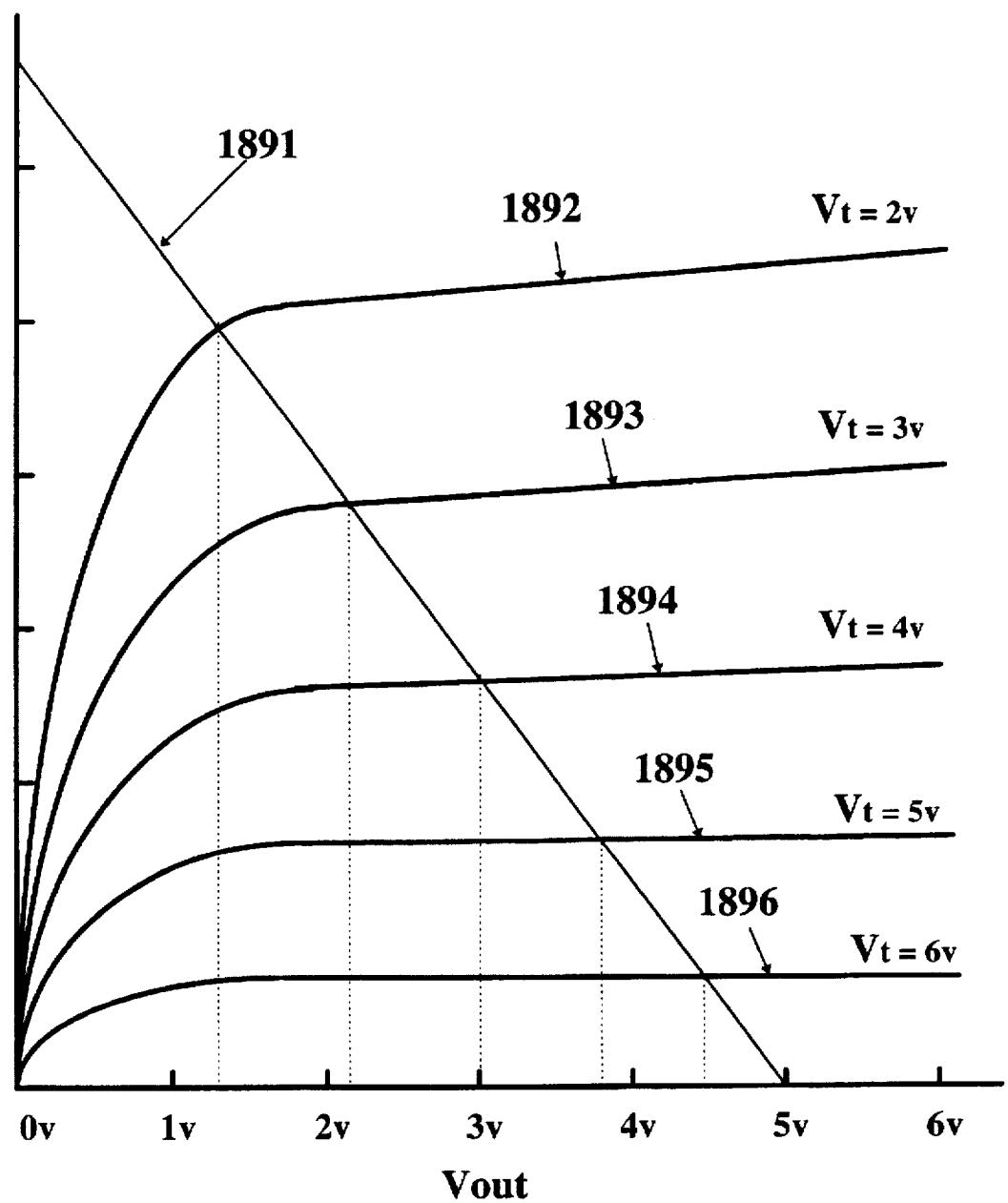
FIG. 18b shows plots of current versus output voltage for a loadline resistor and for memory cells having different threshold voltages.

One way to read a threshold voltage is to bias a flash EPROM cell 1810 as shown in FIG. 18a. Flash EPROM cell 1810 has a control gate 1813 biased high to a voltage Vg which exceeds the maximum possible threshold voltage of memory cell 1810. A drain 1812 of memory cell 1810 connects through a pull-up device 1830 to power supply voltage Vcc. Pull-up device 1830 has a resistance R such that memory cell 1810 operates In the saturation region for the full range of possible threshold voltages Vt. FIG. 18b shows a family of I–V curves 1892 to 1896 for memory cell 1810. The saturation current of memory cell 1810 decreases with increasing threshold voltage Vt. The intersections of a loadline I–V curve 1891 and I–V curves 1892 to 1896 are the output voltages Vout read at node 1825 and show a one-to-one correspondence between output voltage Vout and threshold voltage Vt. As described above, the threshold voltage Vt of memory cell 1810 indicates the analog signal Vanalog stored in memory cell 1810.

The read circuit of FIG. 18a has two drawbacks. First, biasing memory cell 1810 in the saturation region allows a high drain voltage which can disturb the threshold voltage Vt of memory cell 1810 during a read. Second, the linearity between voltage Vout and threshold voltage Vt (or signal Vanalog) is poor which makes producing a signal equal to signal Vanalog difficult.

Figure 19A:
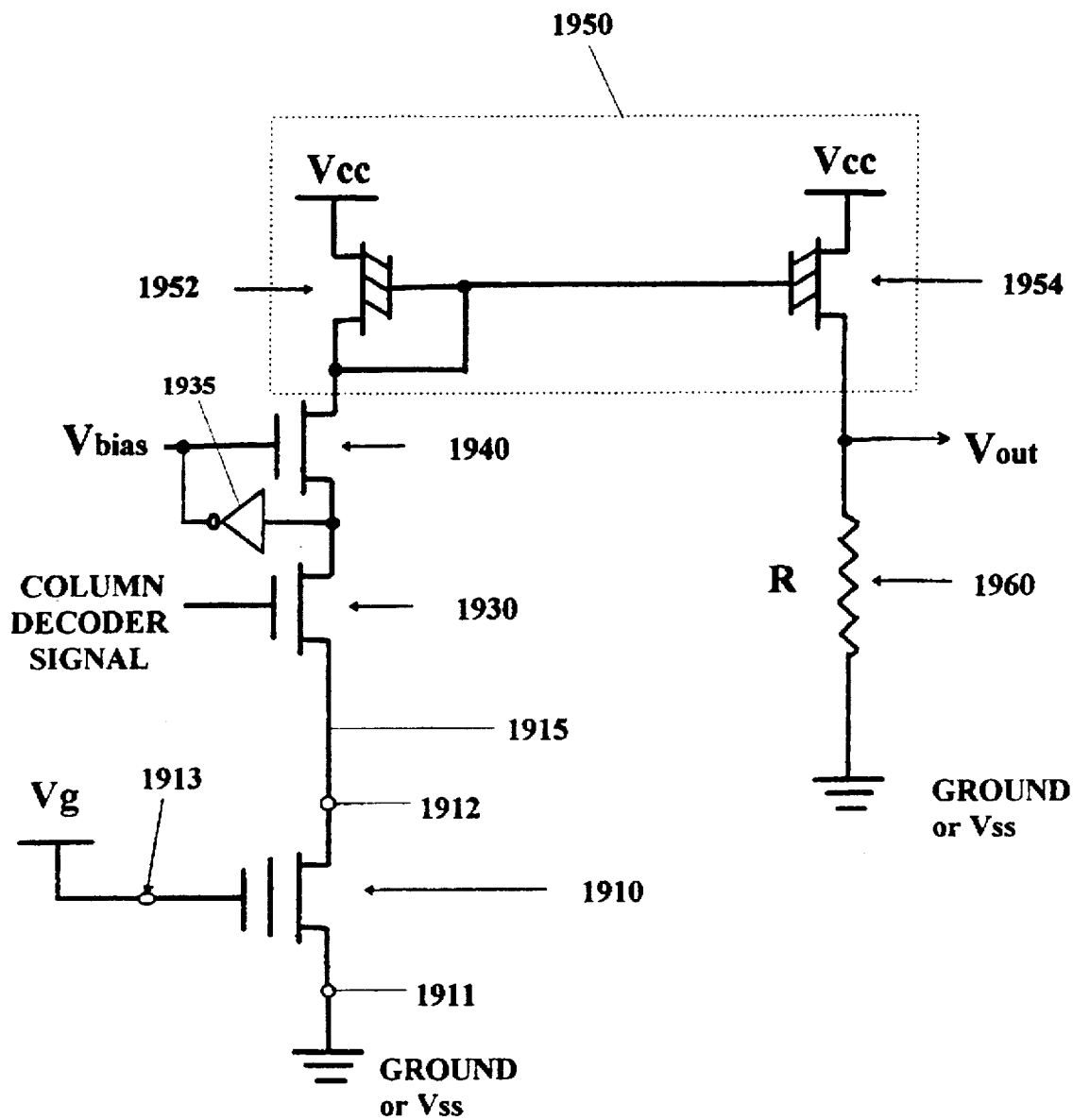
FIG. 19a is a schematic of a read circuit which includes a current-mirror to generate an output voltage from a flash EPROM cell biased in the linear region during a read.

To avoid the read disturb problem, a cascoding device 1940 as shown in FIG. 19a can limit the drain voltage to less than about 1.5 volt. This restricts memory cell 1910 to operation in the linear region. In the linear region, a current Ids through memory cell 1910 depends on the floating gate voltage Vfg as shown in the eq. 3.

$$Ids \, \alpha [(Vfg-Vt) \times Vdrain - Vdrain^2/2] \quad \text{(eq. 3)}$$

where Vdrain is the drain voltage and Vt is the threshold voltage of memory cell 1910. For any given threshold voltage Vt of memory cell 1910, change $\Delta$Ids in current Ids is proportional to change $\Delta$Vfg in floating gate voltage Vfg if drain voltage Vdrain is constant.

Figure 19B:
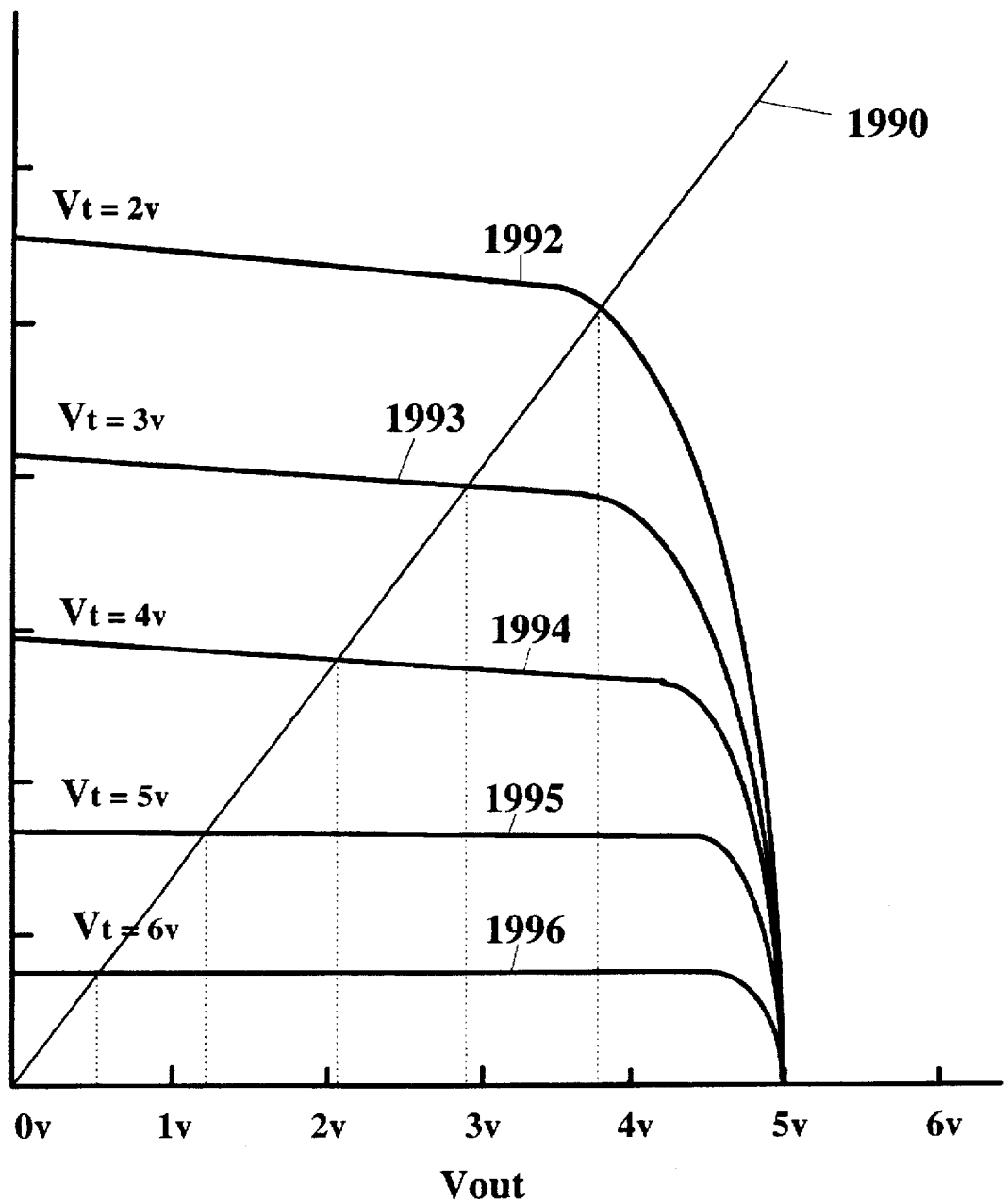

In the read circuit of FIG. 19a, cascoding device 1940 limits drain voltage Vdrain so that memory cell 1910 operates in the linear region, and a current-mirror 1950 and a resistor 1960 generate an output voltage Vout which is proportional to current Ids through memory cell 1910. Resistor 1960 has a resistance chosen such that a P-channel pull-up device 1954 in current-mirror 1950 operates in the saturation region so that both P-channel transistors 1952 and 1954 form a current-mirror pair. During a read, a charge pump biases a control gate 1913 of memory cell 1910 to a voltage Vg which is higher than the maximum possible threshold voltage, and drain voltage Vdrain of memory cell 1910 is held constant independent of the threshold voltage of memory cell 1910. An optional feedback circuit such as inverter 1935 can increase or decrease gate voltage of cascoding device 1940 to keep drain voltage Vdrain constant. Output voltage Vout is a nearly linear function of the threshold voltage Vt of memory cell 1910 as shown in FIG. 19b by the intersections of I–V curve 1990 for resistor 1960 with curves 1992 to 1996 which are the I–V curves of P-channel current-mirror transistor 1954, corresponding to different threshold voltage Vt of memory cell 1910.

Figure 20A:
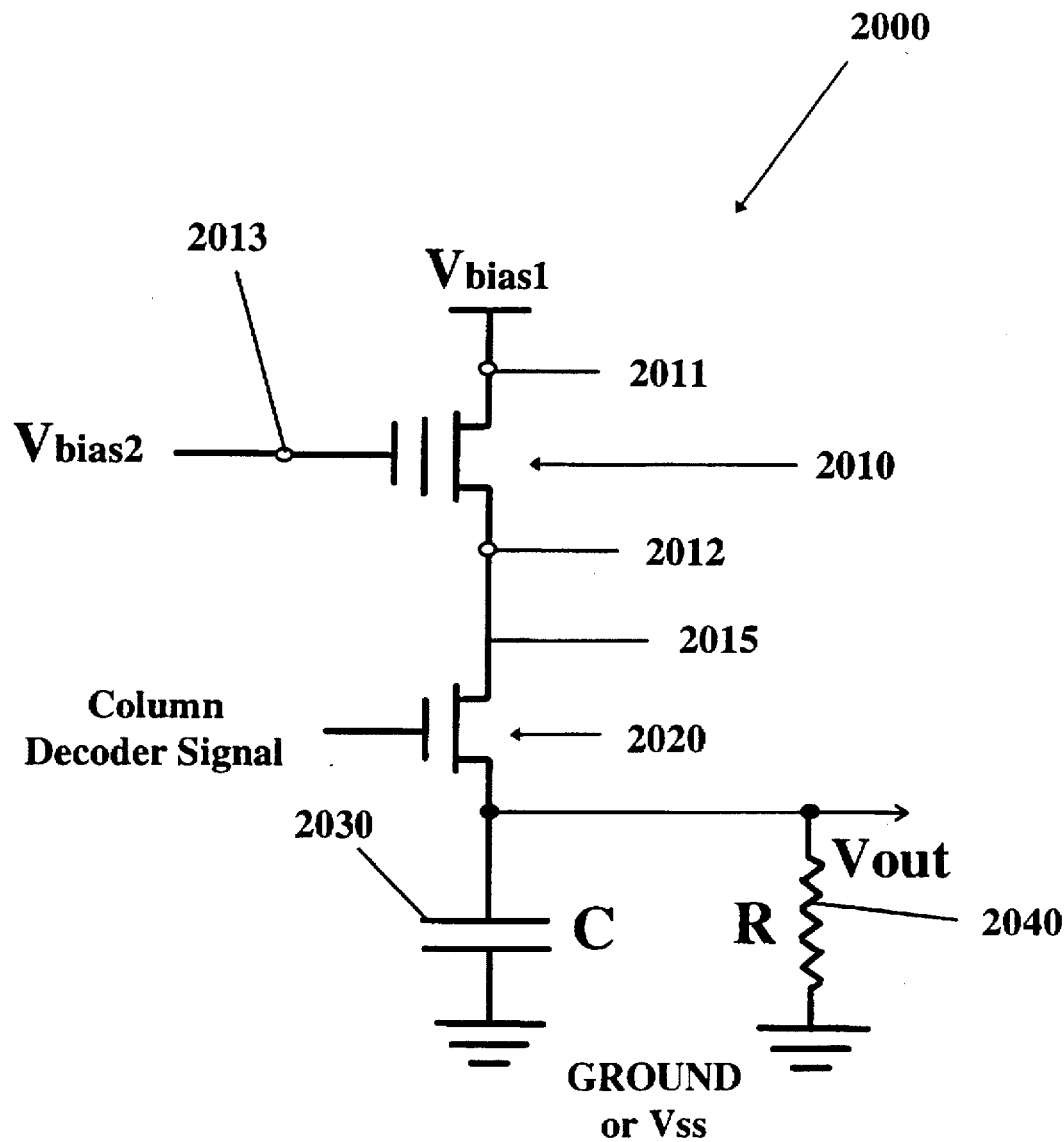
FIG. 20a is schematic of a source follower read circuit.
Figure 20B:
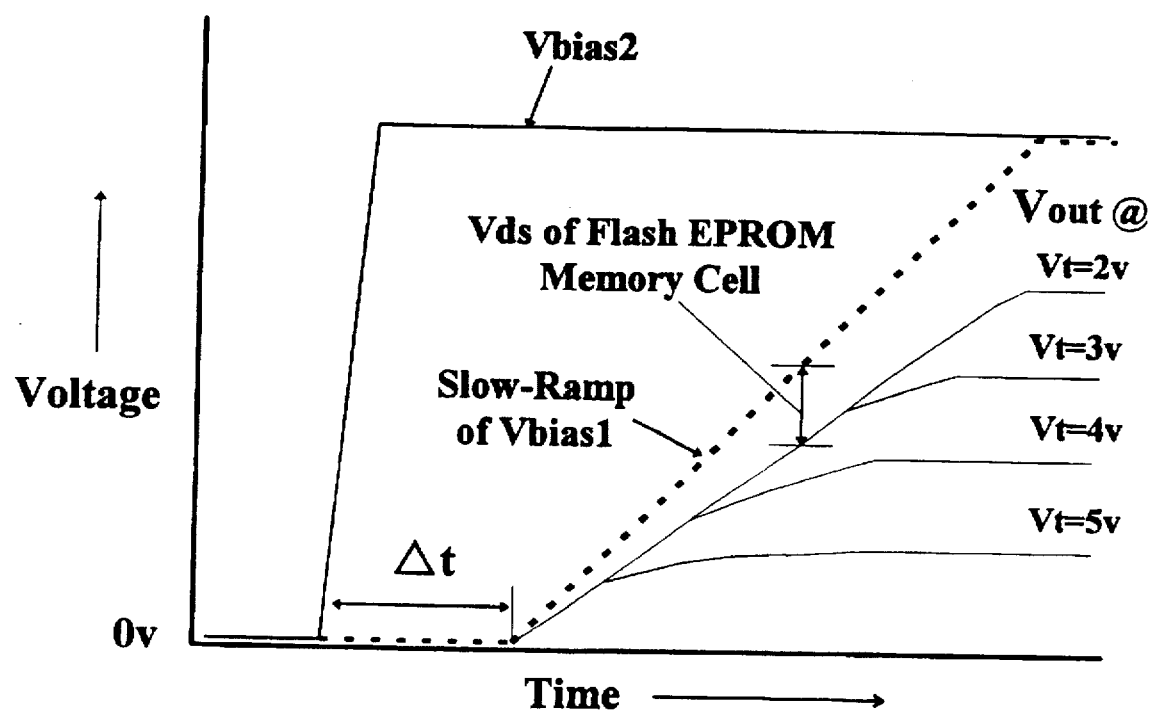

FIG. 20a illustrates a read circuit 2000 which uses a source follower approach for reading the threshold voltage of a memory cell 2010. Read circuit 2000 has the advantage of consuming very little power. In a typical flash EPROM array, drains of memory cells are coupled together in columns through metal bit lines, and sources are coupled together in blocks through diffused and metal source lines. In the discussion of FIGS. 20a and 20b, a source 2011 is the terminal of memory cell 2010 connected to the source lines of the array, and a drain 2012 is the terminal connected to bit line 2015. Electrical classification of a current carrying terminal and a drain/source terminal, as either a source or drain depends on the voltages applied and may differ from the structural classification used here.

In read circuit 2000, a control gate 2013 and source 2011 of memory cell 2010 are biased high during a read, and parasitic capacitance 2030, bit line 2015 and structures connected to bit line 2015 through a column select device 2020 charge to an output voltage Vout. Voltage Vout corresponds one-to-one to the threshold voltage Vt of memory cell 2010 because of the source follower action which keeps drain 2012 at a voltage less than Vbias2–Vt. The well known body effect on memory cell 2010 affects the relation between output voltage Vout and stored signal Vanalog because a read operation charges drain 2012 (which acts electrically as the source of the memory cell 2010 during a read) and increases the source bias of the memory cell 2010. The source bias causes a deviation $\delta$Vt from threshold voltage $Vt_0$ of memory cell 2010 at zero source bias. Eq. 4 gives the deviation $\delta$Vt.

$$\Delta Vt = m \cdot [(Vs + 2\phi fp)^{1/2} - (2\phi fp)^{1/2}] \quad \text{(eq. 4)}$$

m is the body factor which depends on substrate doping and the oxide thickness, Vs is the source bias voltage (the voltage of drain 2012), and 2.$\phi$fp is the difference in Fermi potentials between the surface and the substrate (approximately 0.6 volt).

Deviation $\delta$Vt in threshold voltage Vt distorts the relation between signal Vout and input signal Vanalog especially if read circuit 2000 is not used in the verify cycles of a write operation. If circuit 2000 reads threshold voltage Vt for both read operations and verify cycles, then deviation $\delta$Vt affects the linearity between analog signal Vanalog and the threshold voltage Vt but retains the linearity between signal Vanalog and signal Vout. If the body factor m is large, as in typical flash EPROM cells, the nonlinear mapping of input analog signal Vanalog into threshold voltages Vt is undesirable because uniform steps in analog. signal Vanalog cause non-linear steps in threshold voltage Vt. For some values of signal Vanalog (and voltage Vout), write pulses which change the threshold voltage of a cell as described above, may-cause a change that exceeds the desired resolution in signal Vanalog (and Vout).

A source follower read process in accordance with this invention controls drain-to-source voltage Vds and channel current Ids of memory cell 2010 to eliminate read disturb problems. As shown in the timing diagram in FIG. 20b, control gate 2013 is first biased high to a voltage Vbias2 (typically abut 6 volts). Then, after a time $\Delta$t, source terminal 2011, acting electrically as a drain in this case, is slowly ramped from ground up to a voltage Vbias1 (typically about 6 volts). Ramping of source 2011 is at a rate which initially restricts memory cell 2010 to operation in the linear region to avoid the generation of hot electrons at high currents. Before the voltage difference between control gate 2013 and drain 2012 reaches the threshold voltage of memory cell 2010, the voltage at drain 2012 closely follows the voltage at source 2011 and limits the drain-to-source voltage Vds to less than about 1.5 volts.

The capacitance 2030 connected to drain 2012 through column decode device 2020 charges up as the voltage at source 2011 is ramped. Before memory cell 2010 approaches the threshold voltage cutoff, current Ids is small because capacitor 2030 remains nearly charged and a high resistance load 2040 (typically 1 M$\Omega$ to 10 M$\Omega$) limits current Ids. Load 2040 acts as a "bleeder" to ground to prevent output voltage Vout from overshooting. Without load 2040, noise in supply voltages can temporary increase voltage Vbias1 and charge drain 2012 (and voltage Your) to a high level that is preserved when the supply voltage falls.

As memory cell 2010 enters the saturation region, drain-to-source voltage Vds increases because voltage at drain 2012 cannot exceed Vbias2–Vt. A read disturb problem does not arise because: (1) channel current Ids is several orders of magnitude smaller during a read than channel current Ids during a write; (2) the floating gate-to-source voltage difference is small (about one volt) and the resulting vertical electric field between the floating gate and source 2011 is weak, and between the floating gate and drain 2012, tends to repel electrons from getting into the floating gate; and (3) the body effect due to the source bias reduces the generation of substrate current and hence further reduces generation of hot electrons.

The read circuit of FIG. 20a biases source 2011 high. Alternatively, the roles of drain 2012 and source 2011 can be reversed so that drain 2012 is biases high during a read using the timing as shown in FIG. 20b.

Figure 21A:
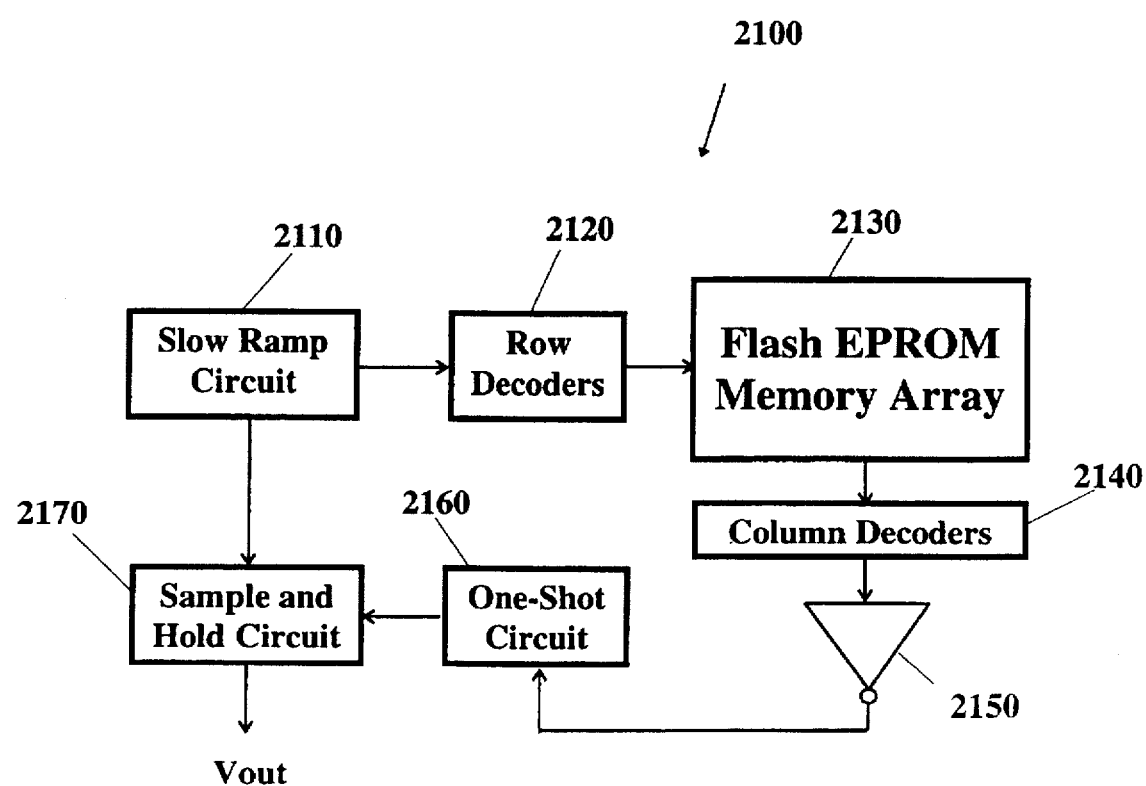
FIG. 21a is a block diagram of circuits for a slow ramp read in accordance with an embodiment of this invention.

Another read circuit in accordance with an embodiment of this invention slowly ramps the control gate voltage of a flash EPROM cell and senses when the control gate voltage reaches the cell's threshold voltage. This embodiment is especially useful in applications such as audio record and playback applications where the available read time can be as long as the write time. FIG. 21a shows a block diagram of a read path 2100 including a slow ramp circuit 2110 which asserts a control gate voltage through a row decoder 2120 to a row line in a flash EPROM array 2130. The ramped control gate voltage can change continuously as shown in voltage versus time plot 2191 of FIG. 21c or step-wise as shown in voltage versus time plot 2192 of FIG. 21c.

Figure 21B:
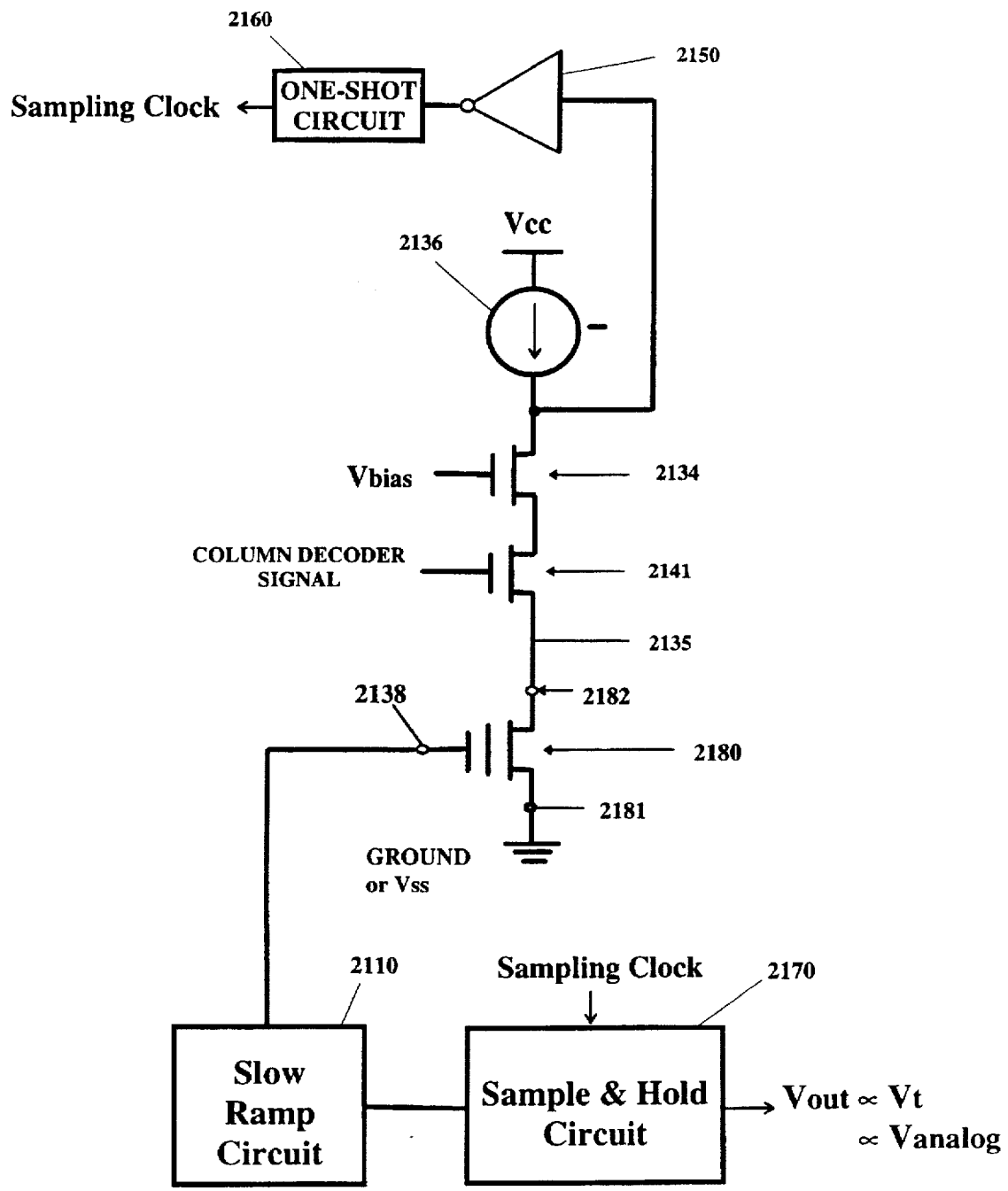
Figure 21C:
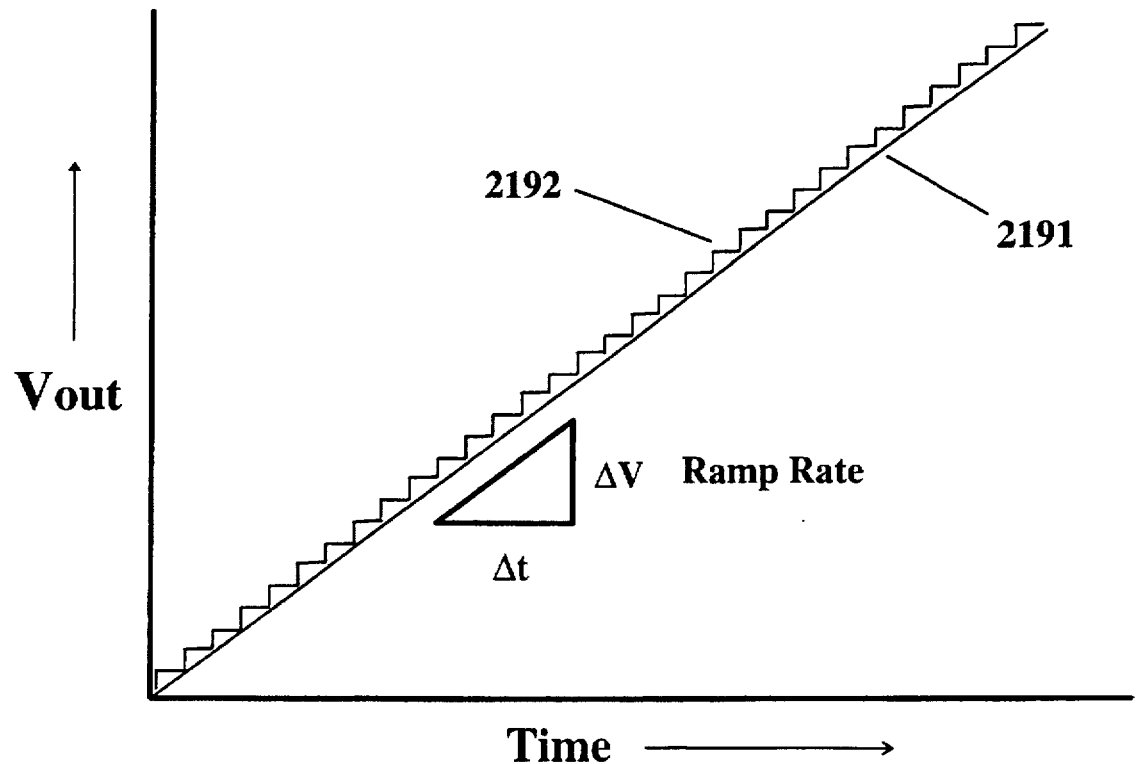
FIG. 21c shows plots of voltage versus time for a slowly ramped control gate voltage.

FIG. 21b shows a selected memory cell 2180 from memory array 2130 has a source 2181 which is grounded and a drain 2182 which is charged to less than about 1.5 volts to avoid read disturb. A current source 2136 and a cascoding device 2134 are connected to a bit line 2135 of array 2130 through a column decode transistor 2141 which is part of a conventional column decoder 2140 (FIG. 21a). While slow ramp circuit 2110 applies to a control gate 2183 a voltage below the threshold voltage Vt of memory cell 2180, the voltage at drain 2182 stays high (abut 1.5 volts) because selected memory cell 2180 does not conduct (or conducts a negligible amount of current). When the control gate voltage is higher than threshold voltage Vt, selected memory cell 2180 conducts sufficient current to pull the voltage at drain 2182 low. A conventional inverting sense amplifier 2150 is connected through column decoder 2140 to selected memory cell 2180 and senses current through selected memory cell 2180. Sense amplifier 2150 trips a one-shot circuit 2160 which activates a sample-and-hold circuit 2170 when the control gate voltage reaches the threshold voltage of selected memory 2180. Sample-and-hold circuit 2170 samples the control gate voltage from slow ramp circuit 2110 and asserts an output voltage Vout.

When the drain 2182 of selected memory cell 2180 goes from high to low, the control gate voltage from slow ramp circuit 2110 equals the threshold voltage of selected memory cell 2180. Furthermore, if read circuits (including for example current source 2136, inverting sense amplifier 2150, and one-shot circuit 2160) used in the read operation are also used in the verify cycles during a write operation, the threshold voltage Vt equals the analog signal Vanalog written to selected memory cell 2180. Unlike the other read processes discussed earlier, there are no signal distortions and no voltage translations required when using read circuit 2100. However, if desired, the read circuits for the read operation do not need to be identical to read circuits for the verify cycles. A deliberate difference causing a predetermined offset in the threshold voltage read-outs may be desirable for some applications. Also, if desired, a companding scheme which compresses an analog signal before writing and decompresses the output voltage after reading may be employed.

An added advantage of read circuit 2100 is that slow ramp circuit 2110 rather than drain 2182 of selected flash EPROM cell 2180 asserts the output voltage Vout. The output impedance of the slow ramp circuit 2110 is lower than the impedance of a typical pull-up device and bit line in a memory, and makes reading of output voltage Vout faster and more accurate than reading an output voltage which depends on the drain (bit line) voltage. Additionally, no complicated circuits are required.

Slow ramp circuit 2110 can begin ramping up the control gate voltage from any voltage lower than the minimum threshold voltage in memory array 2130. Alternatively, control gate voltage can be ramped down from a high voltage (higher than the maximum possible threshold voltage), and the threshold voltage is detected when the selected memory cell stops conducting. In the above embodiments, the ramping can stop once the threshold voltage is detected, or it can continue until the end of the read period.

The accuracy of read path 2100 depends on the ramp rate or the ramp step size and is independent of the time before one-shot circuit 2160 activates sample-and-hold circuit 2170. Slower ramp rates increase the accuracy or resolution of the read voltages Vout. For a range of threshold voltages between 2 and 7 volts, increasing the control gate voltage by 1 mV every 20 ns achieves a read resolution of 1 mV within a total read time of 100 µs. Accordingly, the read path 2100 would not be a bottleneck that limits the accuracy of the storage (writing and reading) of analog signals.

Figure 22:
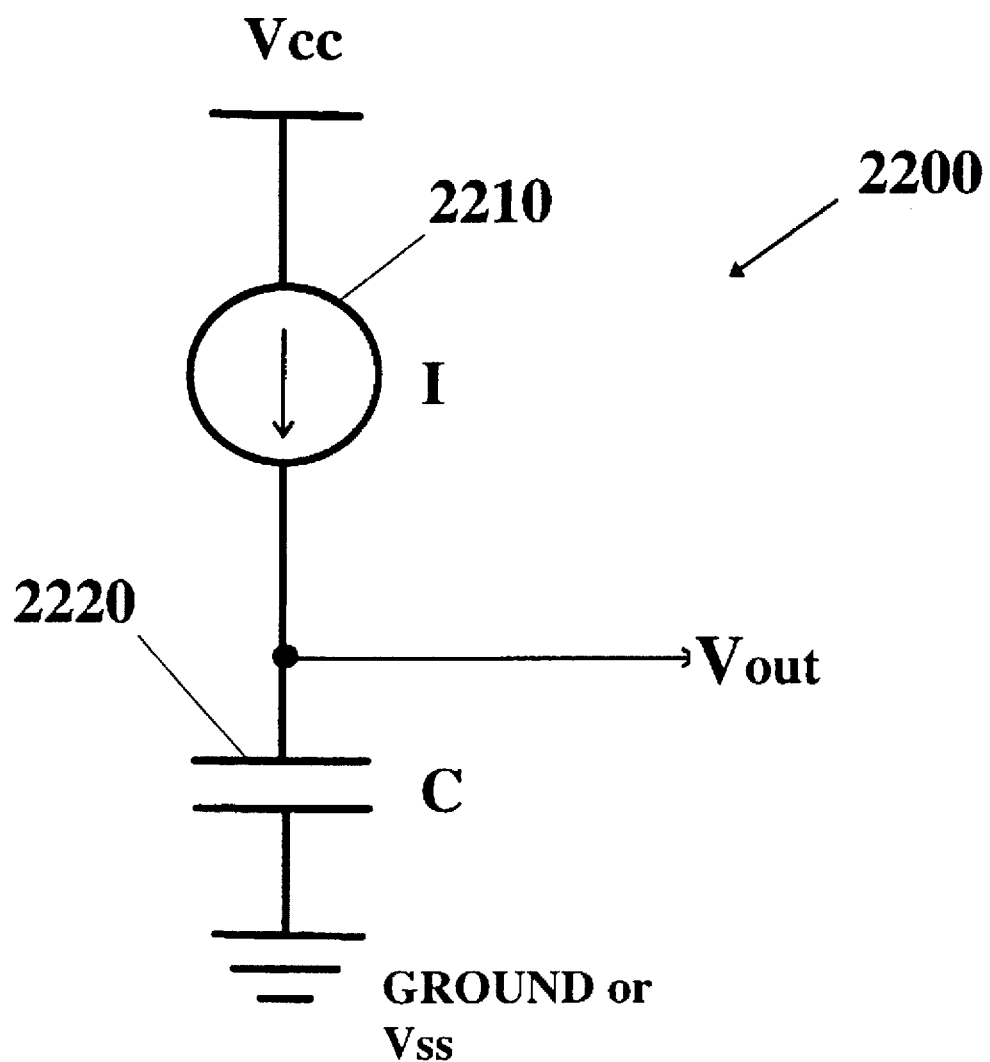
FIG. 22 shows an embodiment of a slow ramp circuit.

FIG. 22 shows a very precise continuous ramping circuit which includes a constant current source 2210 and a capacitor 2220. Capacitor 2220 is precharged to an initial voltage $V_0$ (typically ground) before ramping begins. During a read, current source 2210 charges capacitor 2220 with a constant current so that the output voltage Vout across capacitor 2220 rises linearly with a ramp rate $\Delta V/\Delta t$ equal to the ratio of current from current source 2210 to the capacitance of capacitor 2220.

Figure 23:
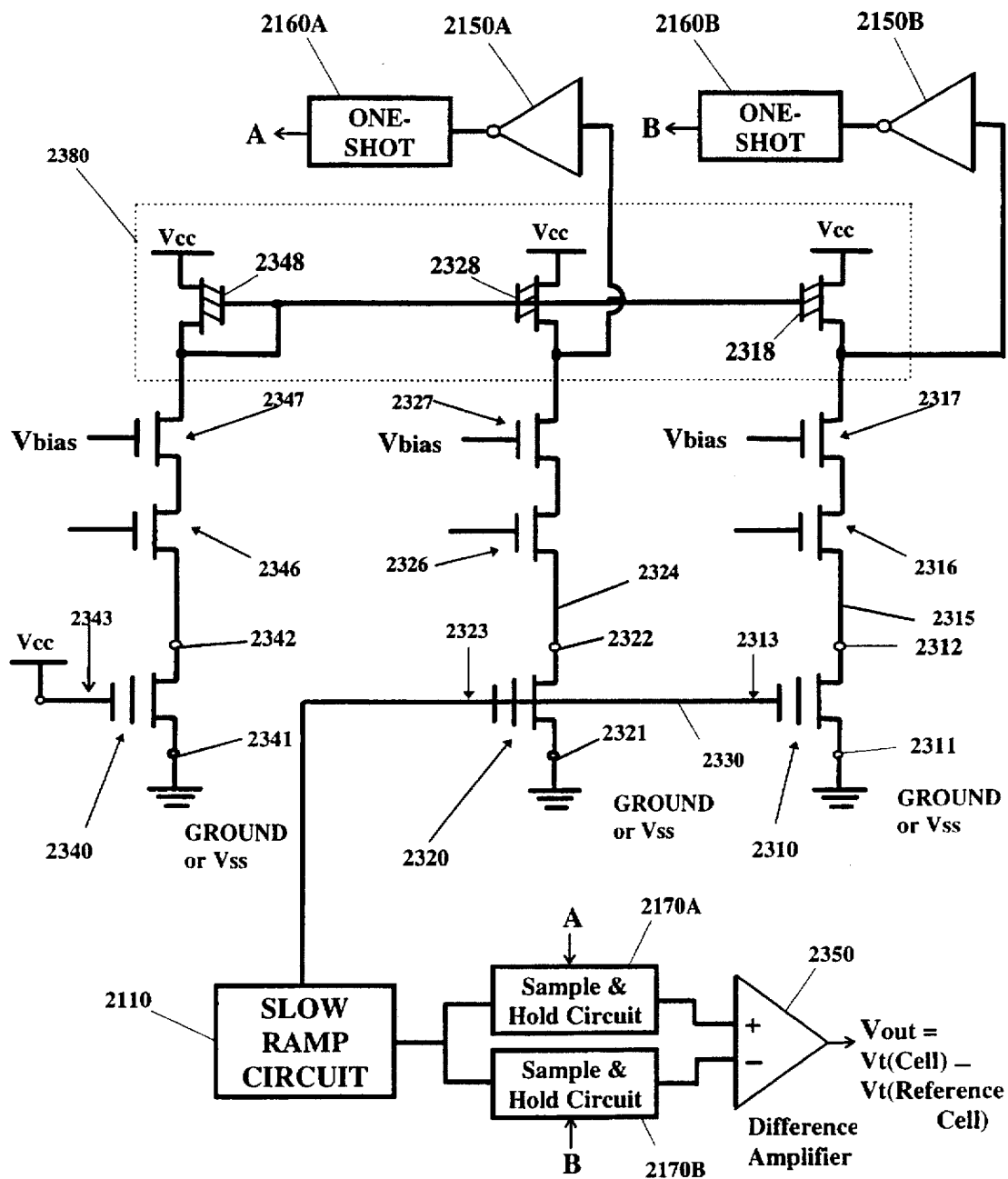
FIG. 23 is a schematic of an embodiment of this invention which includes a read circuitry using flash EPROM references cells.

Flash EPROM cells, just like the other types of floating gate memory cells, exhibit intrinsic charge loss over time. To compensate for the intrinsic charge loss, one or more columns of reference cells can be added to a memory array. FIG. 23 shows an embodiment of this invention which includes reference cells 2310. For the purpose of illustration, FIG. 23 shows only a single reference cell 2310. An actual flash memory would typically contain hundred of reference cells 2310 with drains 2312 connected together through a reference column line 2315. Additional columns of reference cells 2310 can also be added. A control gate 2313 of each reference cell 2310 is connected through a row line 2330 to control gates 2323 of memory cells 2320 in a row of the array. (A row with a single memory cell 2320 is shown for simplicity of illustration.) Sources 2311 of reference cells 2310 are connected to ground.

The reference columns can be located anywhere within the memory array. If reference cells 2310 are placed at one edge of the array, a column of "dummy" cells should be placed next to the reference column at the outer edge of the array to minimize the optical/microloading effects. Similar "dummy" columns and rows should be added to the other edges of the memory array.

After a conventional erase, a signal corresponding to the minimum possible analog signal, is written into each of reference cells 2310. That is, control gates 2313 of the reference cell 2310 are pulsed to the minimum voltage Vpp while line 2315 is driven a desired drain voltage during a write operation. As an alternative to writing a minimum analog signal to reference cells 2310, the signal written into reference cells 2310 can correspond to the maximum analog signal, or an intermediate voltage. The writing of reference cells 2310 can occur before or after the writing of input analog signals into the memory cell 2320. For example, in an application such as sound recording where most or all of memory cells 2320 are written in a relatively short time, the reference column is written at the beginning or end of the recording. For random access applications, reference cells are typically written after a corresponding block of memory cells is erased.

During a read of a selected memory cell 2320, a reference cell 2310 in the same row as the selected cell 2320 is also selected. The embodiment of FIG. 23 illustrates using the slow ramp read process as an example. As slow ramp circuit 2110 ramps the voltage on row line 2330 (the control gate voltages of cells 2310 and 2320), the threshold voltages of memory cells 2310 and 2320 are read out separately through separate read paths as shown in FIG. 23. The read path for cell 2320 (2310) include a sense amplifier 2150A (2150B), a one shot circuit 2160A (2160B), and a sample-and-hold circuit 2170A (2170B). Sample-and-hold circuits 2170A and 2170B generate output voltages equal to the threshold voltages of cells 2320 and 2310 respectively which are sent to a difference amplifier 2350.

Difference amplifier 2350 generates a difference signal Vout which is proportional to the difference in the threshold voltages of memory cell 2320 and reference cell 2310. Accordingly, the difference signal Vout is the difference between threshold voltage Vt of memory cell 2320 (indicating the stored analog signal Vanalog) and the threshold voltage of reference cell 2310 (indicating the minimum possible analog signal). Variations such as those in power supply voltage, temperature, and intrinsic charge loss, many common mode noises, and offsets in the write and read circuits for cells 2310 and 2320 tend to track each other and cancel in the difference signal Vout. As a result, the quality of the signal Vout is improved.

Figure 24:
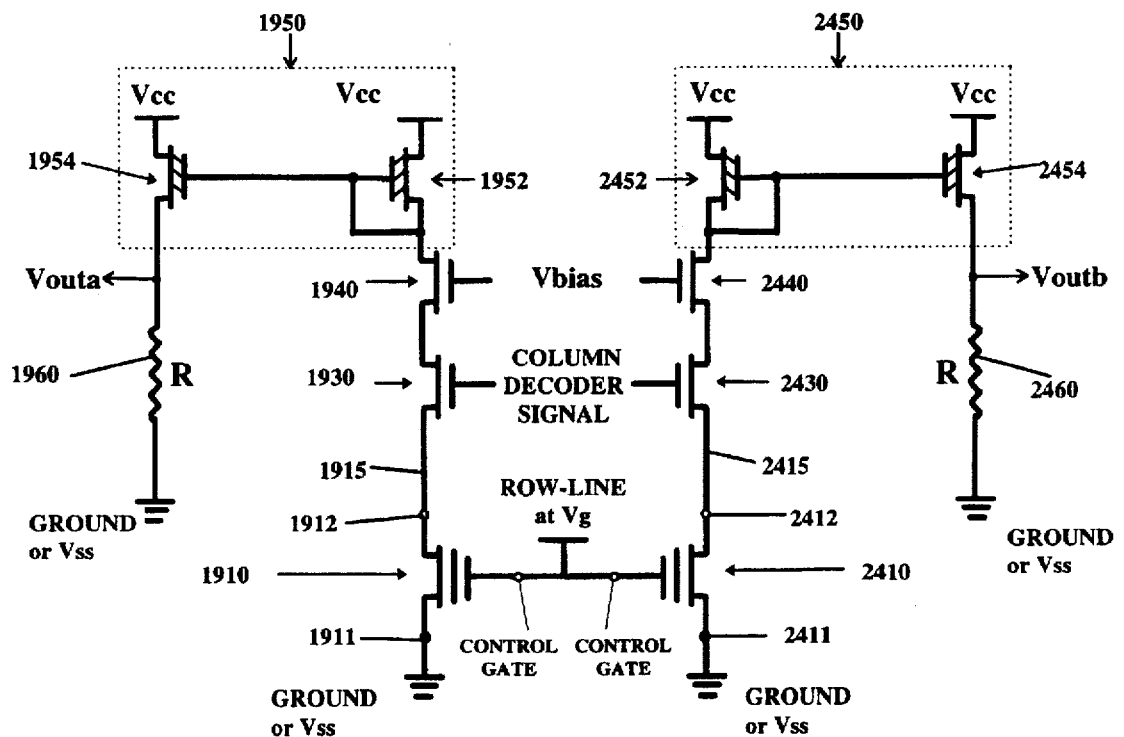
FIG. 24 is a schematic of an embodiment which includes reference cells for another read process.
Figure 24:
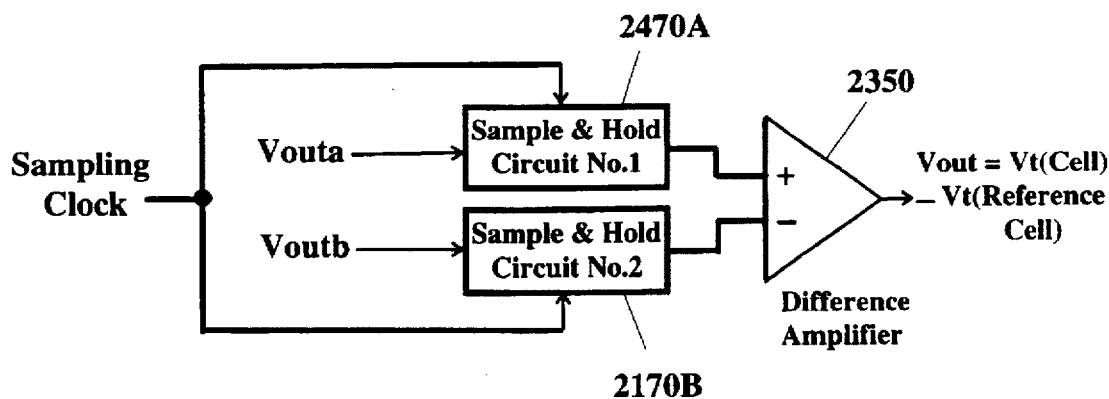

Addition of reference columns and generating a differential output voltage also applies to the other read processes. FIG. 24 shows an embodiment which adds a column of reference cells 2410 to a flash memory cells having read circuits as disclosed in regard to FIG. 19a where selected memory cell 1910 is biased in the linear region. A reference memory cell 2410 within the reference column is biased in the linear region during a read by a cascoding device 2440 through a column decoder 2430 and a bit line 2415 which are substantially identical to cascoding device 1940, column decoder 1930, and bit line 1915 described in regard to FIG. 19a. Current mirror 1950 and resistor 1960 generate output voltage Vouta which indicates the threshold voltage of selected memory cell 1910. Current mirror 2450 and resistor 2460 generate output voltage Voutb which indicates the threshold voltage of selected reference cell 2410. Two sample-and-hold circuits 2170A and 2170B sample output voltages Vouta from selected memory cell 1910 and Voutb from reference memory cell 2410 at a predetermined time during a read. The two voltages Vouta and Voutb feed difference amplifier 2350 which generates a difference signal Vout.

Figure 25:
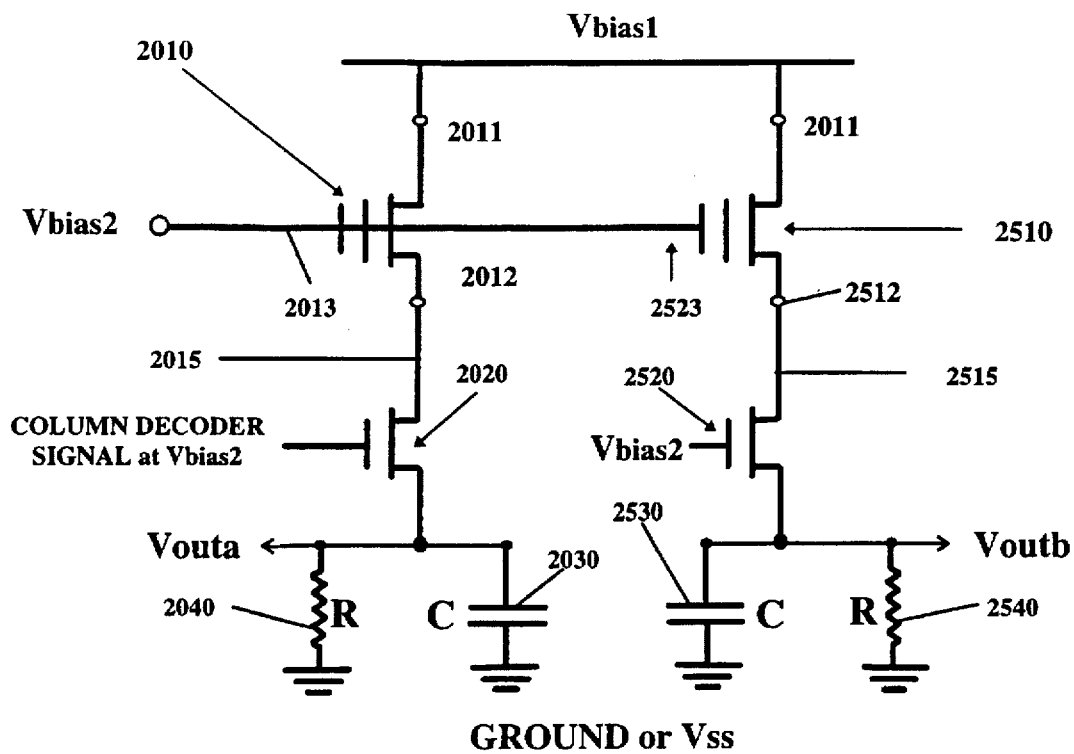
FIG. 25 is a schematic of an embodiment including reference cells for yet another read process in accordance with this invention.
Figure 25:
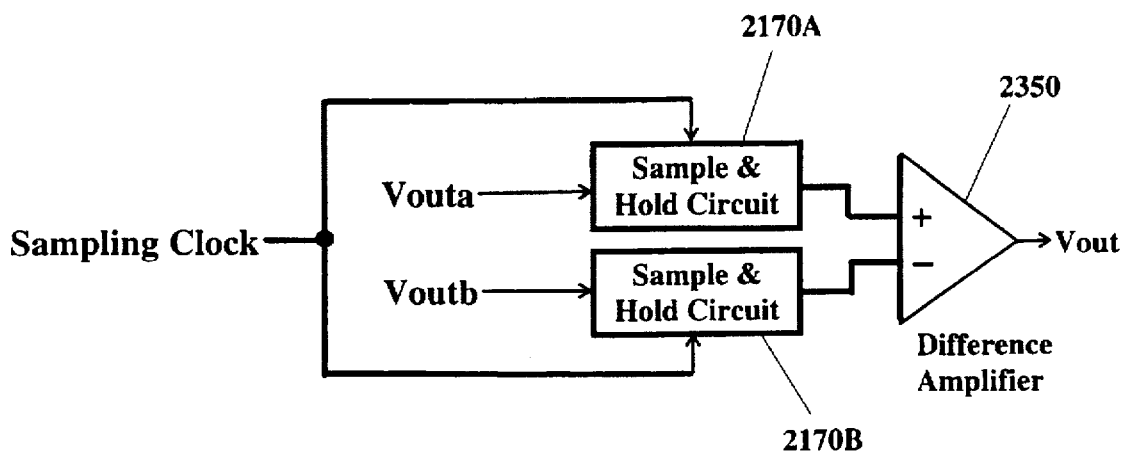

FIG. 25 shows an embodiment which uses reference cells 2510 in combination with the source follower read process as disclosed in regard to FIGS. 20a and 20b. During a read, after a predetermined bias voltage Vbias2 (about 6 volts) is applied to control gates of both a selected memory cell 2010 in the array and a selected reference cell 2510, common source line 2011 of cells 2510 and 2010 is ramped up to voltage Vbias1 to avoid read disturb as discussed above. Voltages Vouta on column line 2015 and Voutb on a reference column line 2515 have one-to-one relationships with the threshold voltages of respective cells 2010 and 2510. Sample-and-hold circuits 2170A and 2170B simultaneously sample voltages Vouta and Voutb at a predetermined time. The difference between the sampled voltages Vouta and Voutb indicates the threshold voltage of selected memory cell 2010 relative to the threshold voltage of reference cell 2510 and indicates the input analog signal stored in selected memory cell 2010.

As described earlier, physical dimension variations, process variations and other factors, as well as supply voltage and temperature variations, can cause the cell current to vary during a read operation and from one read operation to the next. Current variation is particularly a concern for the control gate slow ramp process described in regard to FIGS. 21a, 21b, 21c, 22, and 23 because the trip points of the one-shot circuits 2160 depend on pull-up device currents versus the memory cell currents.

FIG. 23 illustrates using a "cell-tracking" current source to compensate for these variations. A current mirror circuit 2380 mirrors to the current-source pull-up devices 2328 and 2318, the current through a reference cell 2340 having a threshold voltage at the virgin level. Current mirror circuit 2380 contains P-channel device 2348 which differs in size from devices 2328 and 2318 such that the current-mirror current through cells 2320 and 2310 is a predetermined fraction of the current through reference cell 2340. Accordingly, currents through column lines 2325 and reference column lines 2315 track the intrinsic cell current through reference cell 2340, and the trip points of one-shot circuits 2160A and 2160B are less sensitive to the variations discussed earlier.

Figure 26:
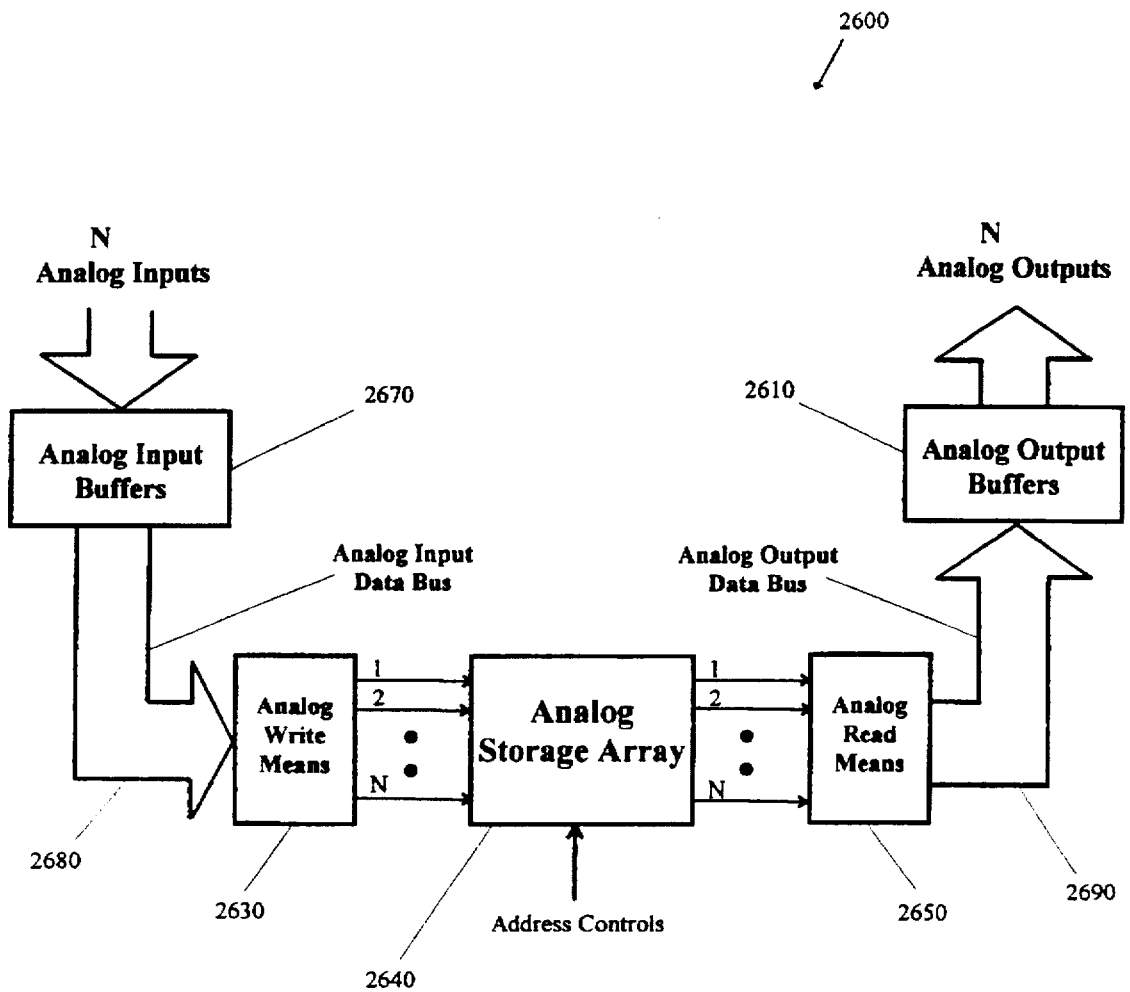
FIG. 26 shows a block diagram of a system for parallel reading and writing multiple analog signals in accordance with this invention.

The above-disclosed embodiments which write or read an analog signal to a single memory cells can also be applied to systems which simultaneously read or write multiple analog signals in memory cells of an analog storage array. FIG. 26 shows a system which reads and writes multiple analog signals in an analog storage array 2640. An analog write means 2630 writes N parallel analog signals from conventional analog input buffers 2670 into analog storage array 2640. Analog write means 2630 can be any combination of one or more of the write circuits and processes (which may include verify cycles) disclosed above. Analog read means 2650, which may be any combination of the read circuits and processes disclosed above, reads N analog signals from analog storage array 2640 into conventional analog output buffers 2610. Parallel writing and reading of multiple analog signals extends the application of the analog memory to applications that require higher rates of input and output than are required in voice and audio record and playback.

Figure 27:
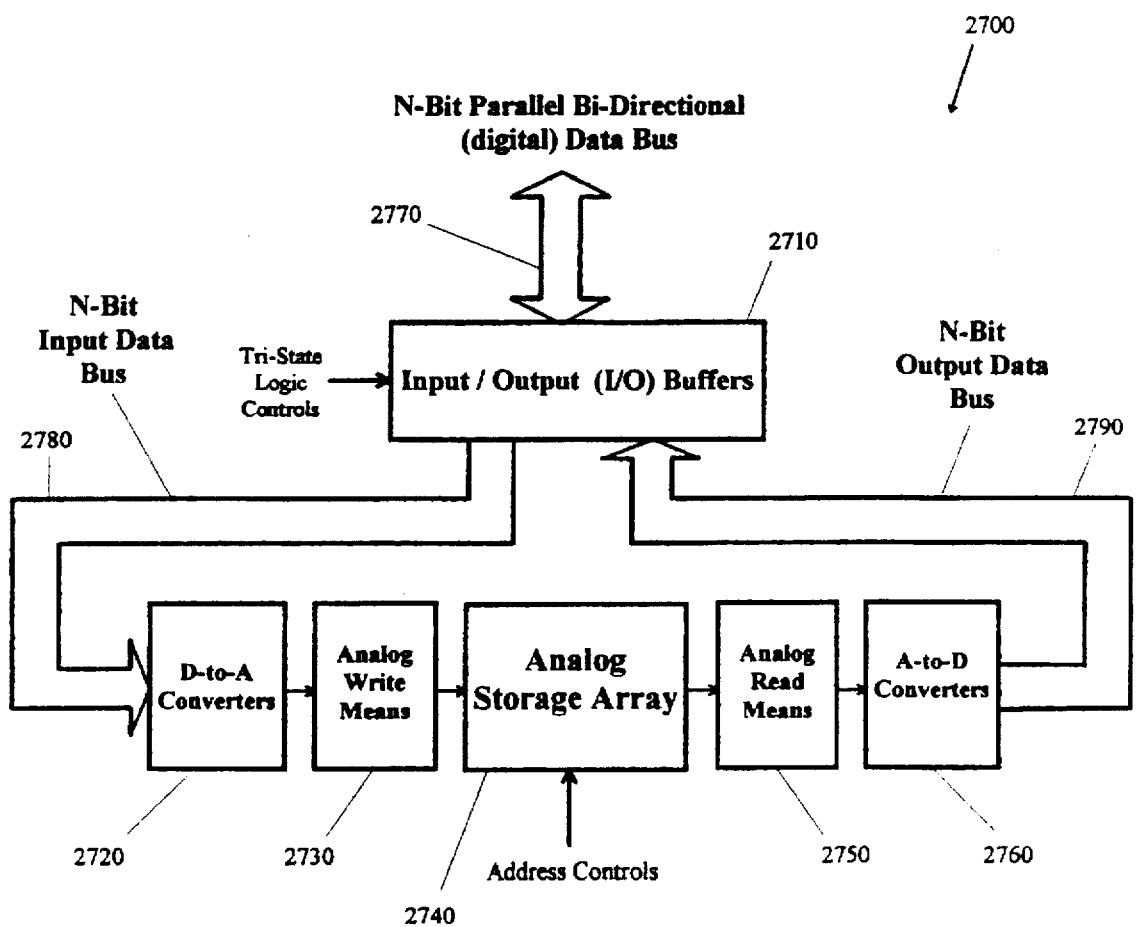
FIG. 27 shows a block diagram of a system for reading and writing multi-level digital values to a memory cell in accordance with this invention.

Writing and reading processes in accordance with this invention are also applicable to storing conventional digital data and information. A memory 2700 shown in FIG. 27 handles multiple bits of conventional digital data. An input/output buffer 2710 provides a conventional interface between a data bus 2770 and a conventional digital-to-analog converter (DAC) 2720 and between data bus 2770 and a conventional ADC 2760. DAC 2720 converts input digital data into an analog signal which has discrete possible values. An analog write means 2730 writes the analog signal into a memory array 2740 in the form of varying threshold voltages. Analog writing means 2730 can use any combination of one or more of the write circuits and processes (which may also include verify cycles) described above. An analog read means 2750 reads the stored information and may use any combination of the read circuits and processes described earlier. ADC 2760 converts the output voltage read from the memory cells in the storage array 2740 into multiple bits of conventional digital data.

As discussed earlier, an advantage of storing conventional digital information in the analog form is the reduction in the size of memory array 2740. Data which requires one memory cell per bit to store in a conventional binary memory cell, can be stored several bits per memory cell. The resolution, or the number of bits per cell depends on several factors such as the resolution or accuracy of DAC 2720, analog write means 2730, analog storage array 2740, analog read means 2750, and ADC 2760. According to this invention, a threshold voltage resolution of better than 1 mV can be achieved and therefore, each 5-volt range of threshold voltages has more than 4,096 distinguishable analog levels and can store the equivalent of more than 12 bits of digital information. The digital information themselves can be compressed digital data which are compressed by any conventional data compression means (performed outside of the memory system 2700).

If the number of bits of data on bus 2770 is greater than what the resolution of system 2700 can store in a single memory cell, the data can be split and stored in two or more memory cells. For example, a 16-bit data signal on input data bus 2780 can be split into two 8-bit signals. DAC 2720 converts the two 8-bit signals into two analog signals each having 256 possible levels, and analog write means 2730 writes the two analog signals into two memory cells in analog storage array 2740. During a read, analog read means 2750 reads two analog signals, and ADC 2760 converts the two analog signals into two 8-bit digital signals. The two 8-bit digital signals are then combined into a 16-bit output signal on data bus 2790.

Although the present invention has been described with reference to particular embodiments, the description is only an example of the invention's application and should not be taken as a limitation. Various adaptations and combinations of features of the embodiments disclosed will be apparent to those skilled in the art and are within the scope of the present invention as defined by the following claims.

We claim:

1. A circuit for writing an analog signal to a memory cell, comprising:
    a voltage shifter that generates a first voltage that depends on the analog signal, wherein the voltage shifter comprises:
        a first amplifier having an output terminal, a negative input terminal, and a positive input terminal, the positive input terminal receiving a signal which depends on the analog signal;
        a first resistor having a first terminal coupled to a terminal at a second voltage and a second terminal coupled to an output node of the voltage shifter;
        a second resistor having a first terminal coupled to ground and a second terminal coupled to the negative input terminal of the first amplifier; and
        a transistor having a drain coupled to the output node, a source coupled to the second terminal of the second resistor, and a gate coupled to the output terminal of the first amplifier;
    means for connecting the voltage shifter to a control gate of the memory cell; and
    a pull-up device coupled to a drain of the memory cell.

2. The circuit of claim 1, wherein the first resistor has a resistance equal to that of the second resistor.

3. The circuit of claim 1, further comprising:
    a second amplifier having a positive input terminal, a negative input terminal held at a reference voltage, and an output terminal connected to the positive input terminal of the first amplifier;
    a third resistor having a first terminal coupled to the positive input terminal of the second amplifier and a second terminal which receives the analog signal; and
    a fourth resistor coupled between the positive input terminal of the first amplifier and the positive input terminal of the second amplifier.

4. The circuit of claim 3, wherein the first and second resistors have the same resistance, and the third and fourth resistors have the same resistance.

5. A circuit for writing an analog signal to a memory cell, comprising:
    a reference cell that is structurally identical to the memory cell;
    a voltage source that is coupled to the reference cell and generates a first voltage that depends on a threshold voltage of the reference cell;
    a write driver coupled to the charge pump, wherein the write driver generates a second voltage at a level that depends on the analog signal and the first voltage; and
    means for applying the second voltage to the memory cell during a write operation.

6. A circuit for writing an analog signal to a memory cell, comprising:
    means for applying a first voltage to a control gate of the memory cell when writing the analog signal to the cell, wherein the first voltage has a level that depends on the analog signal; and
    a pull-up device coupled to a drain of the memory cell, wherein the pull-up device has a variable impedance that depends on the analog signal.

7. The circuit of claim 6, wherein the pull-up device comprises:
    a voltage source;
    a plurality of transistors coupled in parallel between the voltage source and the drain of the memory cell; and
    an analog-to-digital converter coupled to gates of the plurality of transistors to turn on a combination of the plurality of transistors which depends on an input signal to the analog-to-digital converter.

8. The circuit of claim 6, wherein the pull-up device comprises: a voltage source and a first transistor coupled in series with the memory cell between the voltage source and ground, and the circuit further comprises:
    a second transistor and a third transistor coupled in series between the voltage source and ground, the second transistor having a gate coupled to its drain and to a gate of the first transistor; and
    means for applying a voltage that depends on the analog signal to a gate of the third transistor.

9. A circuit for writing an analog signal to a memory cell, comprising:
    a pull-up device coupled to a drain of the memory cell;
    a voltage shifter which generates a first voltage that depends on the analog signal; and
    means for connecting the voltage shifter to a control gate of the memory cell, wherein the means for connecting the voltage shifter to a control gate of the memory cell comprises:
        a row decoder; and
        a multiplexer with a first input terminal coupled to the voltage shifter and a second input terminal coupled to receive the analog signal and an output terminal coupled to the row decoder.

10. The circuit of claim 9, further comprising:
    a write control circuit which generates select signals which cause the multiplexer to alternately apply the voltage to the voltage shifter and the analog signal to the control gate of the memory cell;
    a sense amplifier coupled to the memory cell, the sense amplifier generating a signal indicating whether the memory cell conducts while the analog signal is applied to the control gate of the memory cell; and
    a one-shot circuit which in response to the signal from the sense amplifier, generates a signal to terminate writing to the memory cell.

11. A circuit for writing an analog signal to a memory cell, comprising:
- a source of a first voltage that depends on the analog signal;
- means for applying the first voltage to a control gate of the memory cell; and
- a pull-up device coupled to a drain of the memory cell, wherein the pull-up device comprises:
  - a voltage source;
  - a transistor coupled between the voltage source and the drain of the memory cell;
  - a capacitor coupled between the drain of the memory cell and ground; and
  - a timing generator coupled to the gate of the transistor, wherein the timing generator turns on the transistor to charge the capacitor before the means for applying applies the first voltage to the control gate of the memory cell, and turns off the transistor while the first voltage is applied to the control gate of the memory cell.

12. The circuit of claim 11, wherein the source of the first voltage comprises a voltage shifter, and the means for applying the first voltage alternately connects and then disconnects the voltage shifter to the control gate of the memory cell to generate write pulses on the control gate of the memory cell.

13. The circuit of claim 12, wherein the pull-up device comprises:
- a plurality of transistors coupled in parallel between the voltage source and the drain of the memory cell; and
- a binary counter having a clock input terminal coupled to the means for applying the first voltage and an output bus coupled to gates of the plurality of transistors, wherein the binary counter turns on a combination of the plurality of transistors that depends on a count of write pulse to the control gate of the memory cell.

14. A circuit for writing an analog value to a memory cell, comprising:
- a write driver that applies voltages to the memory cell to change the threshold voltage of the memory cell;
- a write control circuit that is coupled to the write driver and alternately connects the write driver to the memory cell and then applies to the memory cell a verify voltage that depends on the analog signal; and
- a sense circuit coupled to determine whether or not the memory cell conducts while the write control circuit applies the verify voltage to the memory cell, wherein in response to a first determination, the sense circuit asserts a signal that prevents the write driver from further changing the threshold voltage of the memory cell.

15. The circuit of claim 14, wherein the verify voltage is equal to the analog signal.

16. The circuit of claim 14, wherein the write driver applies voltages to increase the threshold voltage of the memory cell and the sense circuit asserts the signal only in response to determining that the memory cell does not conduct while the verify voltage is applied.

17. The circuit of claim 5, wherein the voltage source comprises a high voltage charge pump that maintains the first voltage at a level that tracks a current through the reference cell.

18. The circuit of claim 5, wherein the means for applying the second voltage comprises a decoder that applies the second voltage to a control gate of the memory cell to change the threshold voltage of the memory cell.

19. The circuit of claim 18, further comprising a pull-up device coupled to a drain of the memory cell.

* * * * *